(12) United States Patent
Toda et al.

(10) Patent No.: US 8,258,496 B2
(45) Date of Patent: Sep. 4, 2012

(54) SEMICONDUCTOR INTEGRATED CIRCUIT DEVICE HAVING MEMORY CELLS DISPOSED AT CROSS POINT OF METAL LINES AND METHOD FOR FABRICATING THE SAME

(75) Inventors: Haruki Toda, Yokohama (JP); Akiko Nara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 630 days.

(21) Appl. No.: 12/404,894

(22) Filed: Mar. 16, 2009

(65) Prior Publication Data

US 2009/0261315 A1 Oct. 22, 2009

(30) Foreign Application Priority Data

Apr. 17, 2008 (JP) .................................. 2008-107773

(51) Int. Cl.
*H01L 29/06* (2006.01)
*H01L 47/00* (2006.01)

(52) U.S. Cl. ............ 257/5; 257/390; 257/296; 257/758; 438/622; 438/669

(58) Field of Classification Search .............. 257/5, 288, 257/296, 758, E21.678, E21.66, E27.084, 257/E21.613, E21.614, E27.077, E27.076, 257/777, 700, 386, 397, 305, 283, 244, 210, 257/513, 520, 508, 575, 774, 750, 197, 213, 257/350, 401, 298, 300, 301, 303, 304, 306, 257/314, 319, 307, 324, 330, 390, 331, 332, 257/903; 438/622, 587, 588, 593, 589, 637, 438/639, 618, 623, 629, 579, 669
See application file for complete search history.

(56) References Cited

U.S. PATENT DOCUMENTS

| 5,986,299 A | 11/1999 | Nakamura et al. |
| 6,774,458 B2 | 8/2004 | Fricke et al. |
| 2005/0121791 A1 | 6/2005 | Yamada et al. |
| 2006/0268594 A1* | 11/2006 | Toda .............................. 365/100 |
| 2007/0267750 A1* | 11/2007 | Sawamura ..................... 257/751 |
| 2008/0002456 A1 | 1/2008 | Toda et al. |

* cited by examiner

*Primary Examiner* — Ha Tran T Nguyen
*Assistant Examiner* — Thanh Y Tran
(74) *Attorney, Agent, or Firm* — Oblon, Spivak, McClelland, Maier & Neustadt, L.L.P.

(57) ABSTRACT

A semiconductor integrated circuit device including: a semiconductor substrate on which a circuit is formed; a plurality of functional device arrays stacked on the semiconductor substrate; and vertical wirings so disposed outside of the functional device arrays as to couple the signal lines of the functional device arrays to the circuit, wherein the vertical wirings include multi-layered metal pieces, each layer of which has a plurality of the metal pieces dispersedly arranged in a stripe-shaped contact trench formed on an interlayer insulating film in the elongated direction.

8 Claims, 94 Drawing Sheets

Step 2

FIG. 13 Step 6

FIG. 14 Step 7

FIG. 15  Step 8

FIG. 17 Step 10

FIG. 19  Step 12

FIG. 21 Step 14

FIG. 22 Step 15

Step 16

FIG. 24  Step 17

FIG. 25
BL Drawing Portion – Part 1
(x-direction)
Without Hollowing    With Hollowing
(1) 1st Contact Trench Pattern for Metal Line on Si-Substrate
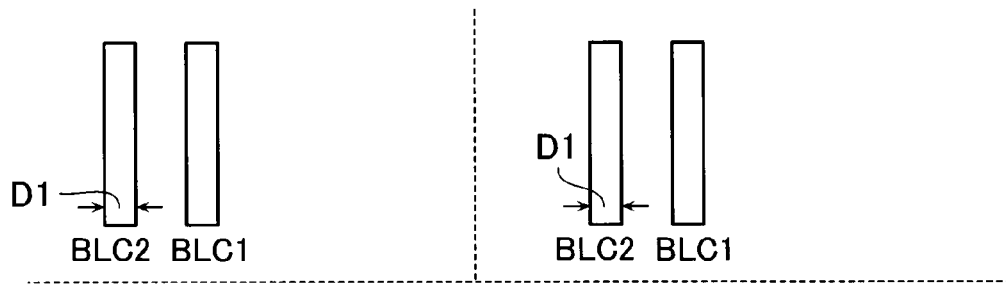
(2) 1st Metal Line Pattern
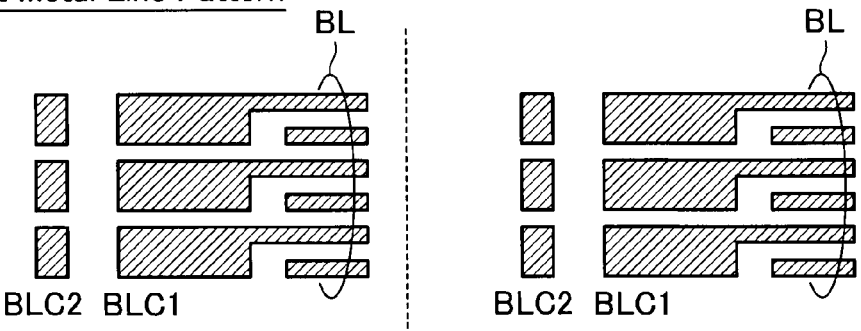
(3) 2nd Contact Trench Pattern
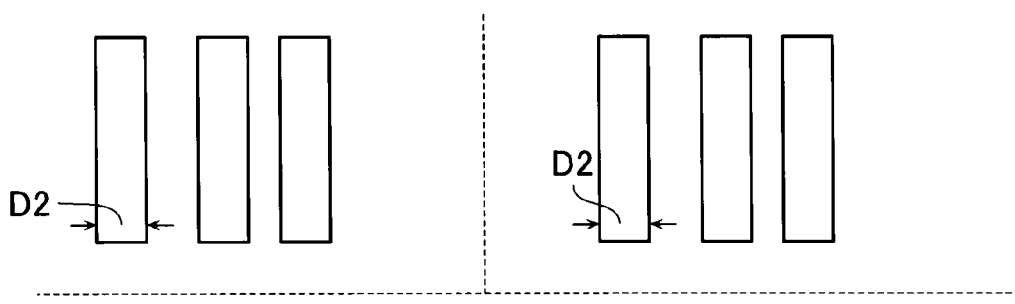
(4) 2nd Metal Line Pattern
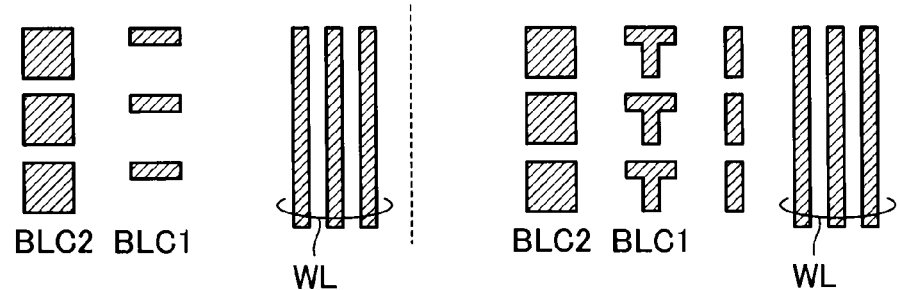

FIG. 27
BL Drawing Portion – Part 3
(x-direction)
Without Hollowing        With Hollowing
(9) 7th Metal Line Pattern
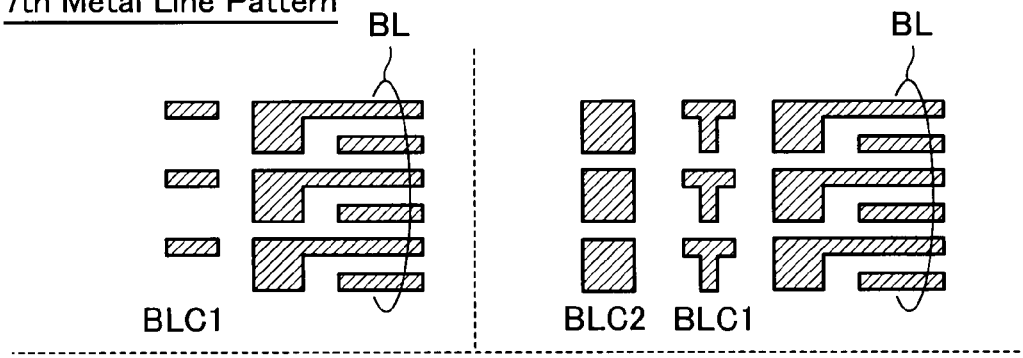
(10) 8th Metal Line Pattern
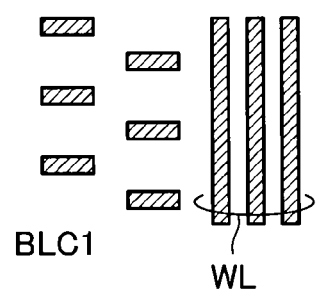 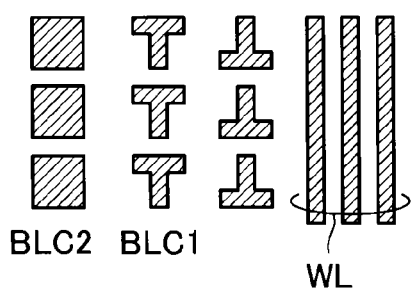

FIG. 28
WL Drawing Portion – Part 1
(y-direction)
| Without Hollowing | With Hollowing |
(1) 1st Contact Trench Pattern for Metal Line on Si-Substrate
(2) 1st Metal Line Pattern
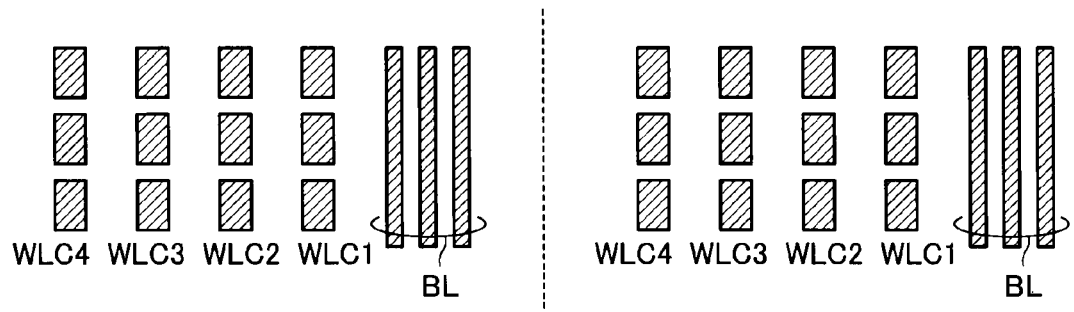
(3) 2nd Contact Trench Pattern
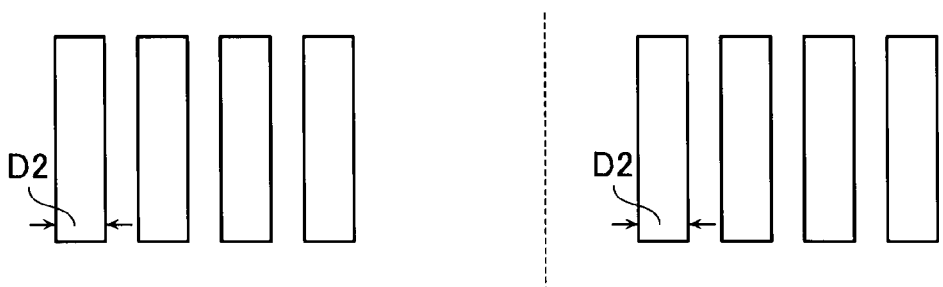
(4) 2nd Metal Line Pattern
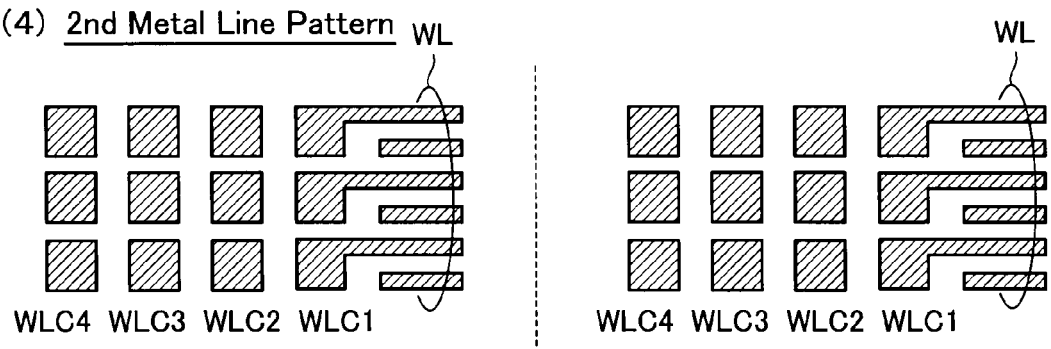

FIG. 30
WL Drawing Portion - Part 3
(y-direction)
Without Hollowing                With Hollowing
(9) 7th Metal Line Pattern
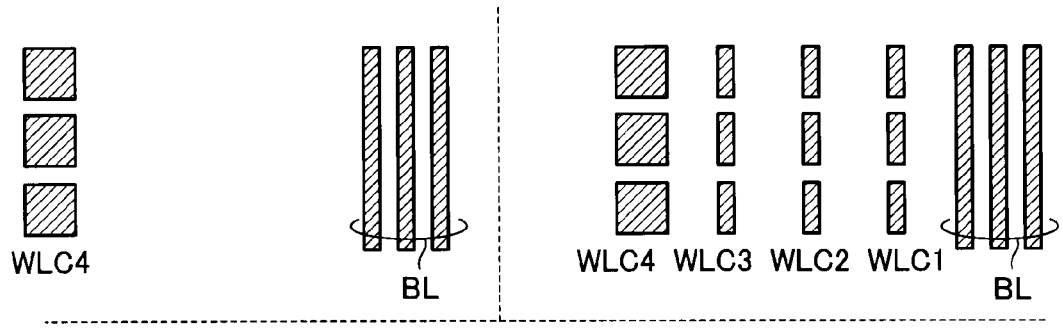
(10) 8th Metal Line Pattern
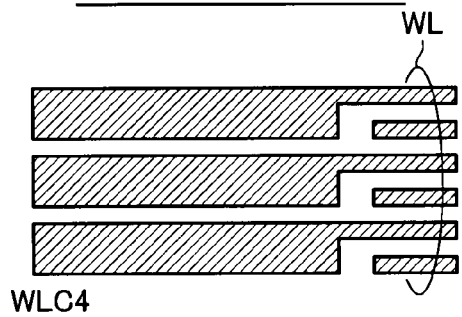  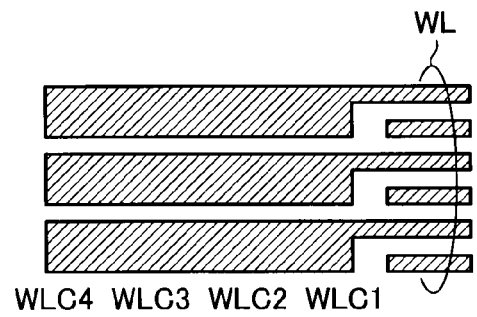

FIG. 54A  Step 21
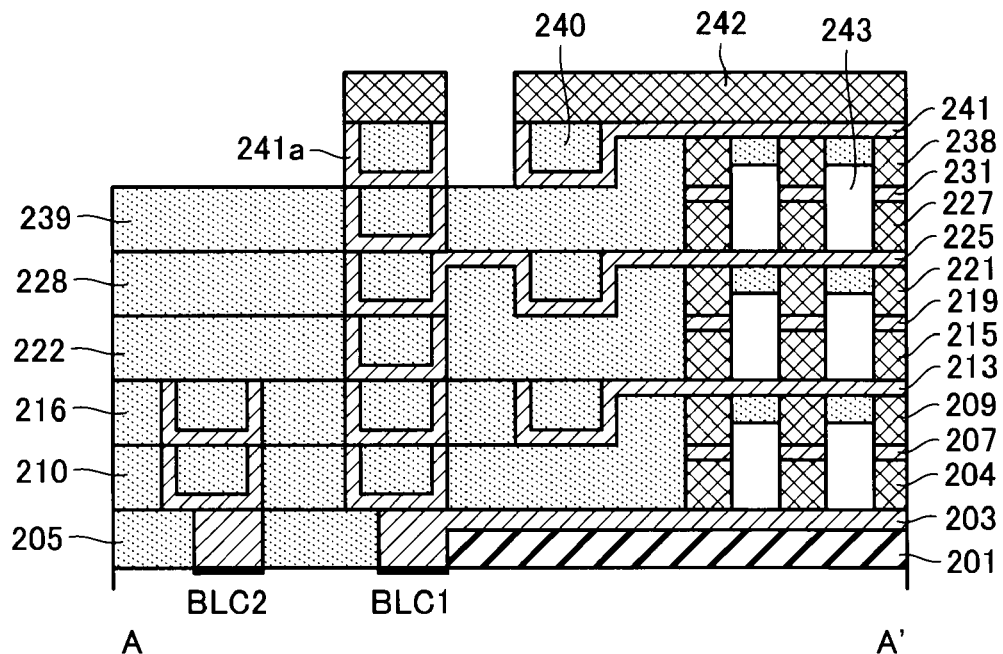
FIG. 54B  Step 21
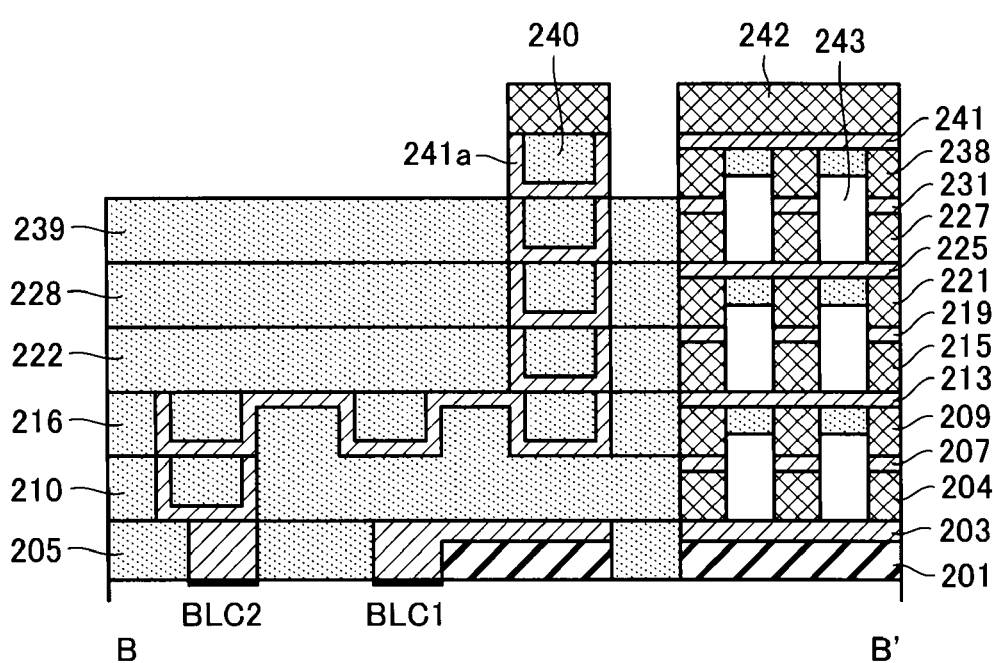

2nd Metal Line Pattern

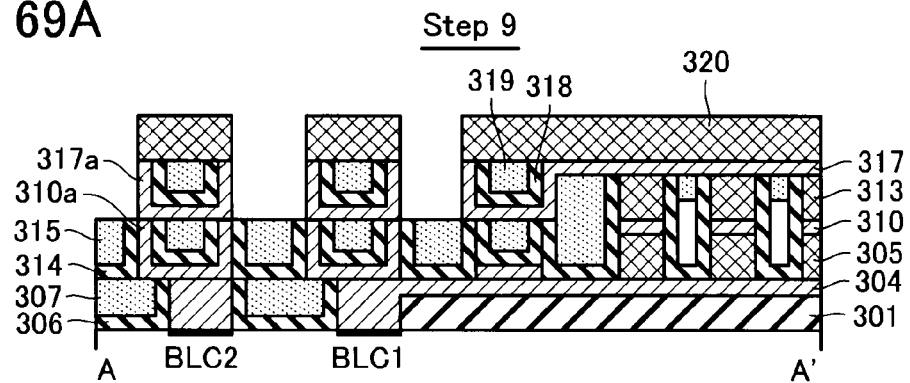
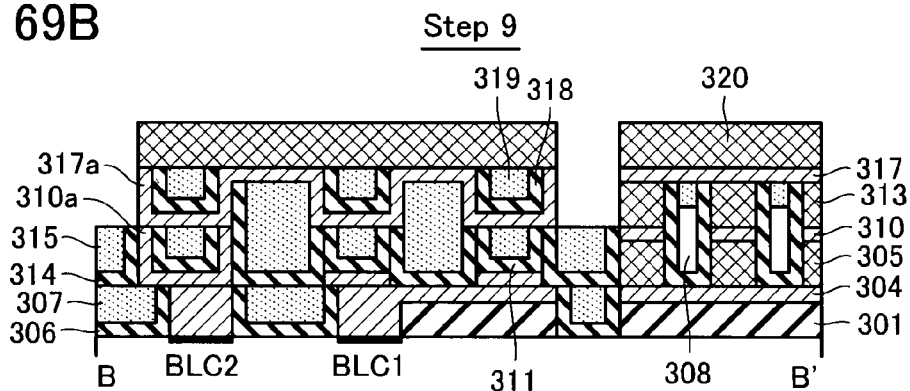
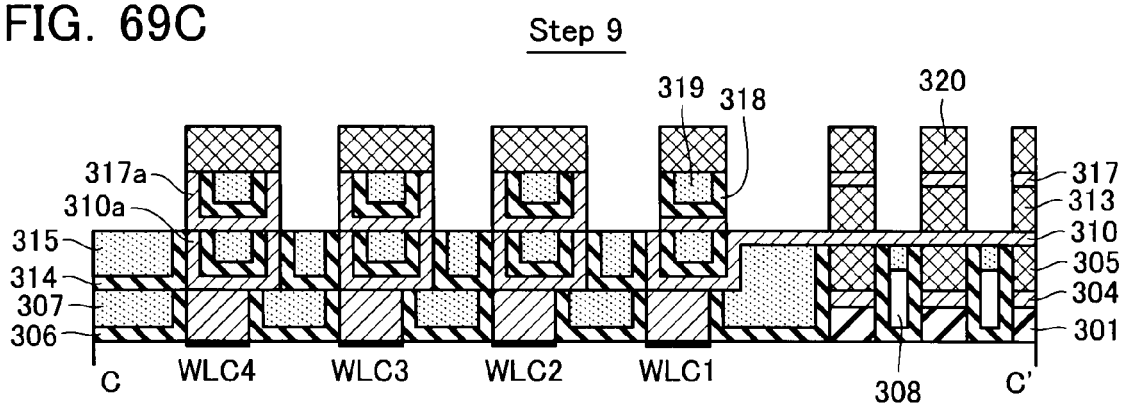
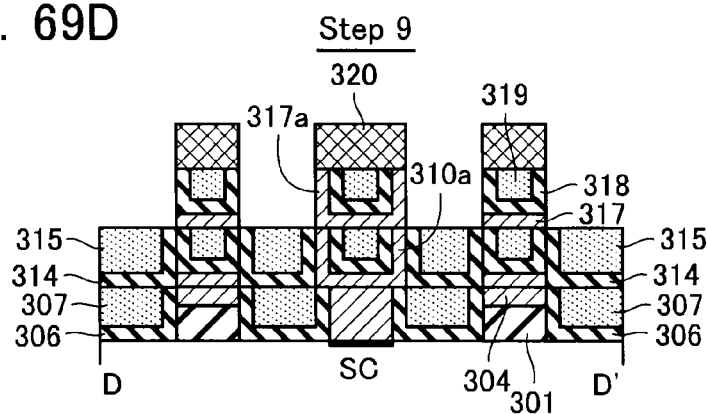

FIG. 76A          Step 16
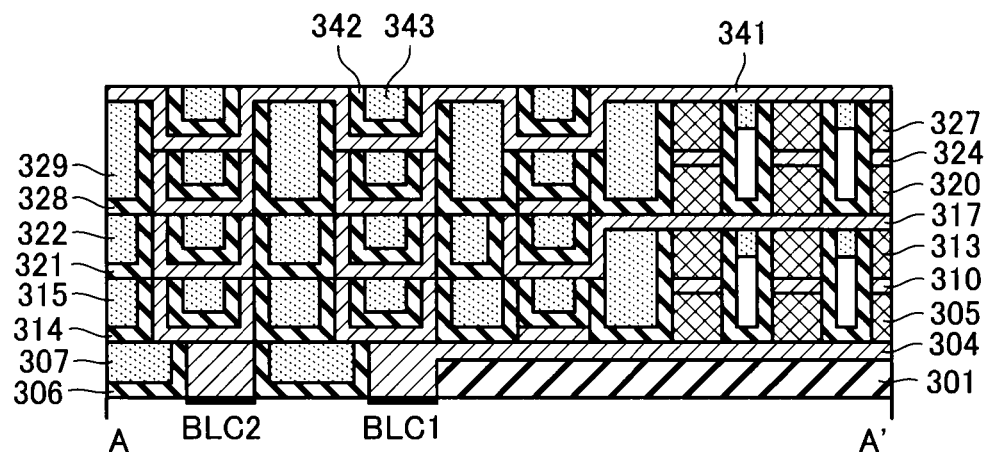
FIG. 76B          Step 16
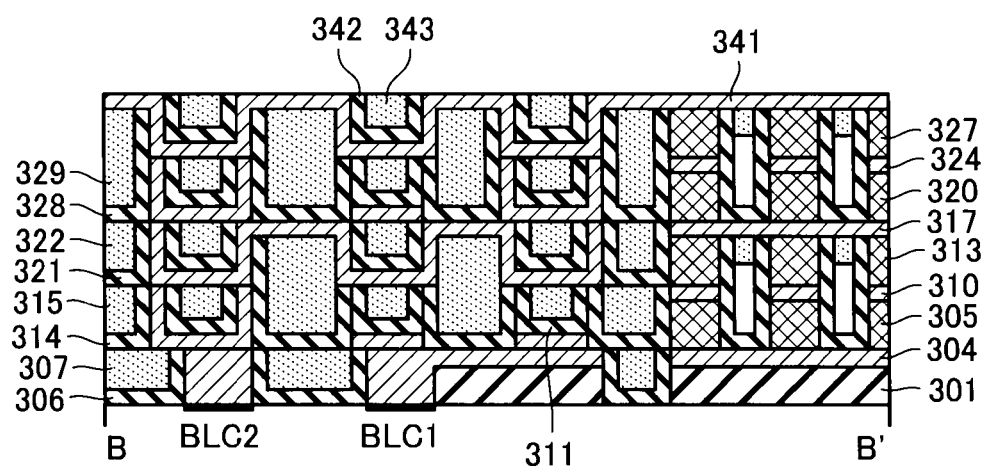

SEMICONDUCTOR INTEGRATED CIRCUIT DEVICE HAVING MEMORY CELLS DISPOSED AT CROSS POINT OF METAL LINES AND METHOD FOR FABRICATING THE SAME

CROSS-REFERENCE TO RELATED APPLICATION

This application is based on and claims the benefit of priority from the prior Japanese Patent Application No. 2008-107773, filed on Apr. 17, 2008, the entire contents of which are incorporated herein by reference.

BACKGROUND OF THE INVENTION

1. Field of the Invention

This invention relates to a three-dimensional semiconductor integrated circuit device, in which multi-layered functional device arrays are formed on a semiconductor substrate with an electronic circuit formed, especially to a vertical wiring structure for drawing the signal lines in the functional device arrays to the substrate.

2. Description of the Related Art

It has been proposed such a resistance change memory (ReRAM) that stores a resistance value as data, which is reversibly exchanged by applying voltage, current or heat, and it is noticed for succeeding to the conventional NAND-type flash memory. This resistance change memory is suitable for shrinking the cell size, and for constituting a cross-point cell array. In addition, it is easy to stack cell arrays. Therefore, ReRAM is expected to be constituted as a large capacitive file memory with a three dimensional (3D-) cell array structure.

Especially, a unipolar type of ReRAM cell has such a feature that the high resistance state and low resistance state are reversibly settable by controlling the applied voltage and applying time thereof. For example, refer to Y. Hosoi et al, "High Speed Unipolar Switching Resistance RAM(RRAM) Technology" IEEE International Electron Devices Meeting 2006, Technical Digest, P. 793-796.

What is problematic in case of achieving a 3D-cell array structure is in the vertical wiring (i.e., via-wiring) structure, which serves for receiving/transmitting signals between the control circuit formed on the semiconductor substrate and the cell arrays stacked thereon. Each memory cell array is formed of word lines, bit lines formed with the minimum pitch, and a set of memory cells disposed at the respective cross-points. It is required of the word lines and bit lines to be coupled to the substrate via the vertical wirings disposed at the end portions of the word lines and bit lines.

The vertical wirings may be formed simply in such a way as to bury metal layers in contact holes formed in an insulating layer. However, as the number of stacked layers of the 3D-cell array increases, and as the integration progresses, not only the word line pitch and bit line pitch are made to be smaller, but also the contact hole becomes smaller in size and deeper. Therefore, lithography step and etching step for forming the contact holes, and deposition step for burying a metal layer in the contact holes become difficult. Specifically, the vertical wiring portion is difficult to shrink in comparison with the cell array portion, and there is a probability that this becomes a bottle neck for constituting the whole memory device.

SUMMARY OF THE INVENTION

According to an aspect of the present invention, there is provided a semiconductor integrated circuit device including:
a semiconductor substrate on which a circuit is formed;
a plurality of functional device arrays stacked on the semiconductor substrate; and
vertical wirings so disposed outside of the functional device arrays as to couple the signal lines of the functional device arrays to the circuit, wherein
the vertical wirings include multi-layered metal pieces, each layer of which has a plurality of the metal pieces dispersedly arranged in a stripe-shaped contact trench formed on an interlayer insulating film in the elongated direction.

According to another aspect of the present invention, there is provided a semiconductor integrated circuit device including:
a semiconductor substrate on which a circuit is formed;
a plurality of cell arrays stacked on the semiconductor substrate in such a manner that first metal lines and second metal lines crossing each other are repeatedly stacked with memory cells disposed at the respective cross-points of the first and second metal lines;
interlayer insulating films buried between the first and second metal lines and between memory cells arranged laterally; and
vertical wirings so disposed outside of the cell arrays as to couple the first and second metal lines of the cell arrays to the circuit, the vertical wirings being formed of multi-layered metal pieces buried in the interlayer insulating films, wherein
the multi-layered metal pieces are patterned from the same metal layers as the first and second metal lines, each layer of the multi-layered metal pieces having multiple metal pieces disposed at multiple contact portions in a stripe-shaped contact trench formed to be extended over the multiple contact portions on the interlayer insulating film.

According to still another aspect of the present invention, there is provided a method for fabricating a semiconductor integrated circuit device with cell arrays stacked three-dimensionally, including:
forming a first stripe-shaped contact trench in a first interlayer insulating film formed on a semiconductor substrate, the contact-trench being extended over multiple contact portions;
forming first metal lines and first metal pieces with memory cell layers stacked thereon on the first interlayer insulating film, the first metal pieces being disposed at the multiple contact portions;
burying a second interlayer insulating film around the first metal lines and the first metal pieces;
forming a second stripe-shaped contact trench in the second interlayer insulating film above the first stripe-shaped contact trench so as to expose the first metal pieces; and
forming second metal lines and second metal pieces with memory cell layers stacked thereon on the second interlayer insulating film, the second metal lines crossing the first metal lines, the second metal pieces being stacked on the first metal pieces so as to serve as elements of vertical wirings.

BRIEF DESCRIPTION OF THE DRAWINGS

FIG. 25 shows contact trench patterns and metal line patterns at bit line drawing portion (part-1) in accordance with an embodiment.

FIG. 27 shows metal line patterns at bit line drawing portion (part-3) in accordance with the embodiment.

FIG. 28 shows contact trench patterns and metal line patterns at word line drawing portion (part-1) in accordance with the embodiment.

FIG. 30 shows metal line patterns at word line drawing portion (part-3) in accordance with the embodiment.

FIGS. 54A to 54C show A-A', B-B' and C-C' sectional views at step 21 in the embodiment.

FIGS. 69A to 69D show A-A', B-B', C-C' and D-D' sectional views at step 9 in the embodiment.

FIGS. 76A to 76D show A-A', B-B', C-C' and D-D' sectional views at step 16 in the embodiment.

DETAILED DESCRIPTION OF THE EMBODIMENTS

Illustrative embodiments of this invention will be explained with reference to the accompanying drawings below.

[ReRAM With a 3D Cell Array Structure]

Figure 1:
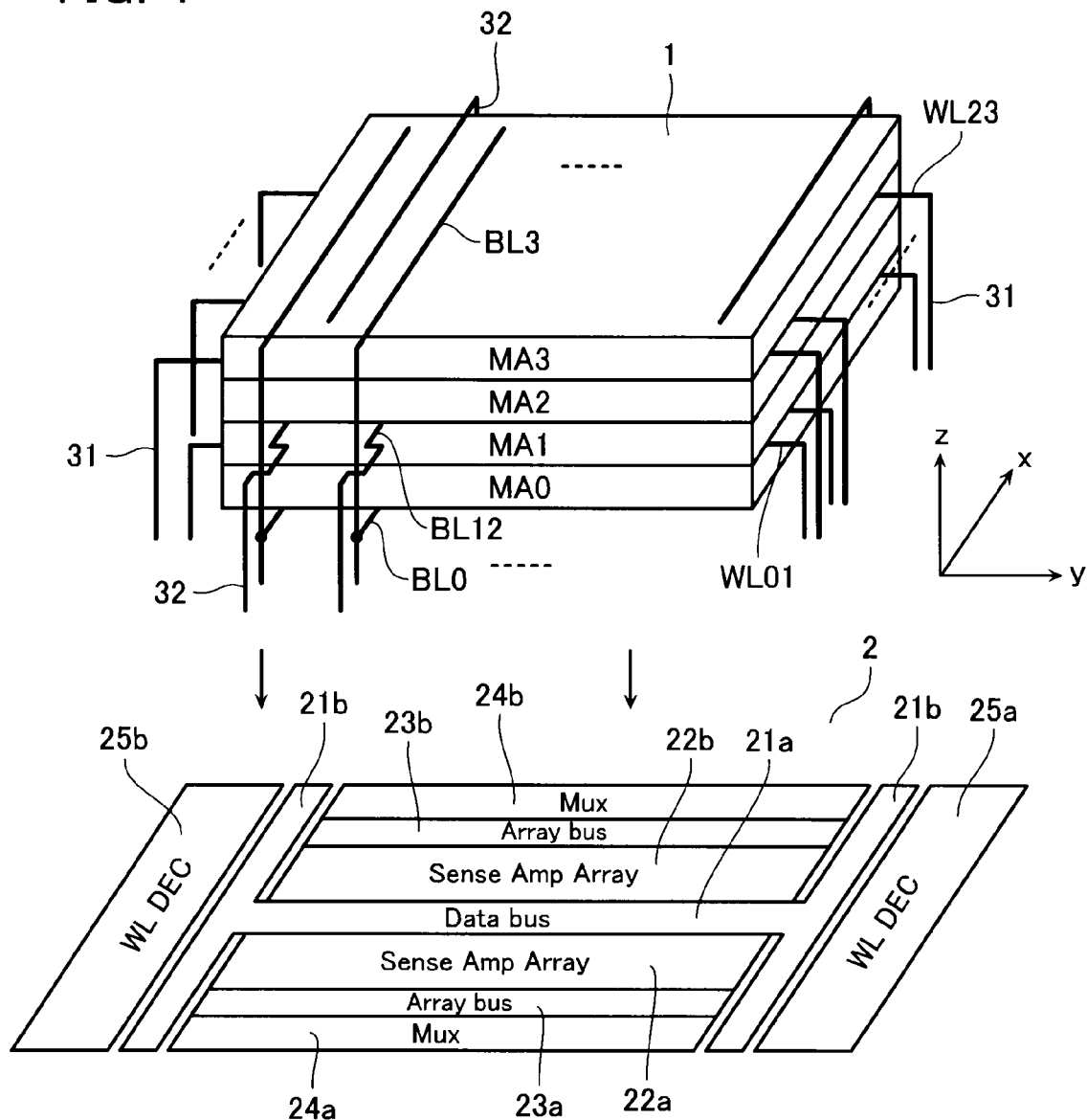
FIG. 1 shows a configuration of a ReRAM in accordance with an embodiment of the present invention.

FIG. 1 shows a 3D-cell array block 1 and a control circuit (electronic circuit) 2 formed on the underlying substrate with respect to a ReRAM in accordance with an embodiment. In this embodiment, cell array block 1 is formed of four cell arrays MA0 to MA3.

In this embodiment, such a common bit line and common word line scheme is used that not only word lines WL but also bit lines BL are shared by adjacent two cell arrays. Word lines WL of the respective cell arrays are coupled to vertical wirings 31 disposed alternately at the both end portions in the word line direction (i.e., y-direction) outside of the cell array block 1, and these vertical wirings 31 couple the word lines to the control circuit 2. While, bit lines BL of the respective cell arrays are coupled to vertical wirings 32 disposed alternately at the both end portions in the bit line direction (i.e., x-direction) outside of the cell array block 1, and these vertical wirings 32 couple the bit lines to the control circuit 2.

That is, vertical wirings 31 and 32 are disposed on four sides of the cell array block 1. In this example, assuming that cell array layers are counted in order from the bottom, even-layered bit lines are coupled to each other and odd-layers bit lines also are coupled to each other. Alternatively, it should be noted that the connection scheme of bit line between layers may be replaced with that of word line between layers, i.e., even-layered word lines and odd-layered word lines may be coupled to each other, respectively.

There are shown the basic circuit layout of the control circuit 2. With respect to the bit line direction, bit lines are drawn to the substrate via the vertical wirings 32 disposed on the both ends of cell array block, and coupled to multiplexers (MUXs) 24a and 24b, so that bit line signals are selected in accordance with command and address to be transferred on array buses 23a and 23b. The bit line signals on the array buses 23a and 23b are input to sense amplifier circuits 22a and 22b.

Sense amplifier circuits 22a and 22b serve for detecting the bit line data in a read mode, and monitoring cell current and judging the program completion of the programmed cell data. Data transferring between the sense amplifier circuits 22a, 22b and the external is performed via data buses 21a and 21b.

With respect to the word line direction, word lines are drawn to the substrate via the vertical wirings 31 disposed on the both ends of cell array block, and coupled to word line decoders/multiplexers 25a and 25b, which serve for selectively setting word line levels in accordance with command and address.

Considering data receiving/transmitting between the sense amplifiers and the external, part of data buses, buses 21b, are disposed at the spaces between cell array block area and word line decoders/multiplexers 25a, 25b. Therefore, word lines WL pass through above the data buses 21b from the cell array block 1 to the word line decoders/multiplexers 25a, 25b.

Although this is a demerit such that it is necessary for additional word line length, there is a merit that the pitch of the vertical wirings 31, 32 may be set twice the minimum pitch because not only bit lines BL but also word lines WL are alternately drawn from both ends thereof. Additionally, there are other merits as follows: the wirings are arranged in a symmetrical state; the circuit property is easily made uniform; the layout becomes compact; and the exposure condition with the minimum feature size in the lithography step may be made effective.

Data bus 21a disposed just under the cell array block 1 is divided into two data buses 21b, which are disposed as crossing the data bus 21a, and bit line signals are output via the data buses 21b to the external.

Figure 2:
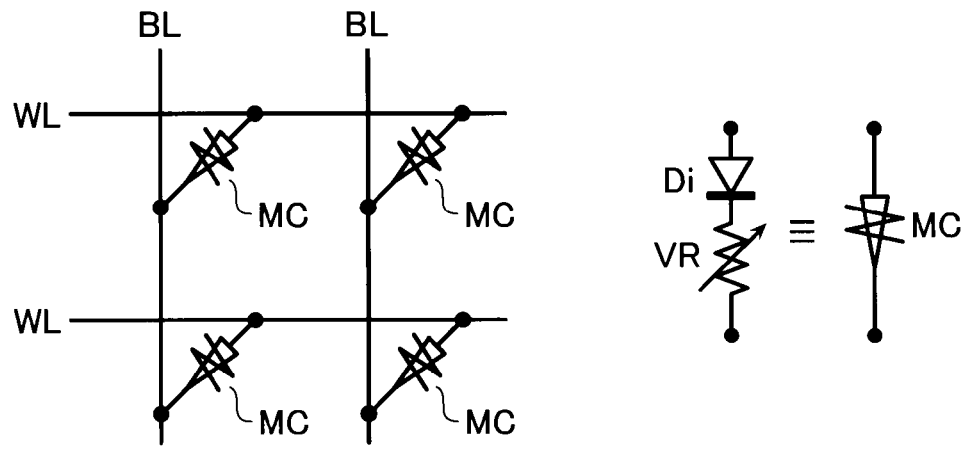
FIG. 2 shows an equivalent circuit of the ReRAM cell array.
Figure 3:
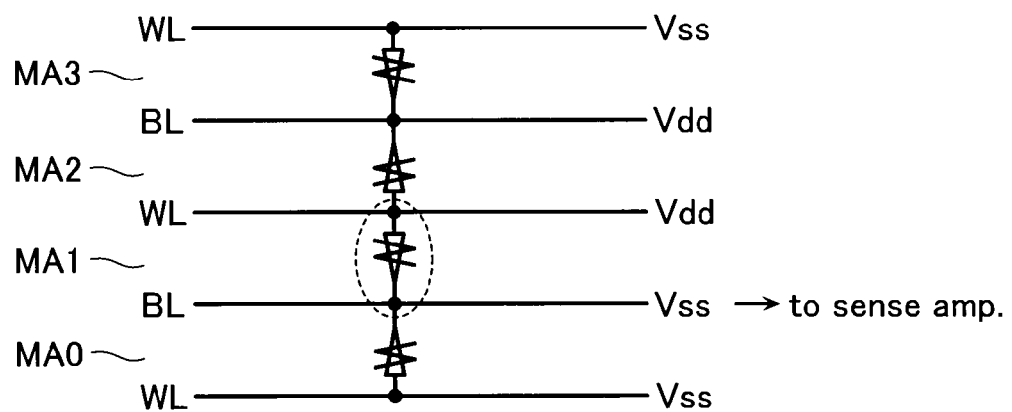
FIG. 3 shows the 3D-cell array of the ReRAM.

FIG. 2 shows an equivalent circuit of a cell array layer. Word lines WL and bit lines BL are disposed to cross to each other, and memory cells MC are disposed at the respective cross-points. Each memory cell MC is formed of variable resistance element VR and diode Di connected in series. FIG. 3 shows that memory cells are disposed in such a polarity that diodes thereof are reversed to each other between adjacent two cell array layers within cell arrays MA0-MA3. As a result, Applying Vdd to a selected word line, applying Vss to a selected bit line, applying Vss to unselected word line, and applying Vdd to unselected bit lines, selected cell's data in a selected cell array may be read with a sense amplifier. It should be noted that WL and BL are conveniently referred to as "word line" and "bit line" here, but other names may be used for these signal lines in accordance with the system situation.

As described above, the vertical wirings disposed between the cell array block and the underlying substrate are arranged about at a minimum line pitch used for word lines WL and bit lines BL. How to constitute the vertical wings becomes a material technique for constituting the 3D-cell array with a process integration.

As the integration progresses, the spaces between word lines and between bit lines are narrowed, and the line width also is narrowed, resulting in that the time constant defined by the line resistance and line capacitance becomes large. As the cell size is shrunk, and as the storage capacity of a memory chip increases, the memory chip performance will be degraded if the data transmission speed is not made to be high.

That is, a large integration of the memory chip and a small time constant of the signal delay do not coexist with each other.

Further, since cell current is often carried in the cross-point cell, it is not negligible that Joule's heat of a cell influences adjacent cells. To suppress as possible the electric and thermal influences between cells and between lines, it is desired to bury an insulating layer with a low dielectric constant between cells and lines. The most desirable method is to fill the space with inactive gas or make the space to be vacuumed.

In the embodiments explained below, it will be provided such a cell array structure and a method of fabricating it that the vertical wirings are formed without the conventional contact forming process, and the interlayer insulating film buried in the stacked 3D-cell array is finally removed, whereby a "hollow" is formed in the cell array structure.

Vertical wirings are formed as follows: engraving a stripe-shaped contact trench in an interlayer insulating film for exposing multiple contact portions therein; depositing a metal layer on the bottom and the side surface of the contact trench; patterning the metal layer to metal pieces dispersedly arranged in the contact trench. Repeatedly performing the above-described processes, there is provided vertical wirings formed of the metal pieces piled up.

The hollowed structure of the 3D-cell array is achieved by removing the interlayer insulating films finally. In a desirable scheme, the insulating film is formed by combination of a vapor deposition method such as CVD (Chemical Vapor Deposition) and a coating method such as SOG (Spin On Glass). Finally removing the spin-coated insulating film, the vertical wirings are supported in the hollowed state with the CVD insulating films.

COMPARISON EXAMPLE

Prior to the explanation of preferred embodiments, it will be explained a comparison example of a method of forming a 3D-cell array with the conventional wiring contact forming processes. The basic process for forming a cross-point cell array with two metal lines formed to cross each other and memory cells disposed at the respective cross-points is in repeated RIE (Reactive Ion Etching) processes for forming x-direction stripe patterns and y-direction stripe patterns, or ion milling processes for forming the respective cells to be independent of each other. These etching methods will be referred to as an "IE (Ion Etching)" process hereinafter.

One cell array layer will be referred to as a "mat" hereinafter. Two mats are united together and subjected to IE processes. That is, with respect to multi-layered structure, etching processes for two mats are repeatedly performed for alternately forming x-direction stripe-shaped patterns and y-direction stripe-shaped patterns, whereby cross-point cells are formed to be separated from each other in the bottom mat.

Figure 4:
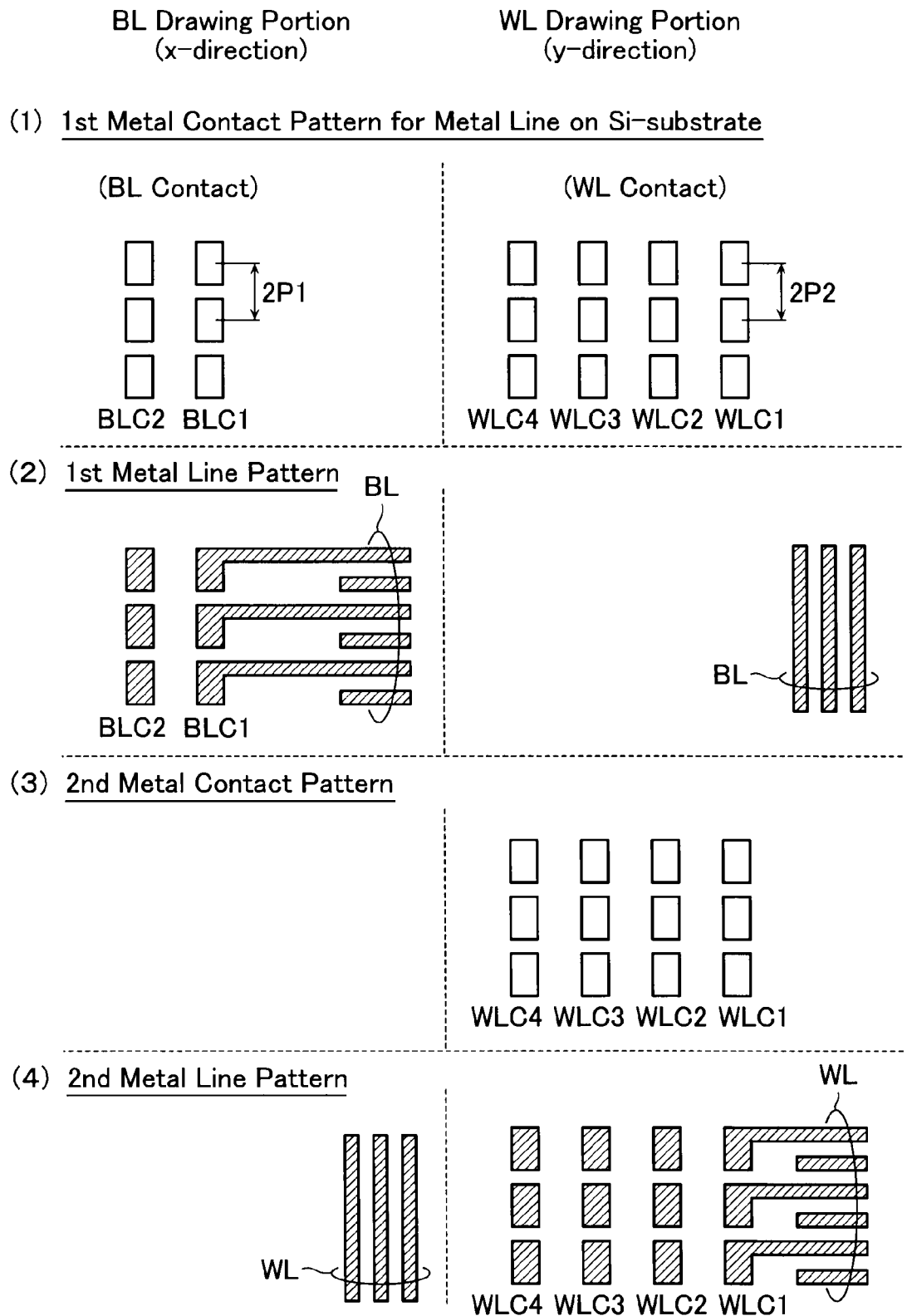
FIG. 4 shows contact patterns and metal line patterns used in a comparison example.
Figure 5:
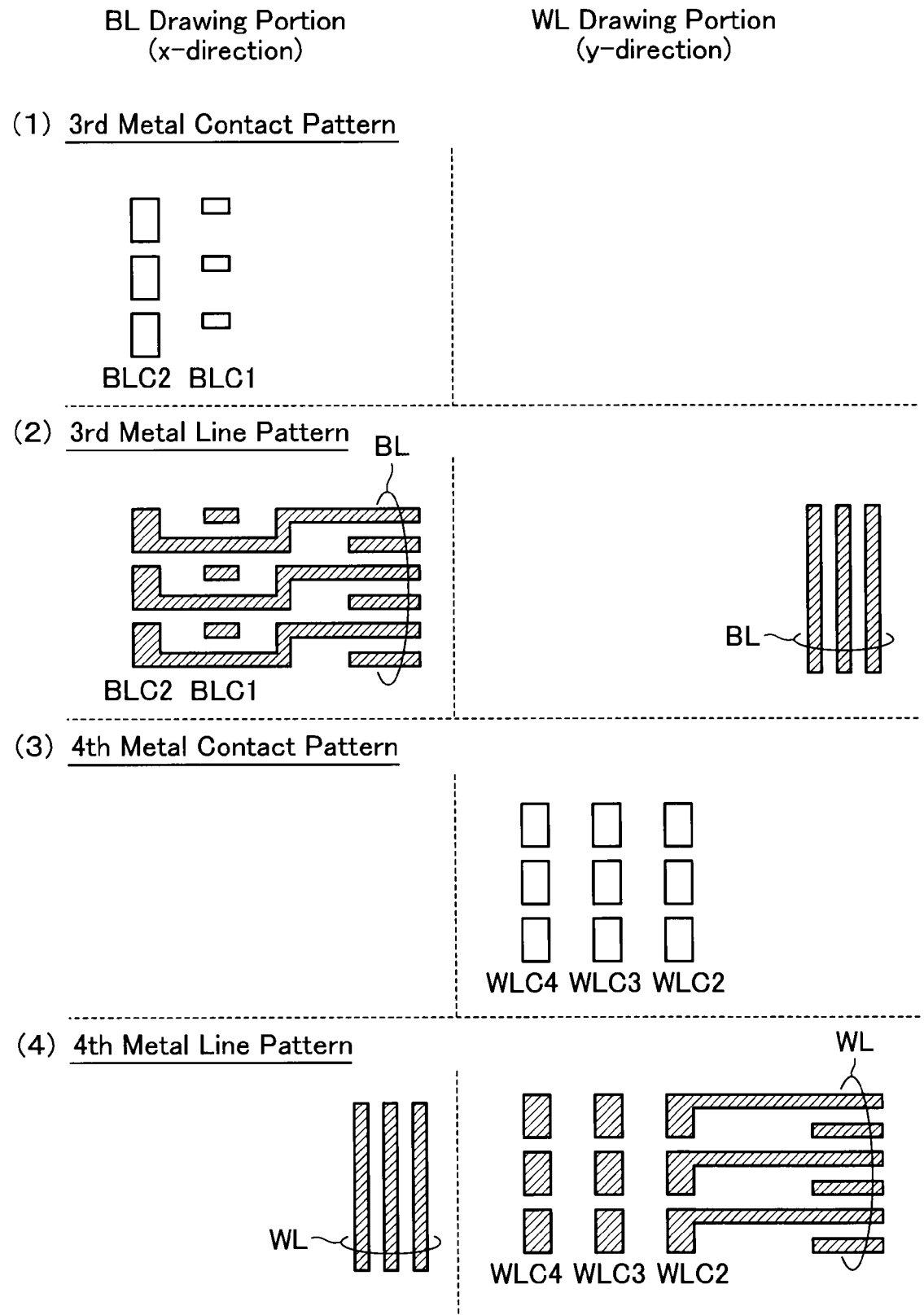
FIG. 5 shows other contact patterns and metal line patterns used in the comparison example.

With reference to FIGS. 4 and 5, layout patterns (contact hole pattern and line pattern, or mask patterns used for forming them) will be explained taking notice the periphery lines of the cell array (bit line drawing portion and word line drawing portion) in order from the substrate to the upper mats. In these drawings, bit line (BL) drawing portion (x-direction) and word line (WL) drawing portion (y-direction) are shown with the same direction as each other. It is in need of viewing these drawings to be relatively rotated with 90 degrees.

FIG. 4(1) shows a 1st metal contact pattern for the metal lines on the silicon substrate. This is a contact hole pattern serving as windows for the control circuit formed in an interlayer insulating film on the substrate. It is assumed here that cell array block 1 is formed of 8 mats (8-layered cell arrays). Since word lines WL are shared by adjacent two cell arrays, these are formed of 4 metal layers. 4 columns of word line contact portions WLC1 to WLC4 are arranged while 2 columns of bit line contact portions BLC1 and BLC2 are arranged for even-layered bit lines and odd-layered bit lines, respectively.

As explained above, word lines WL and bit lines BL are drawn from the both sides of the cell array. Therefore, these WL contacts and BL contacts may be arranged at a pitch twice as large as the line pitch. That is, assuming that BL pitch is P1, the pitch of bit line contact portions BLC1 and BLC2 is 2×P1. Assuming that WL pitch is P2, the pitch of word line contact portions WLC1 to WLC4 is 2×P2. If BL pitch P1 and WL pitch P2 is equal to the minimum feature device size P0, it will be obtained the following relationship of: 2×P1=2×P2=2×P0.

FIG. 4(2) shows a 1st metal line pattern. This is the lowest metal line pattern of the 3D-cell array. It is assumed here that the lowest metal lines are bit lines BL elongated in x-direction. Ends of these bit liens BL are connected with bit line contacts BLC1 in the two bit line contact portions BLC1 and BLC2.

FIG. 4(3) shows a 2nd metal contact pattern. That is, this is a word line contact hole pattern prepared at the word line contact portions WLC1-WLC4. Word lines WL are formed to be elongated in y-direction and coupled to the vertical wirings, which are formed on these word line contact holes.

FIG. 4(4) shows a 2nd metal line pattern. This is a word line WL pattern, which crosses the stripe of the first metal line pattern. The drawing portions of the word lines are connected with the word line contact portions WLC1 disposed on the end side within WLC1 to WLC4.

FIG. 5(1) shows a 3rd metal contact pattern prepared at the bit line contact portions BLC1 and BLC2. That is, this is a bit line contact pattern, which becomes the most severe in processing. Since the third metal layer serves as odd-numbered bit lines BL, these are necessary to detour the even-numbered vertical wirings (i.e., bit line contact portions BLC1) to be connected with the neighboring bit line contact portions BLC2.

For this purpose, it is required of the contact hole width of the bit line contact portions BLC1 to be narrowed for securing spaces used for detouring the following metal lines. Therefore, it is required to certainly bury metal in deep contact holes with a minimum size.

FIG. 5(2) shows a 3rd metal line pattern. This is an odd-numbered bit line BL pattern, which includes parts of vertical wirings (i.e., contact-use buried metals on the bit line contact portions BLC1) and line patterns detouring them to be coupled to the neighboring bit line contact portions BLC2.

FIG. 5(3) shows a 4th metal contact pattern. This is a vertical wiring contact hole pattern for word lines WL used in common to the third and fourth mats. That is, contact holes corresponding to the word line contact portions WLC2-WLC4 are formed.

FIG. 5(4) shows a 5th metal line pattern. This is a word line pattern, which includes word lines crossing the stripes of the third metal pattern. End portions of these word lines are coupled to the word line contact portions WLC2.

The same processes will be repeated to form an eighth metal pattern.

Figure 6:
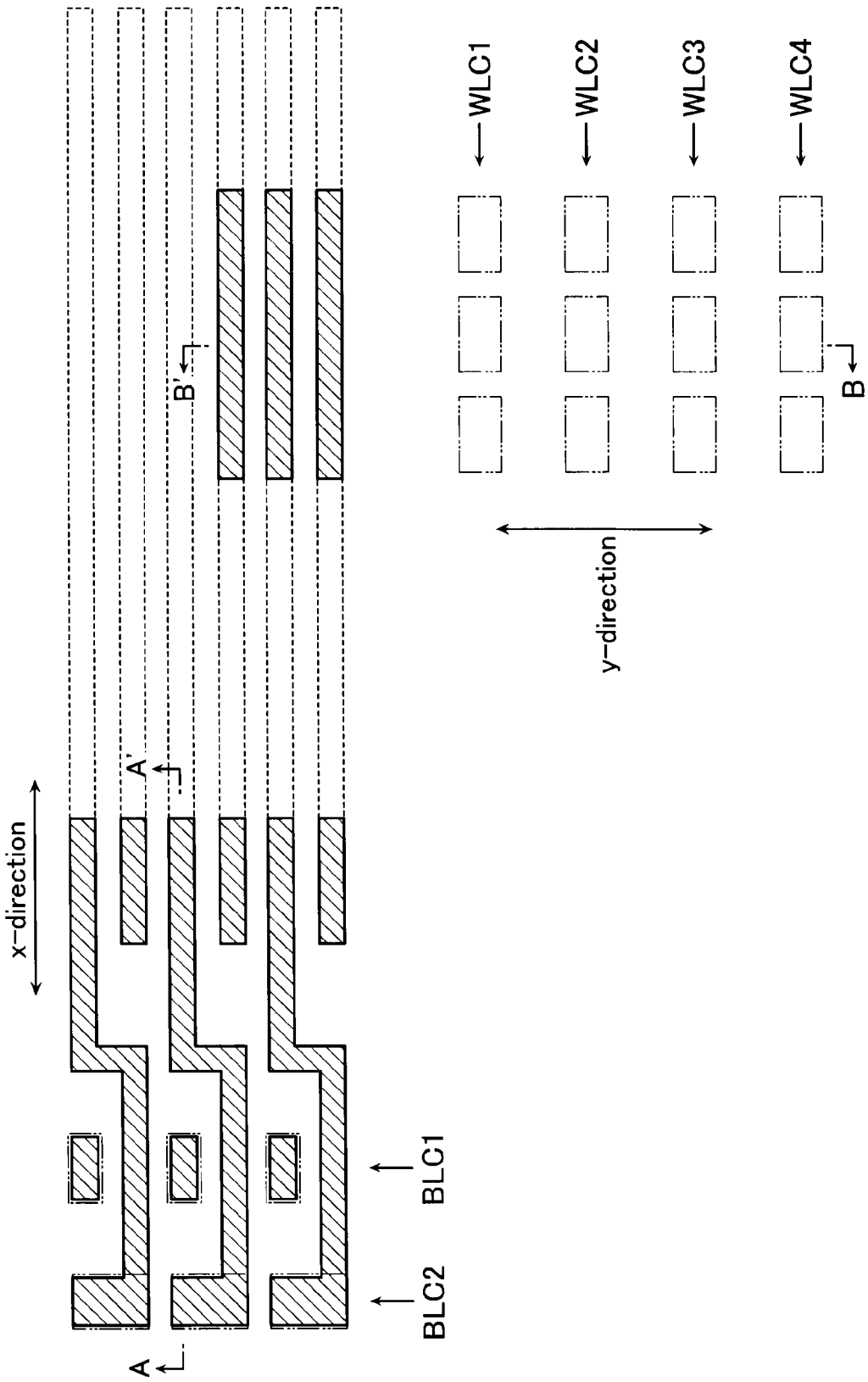
FIG. 6 shows A-A' and B-B' sectional view positions on the third metal line pattern.

Next, the cell array stacking processes will be explained with reference to sectional views. Sectional views referred to hereinafter are, as shown on the 3rd metal line pattern shown in FIG. 6, A-A' sectional view of the bit line drawing portion taken along x-direction and B-B' sectional view of the word line drawing portion taken along y-direction.

The 2nd metal contacts on the word line contact portions WLC1-WLC4 and the 3rd metal contacts on the bit line contact portions BLC1 and BLC2 are shown by double dotted lines.

Figure 7:
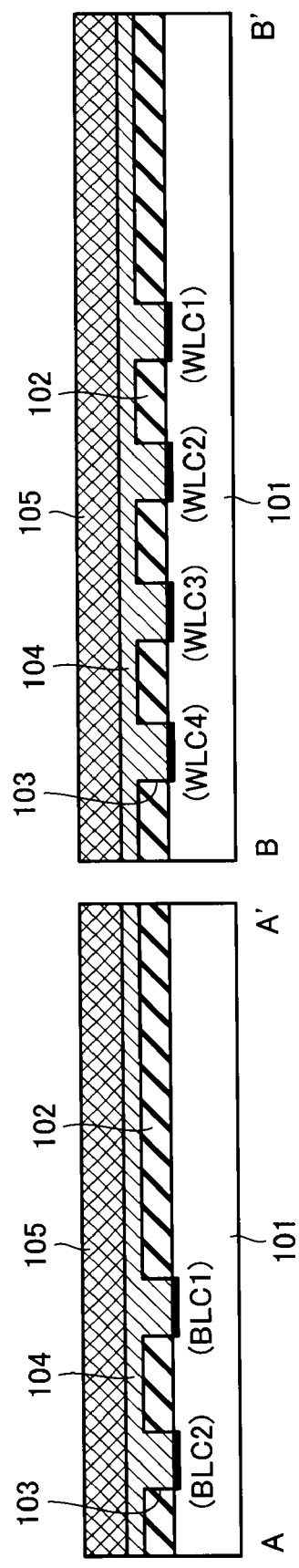
FIG. 7 shows A-A' and B-B' sectional views at step 0 in the comparison example.

Step 0 Shown in FIG. 7

As described above, the control circuit has been formed on the silicon substrate 101, and the surface is covered with interlayer insulating film 102. Form contact holes 103 in the insulating film 102 at positions corresponding to the bit line contact portions BLC1, BLC2 and word line contact portions WLC1-WLC4 with the contact pattern shown in FIG. 4(1). Then, deposit and planarize metal layer 104 such as tungsten (W) layer. Without patterning this metal layer 104, deposit and planarize memory cell layer 105 serving as a first mat. Memory cell layer 105 is formed of a stacked structure including something like a transition metal oxide film used for forming the variable resistance element and a polysilicon film used for forming the diode in case a memory cell is formed of variable resistance element VR and diode Di connected in series as shown in FIG. 2.

Figure 8:
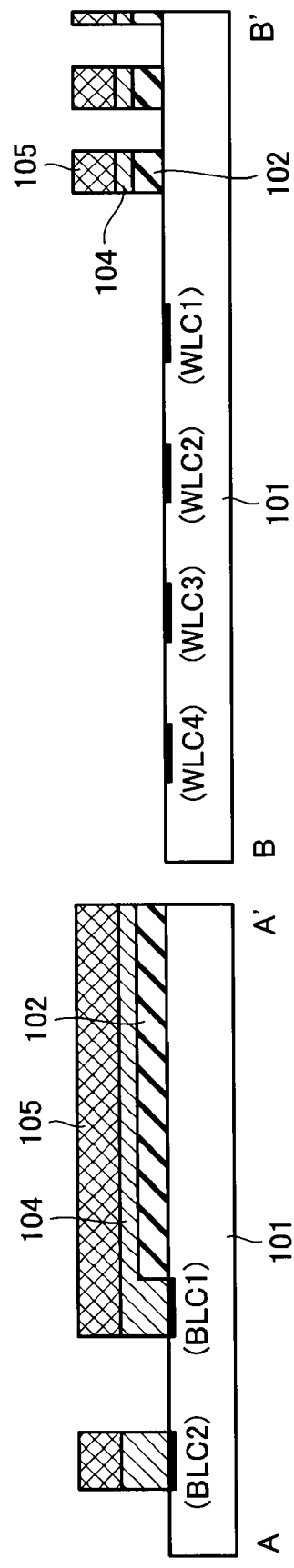
FIG. 8 shows A-A' and B-B' sectional views at step 1 in the comparison example.

Step 1 Shown in FIG. 8

Etch the memory cell layer 105 with the 1st metal line pattern (shown in FIG. 4(2)), and successively etch the metal layer 104, thereby forming the 1st metal lines (bit lines). At this step, a situation of that bit lines are coupled to the bit line contact portions BLC1 appears in A-A' sectional view, and another situation of that bit lines are separated from each other appears in B-B' sectional view. Successively, etch the insulating layer 102 at the word line drawing portions to expose the metal surface on the substrate at the word line contact portions WLC1-WLC4

Figure 9:
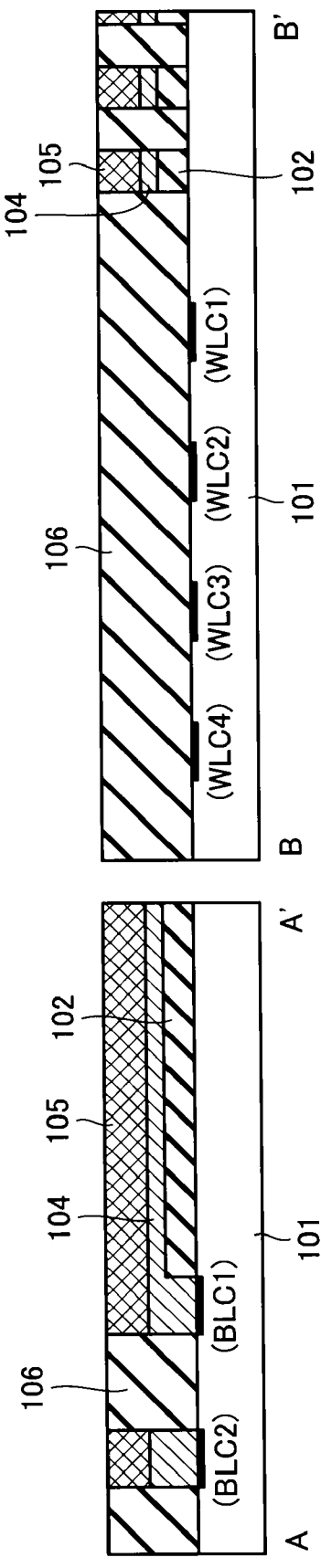
FIG. 9 shows A-A' and B-B' sectional views at step 2 in the comparison example.

Step 2 Shown in FIG. 9

Deposit insulating layer 106 to be buried around the metal lines formed in the step 1. The insulating layer 106 is planarized, and it is prepared for the following step such a state that memory cell layers 105 are exposed.

Figure 10:
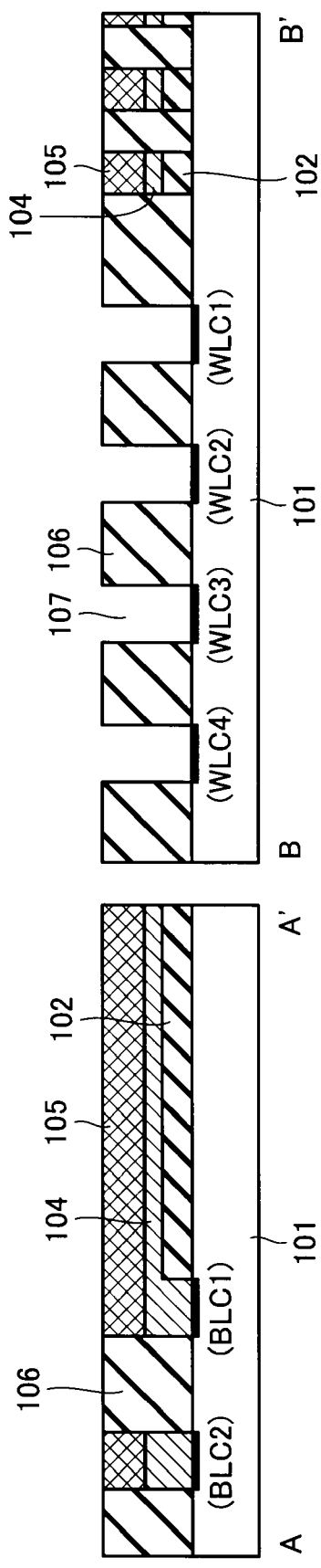
FIG. 10 shows A-A' and B-B' sectional views at step 3 in the comparison example.

Step 3 Shown in FIG. 10

Etch the insulating layer 106, and form contact holes 107 used for coupling metal lines to the metal layer on the substrate with the 2nd metal contact pattern shown in FIG. 4(3). In B-B' sectional view, contact holes 107 are formed on the word line contact portions WLC1-WLC4.

Figure 11:
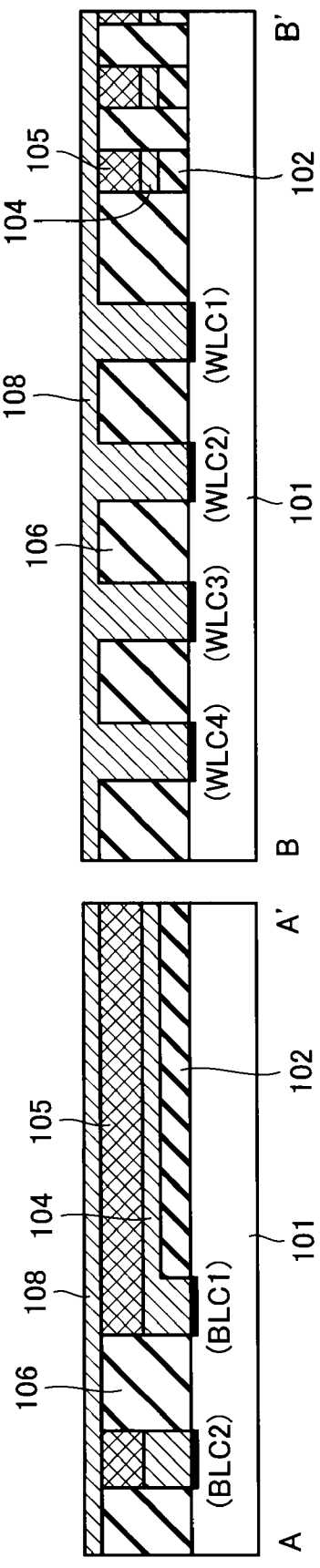
FIG. 11 shows A-A' and B-B' sectional views at step 4 in the comparison example.

Step 4 Shown in FIG. 11

Deposit 2nd metal layer 108 such as tungsten (W), and planarize it. The metal layer 108 serves as lines and is buried in the contact holes 107.

Figure 12:
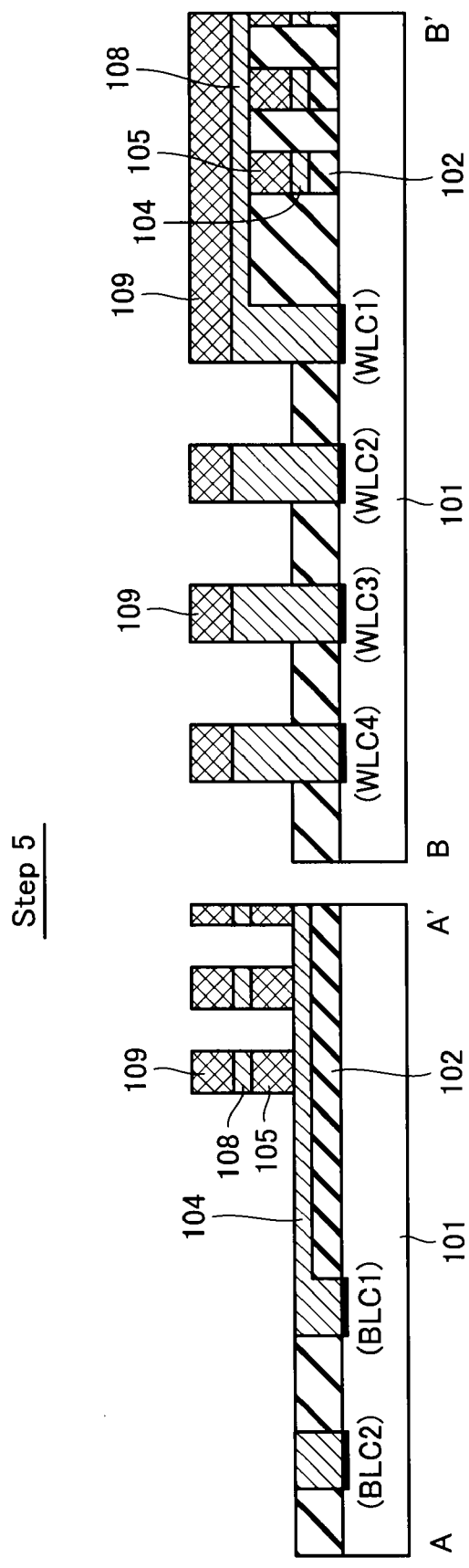
FIG. 12 shows A-A' and B-B' sectional views at step 5 in the comparison example.

Step 5 Shown in FIG. 12

Deposit memory cell layer 109 serving as the 2nd mat of the 3D-cell array, and etch it to expose the 1st metal layer 104 with the 2nd metal line pattern shown in FIG. 4(4), thereby forming the 2nd metal lines (word lines). At the word line contact portions WLC1-WLC4, memory cell layers 109 are remained together with word lines, and at the bit line contact portions BLC1, BLC2, the first metal layer 104 are exposed.

At this time, a situation of that word lines WL are coupled to the contact portions WLC1 appears in B-B' sectional view, and another situation of that word lines WL are separated from each other appears in A-A' sectional view.

In this etching step, the 1st memory cell layers 105 underlying the bit lines BL, which are elongated as well as the patterned bit lines, are remained only at the cross-points of the bit lines BL and word lines WL. At this stage, the 2nd memory cell layers 109 are continuously formed on the word lines WL of the memory cell layers 108 with the same patterns as the word lines WL.

Figure 13:
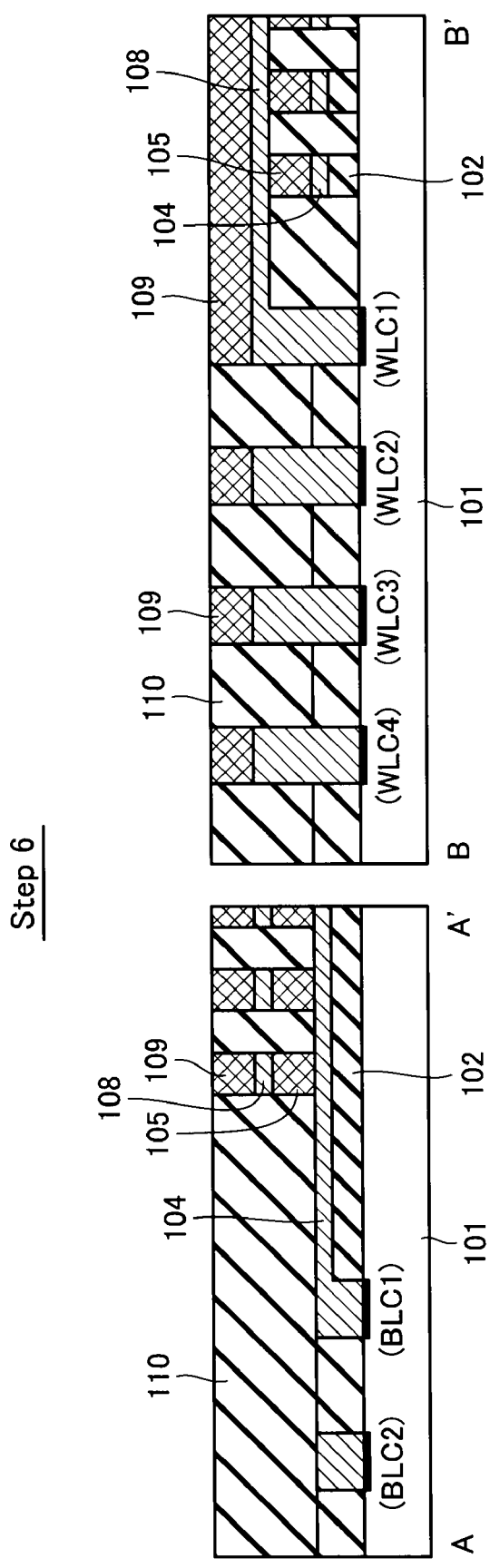
FIG. 13 shows A-A' and B-B' sectional views at step 6 in the comparison example.

Step 6 Shown in FIG. 13

Deposit insulating layer 110 to be buried around the metal lines formed in the step 5. The insulating layer 110 is planarized, and it is prepared for the following step such a state that memory cell layers 109 are exposed.

Figure 14:
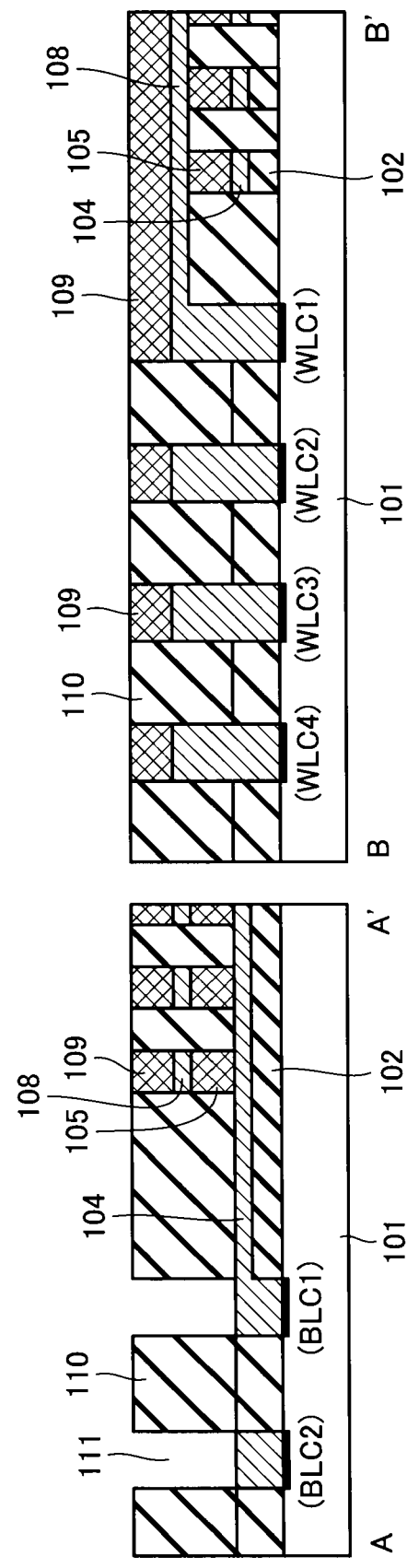
FIG. 14 shows A-A' and B-B' sectional views at step 7 in the comparison example.

Step 7 Shown in FIG. 14

Etch the insulating layer 110 to form contact holes 111 used for coupling metal lines to the 1st metal layer on the bit line contact portions BLC1 and BLC2 with the 3rd metal contact pattern shown in FIG. 5(1).

Figure 15:
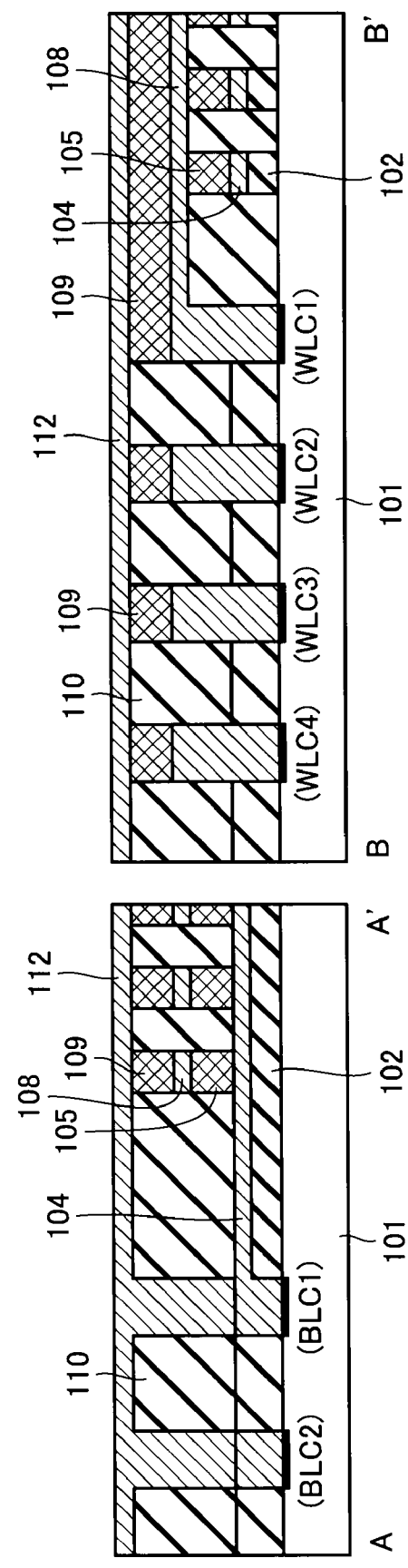
FIG. 15 shows A-A' and B-B' sectional view at step 8 in the comparison example.

Step 8 Shown in FIG. 15

Deposit and planarize 3rd metal layer 112. This 3rd metal layer 112 serves as metal lines and is buried in the contact holes 111 to be contacted with the 1st metal layers at the bit line contact portions.

Figure 16:
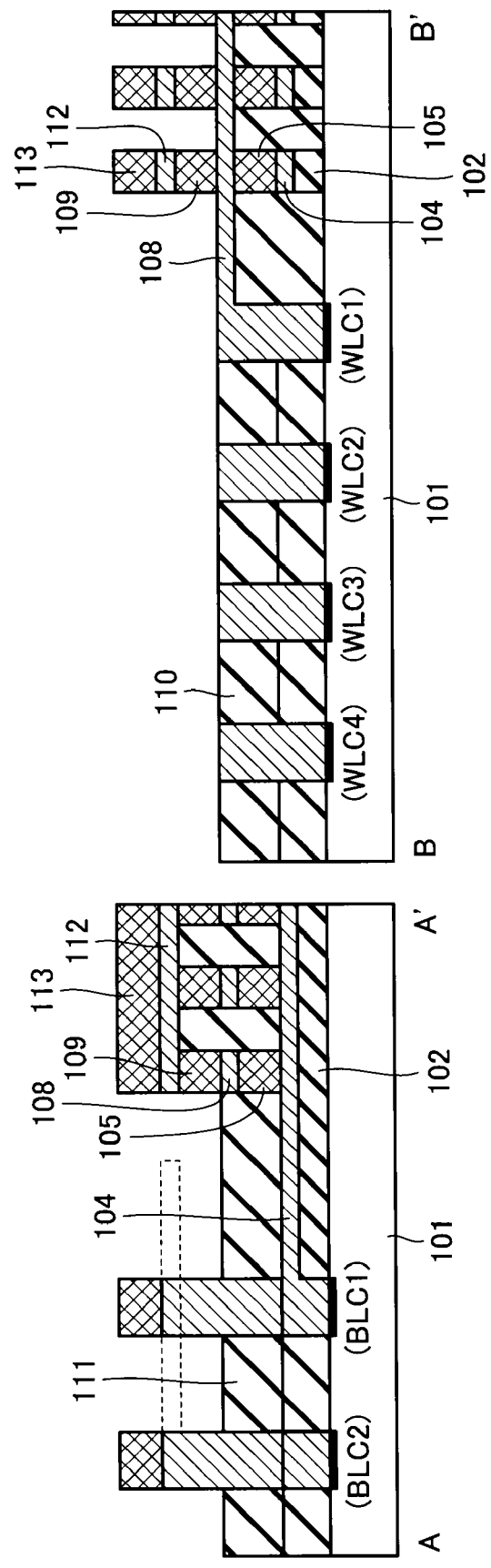
FIG. 16 shows A-A' and B-B' sectional views at step 9 in the comparison example.

Step 9 Shown in FIG. 16

Deposit memory layer 113 serving as the 3rd mat of 3D-cell array on the 3rd metal layer 112, and etch it by IE with the 3rd metal line pattern shown in FIG. 5(2) until the surface of the 2nd metal layer 108 is exposed. In detail, in this step, memory layer 113, metal layer 112 underlying it, and memory layer 109 underlying it are continuously etched.

As a result, the 2nd layer of bit lines BL are patterned, and the 2nd memory cell layers 109 are remained at the respective cross-points between the 2nd bit lines BL and underlying word lines WL. At the bit line contact portions BLC1 and BLC2, memory cell layers 113 are remained together with the bit lines while at the word line contact portions WLC1-WLC4, the 2nd metal layer 108 is exposed.

Note here that the 3rd metal line (bit line) to be coupled to the outer bit line contact portion BLC2 detours the inner bit line contact portion BLC1 in this A-A' sectional view, and the detoured bit line is shown by a dotted line in A-A' sectional view. In the successive steps, the same situations will appear.

Figure 17:
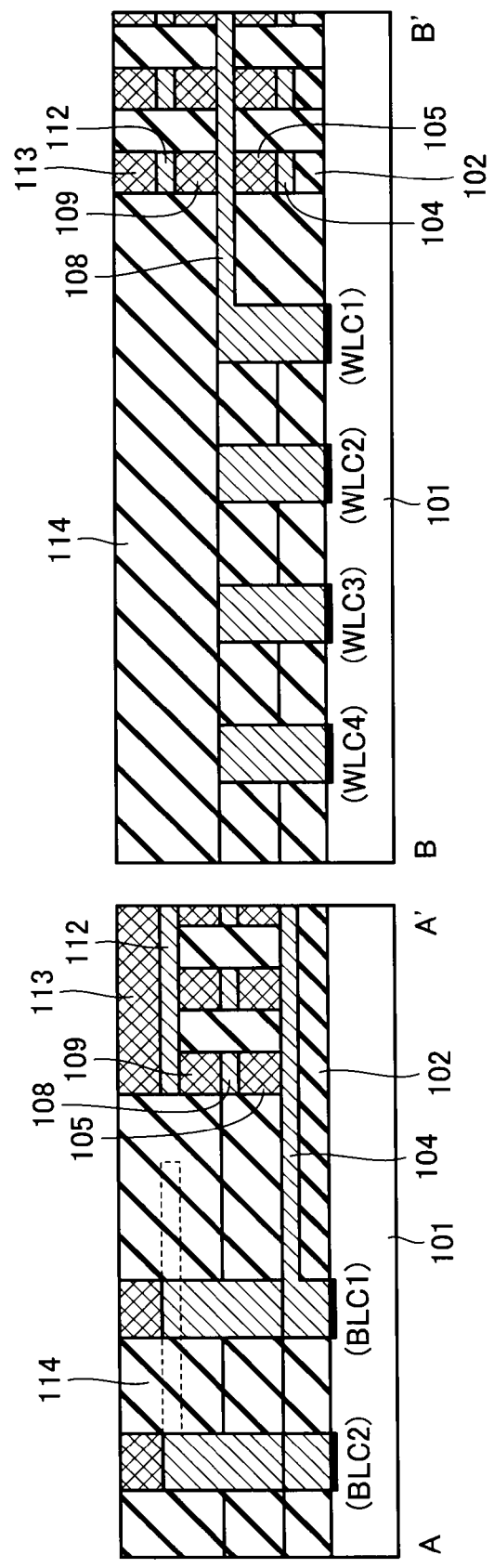
FIG. 17 shows A-A' and B-B' sectional views at step 10 in the comparison example.

Step 10 Shown in FIG. 17

Deposit insulating layer 114 to be buried around the metal lines formed in the step 9. The insulating layer 114 is planarized, and it is prepared for the following lithography step such a state that memory cell layers 113 are exposed.

Figure 18:
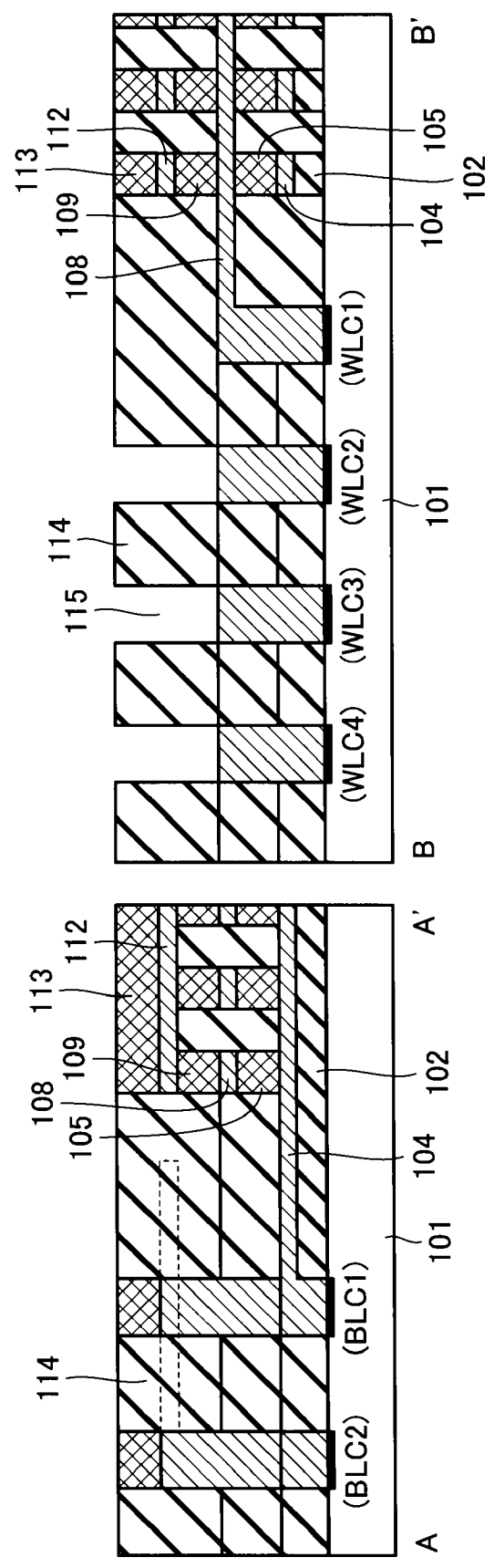
FIG. 18 shows A-A' and B-B' sectional views at step 11 in the comparison example.

Step 11 Shown in FIG. 18

Etch the insulating layer 114 to form contact holes 115 used for coupling metal lines to the 2nd metal layer on the word line contact portions WLC2 to WLC4 with the 4th metal contact pattern shown in FIG. 5(3).

Figure 19:
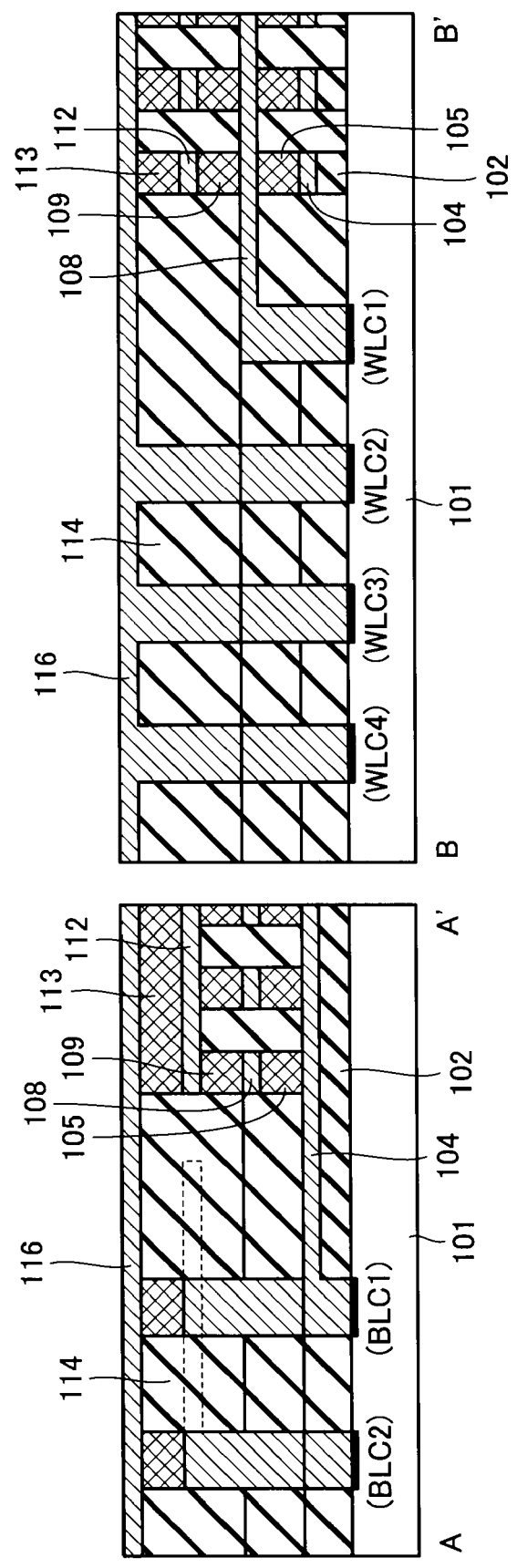
FIG. 19 shows A-A' and B-B' sectional views at step 12 in the comparison example.

Step 12 Shown in FIG. 19

Deposit and planarize 4th metal layer 116. This 4th metal layer 116 serves as metal lines and is buried in the contact holes 115 to be contacted with the 2nd metal at the word line contact portions WLC2-WLC4.

Figure 20:
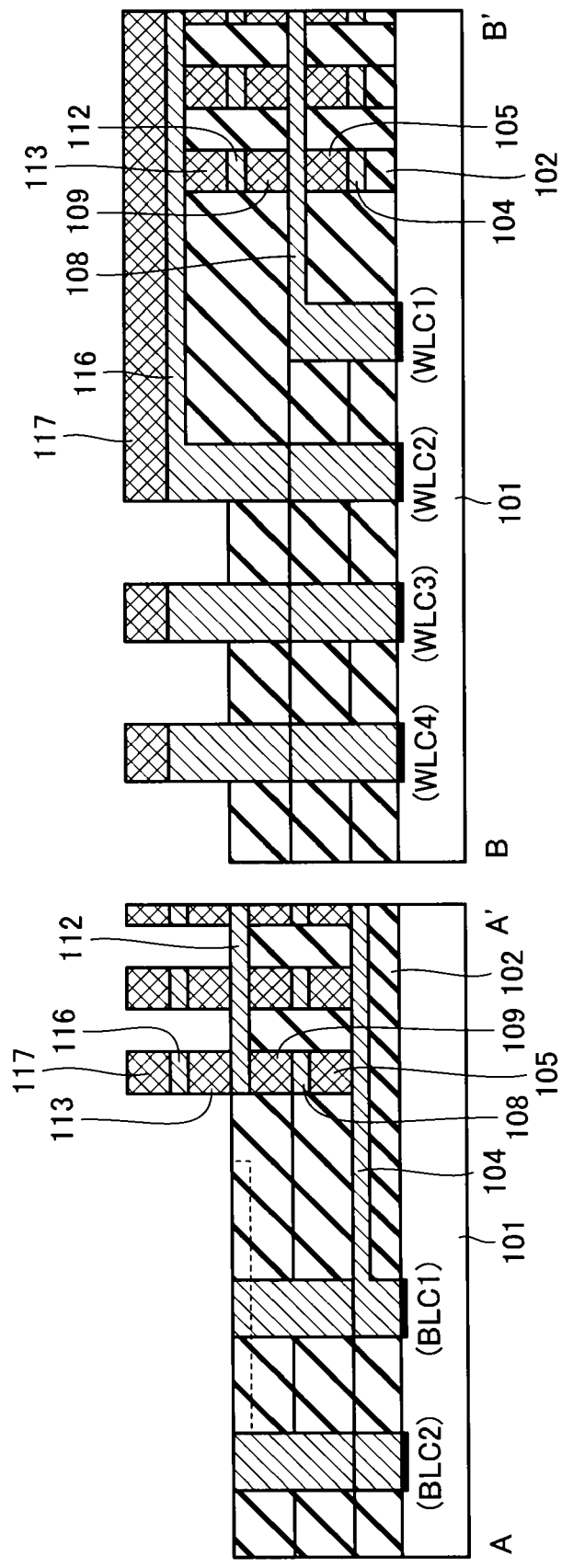
FIG. 20 shows A-A' and B-B' sectional views at step 13 in the comparison example.

Step 13 Shown in FIG. 20

Deposit memory layer 117 serving as the 4th mat of 3D-cell array on the 4th metal layer 116, and etch it by IE with the 4th metal line pattern shown in FIG. 5(4) until the surface of the 3rd metal layer 112 is exposed. As a result, the 2nd layer of word lines WL are patterned, and the 3rd memory cell layers 113 are remained at the respective cross-points between the word lines WL and underlying bit lines BL.

At the word line contact portions WLC2-WLC4, memory cell layers 117 are remained together with word lines while at the bit line contact portions BLC1, BLC2, the 3rd metal layers 112 are exposed.

Figure 21:
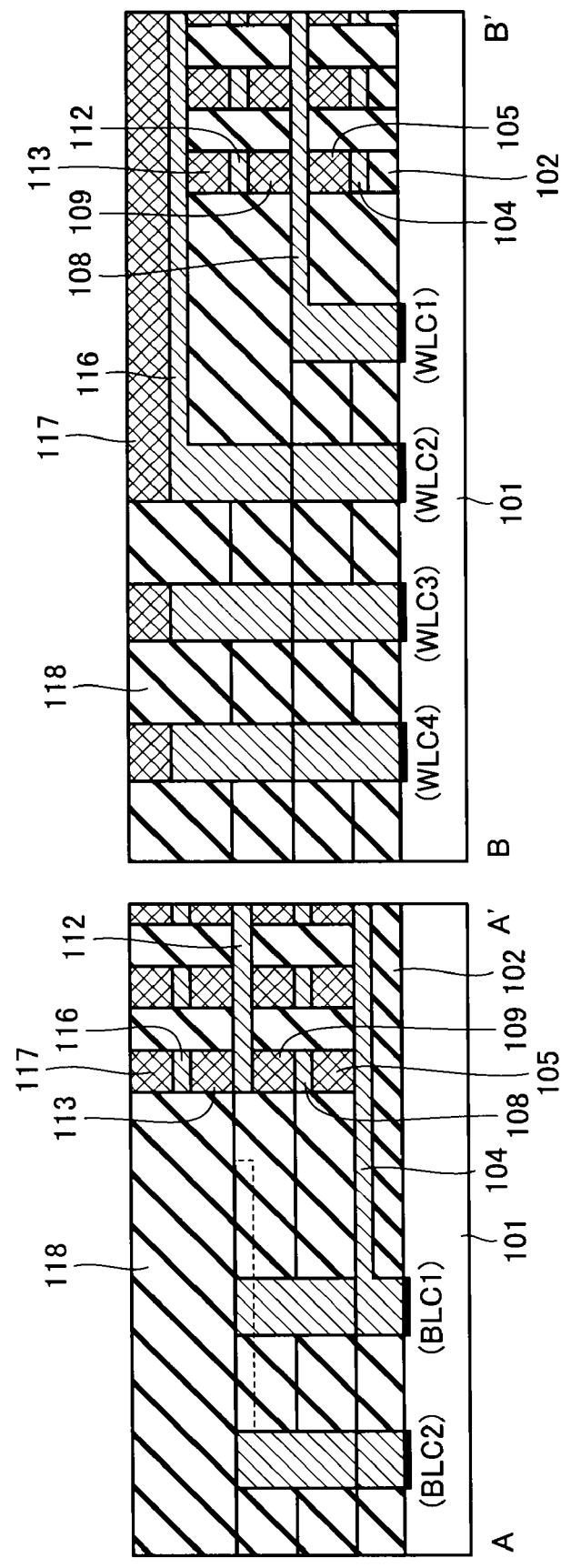
FIG. 21 shows A-A' and B-B' sectional views at step 14 in the comparison example.

Step 14 Shown in FIG. 21

Deposit insulating layer 118 to be buried around the metal lines formed in the step 13. The insulating layer 118 is planarized, and it is prepared for the following lithography step such a state that memory cell layers 117 are exposed.

Figure 22:
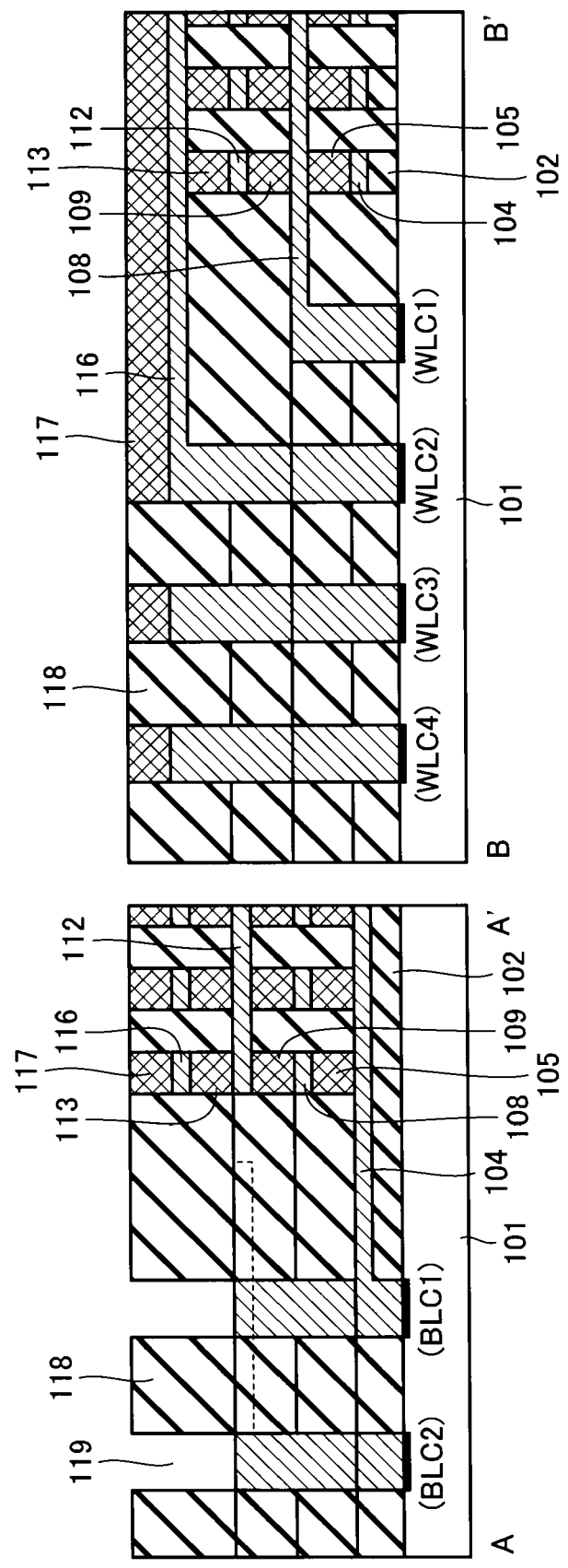
FIG. 22 shows A-A' and B-B' sectional views at step 15 in the comparison example.

Step 15 Shown in FIG. 22

Etch the insulating layer 118 to form contact holes 119 used for coupling metal lines to the 3rd metal layer on the bit line contact portions BLC1 and BLC2 with the 4th metal contact pattern (not shown, but the same as that shown in FIG. 5(1)).

Figure 23:
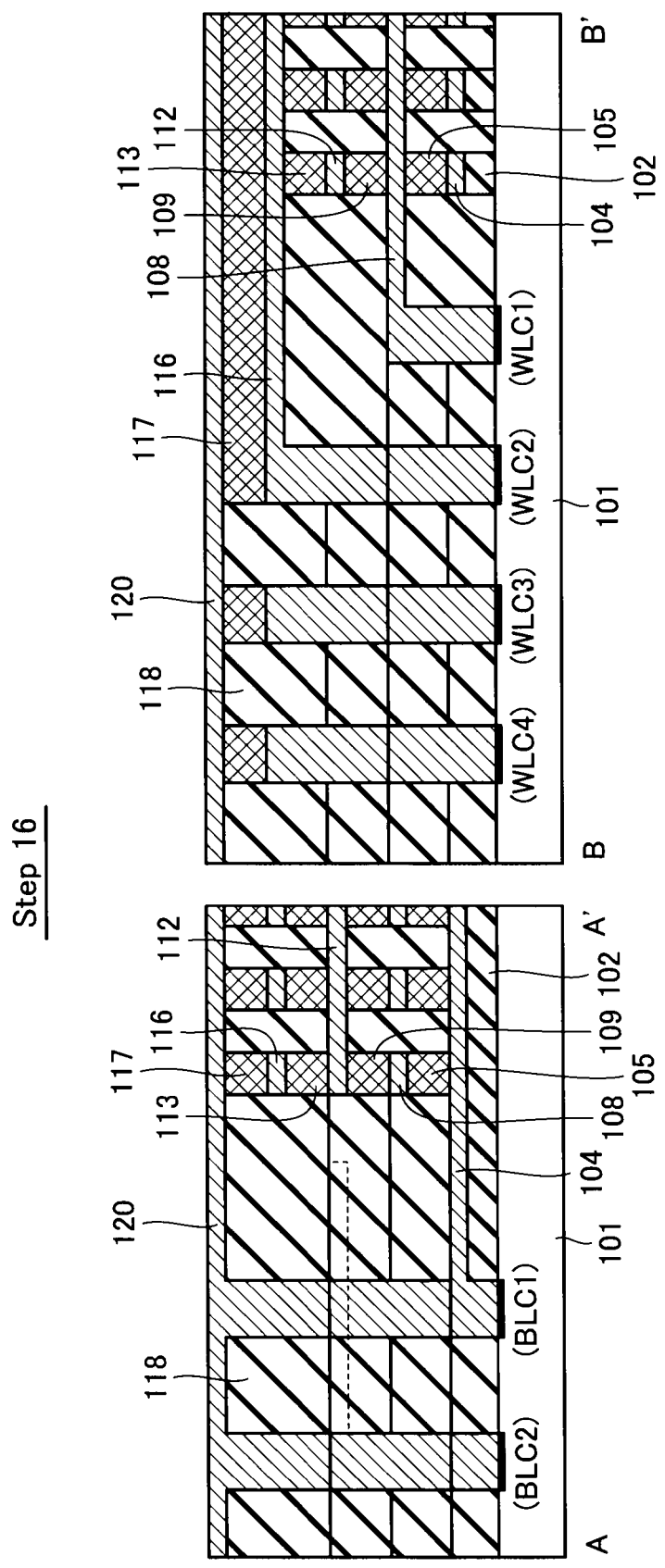
FIG. 23 shows A-A' and B-B' sectional views at step 16 in the comparison example.

Step 16 Shown in FIG. 23

Deposit and planarize 5th metal layer 120. This 5th metal layer 120 serves as metal lines and is buried in the contact holes 119 to be contacted with the 3rd metal at the bit line contact portions BLC1, BLC2.

Figure 24:
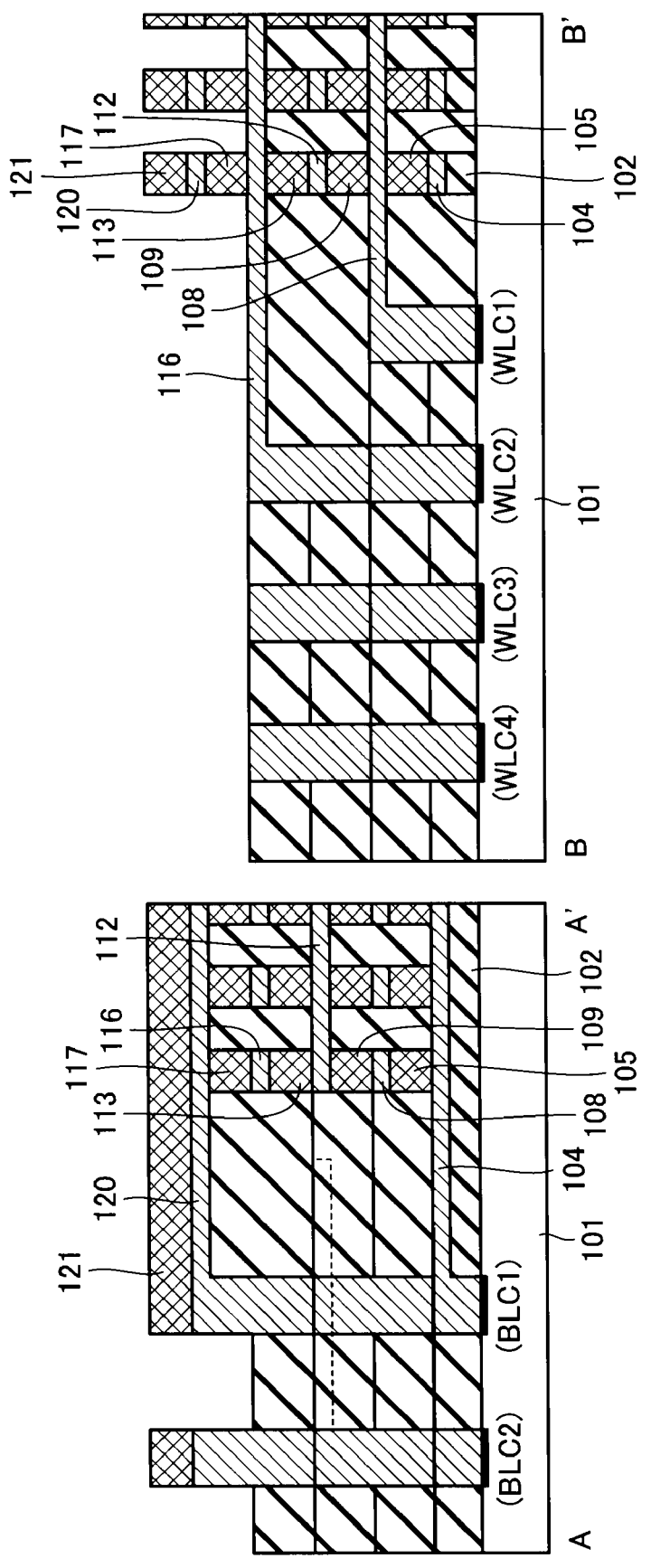
FIG. 24 shows A-A' and B-B' sectional views at step 17 in the comparison example.

Step 17 Shown in FIG. 24

Deposit memory layer 121 serving as the 5th mat of 3D-cell array on the 5th metal layer 120, and etch it by IE with the 5th metal line pattern (this is the same as the 1st metal line pattern shown in FIG. 4(2)) until the surface of the 4th metal layer 116 is exposed. As a result, the 3rd bit lines BL are patterned, and the 4th memory cell layers 117 are remained at the respective cross-points between the bit lines BL and underlying word lines WL.

The explanation of the successive processes will be omitted because these are repeated ones described above.

In the above-described method of forming the vertical wirings used for drawing the signal lines of 3D-cell array with contact patterns, it is necessary to use the minimum feature device size used in the 3D-cell array for forming contact holes as shown in FIG. 5(1). Additionally, the depth of the contact holes to be buried with metal is twice as thick as a mat.

To increase the memory capacity, it is necessary to increase the integration and the number of layers. Therefore, process control for forming contact holes, burying metal, aligning contacts between mats and the like will become more and more difficult. Further, lines between cells and in a mat, and line drawing portions become more and more dense, and resulting in that CR time constant of the signal lines increases, and thermal interference between cells increases. To improve these drawbacks, it is in need of considering the integration of the 3D-cell array and the signal line drawing portions.

[Embodiments]

Embodiments of the present invention will be explained below. In the embodiments, there is not used the contact holes to be formed with the minimum feature device size used in the 3D-cell array. That is, without the conventional contact holes used in the above-described comparison example, stripe-shaped contact trenches will be formed in such a manner that each contact trench is extended over multiple contact portions disposed therein.

FIGS. 25-27 and FIGS. 28-30 show process patterns of bit line (BL) drawing portions and word line (WL) drawing portions used for constituting the bit line and word line vertical wirings, respectively. In the respective drawing portions, there are two cases shown in parallel as follows: one case without a process for hollowing the 3D-cell array ("without hollowing"); and the other case with a process for hollowing the 3D-cell array ("with hollowing").

Figure 32:
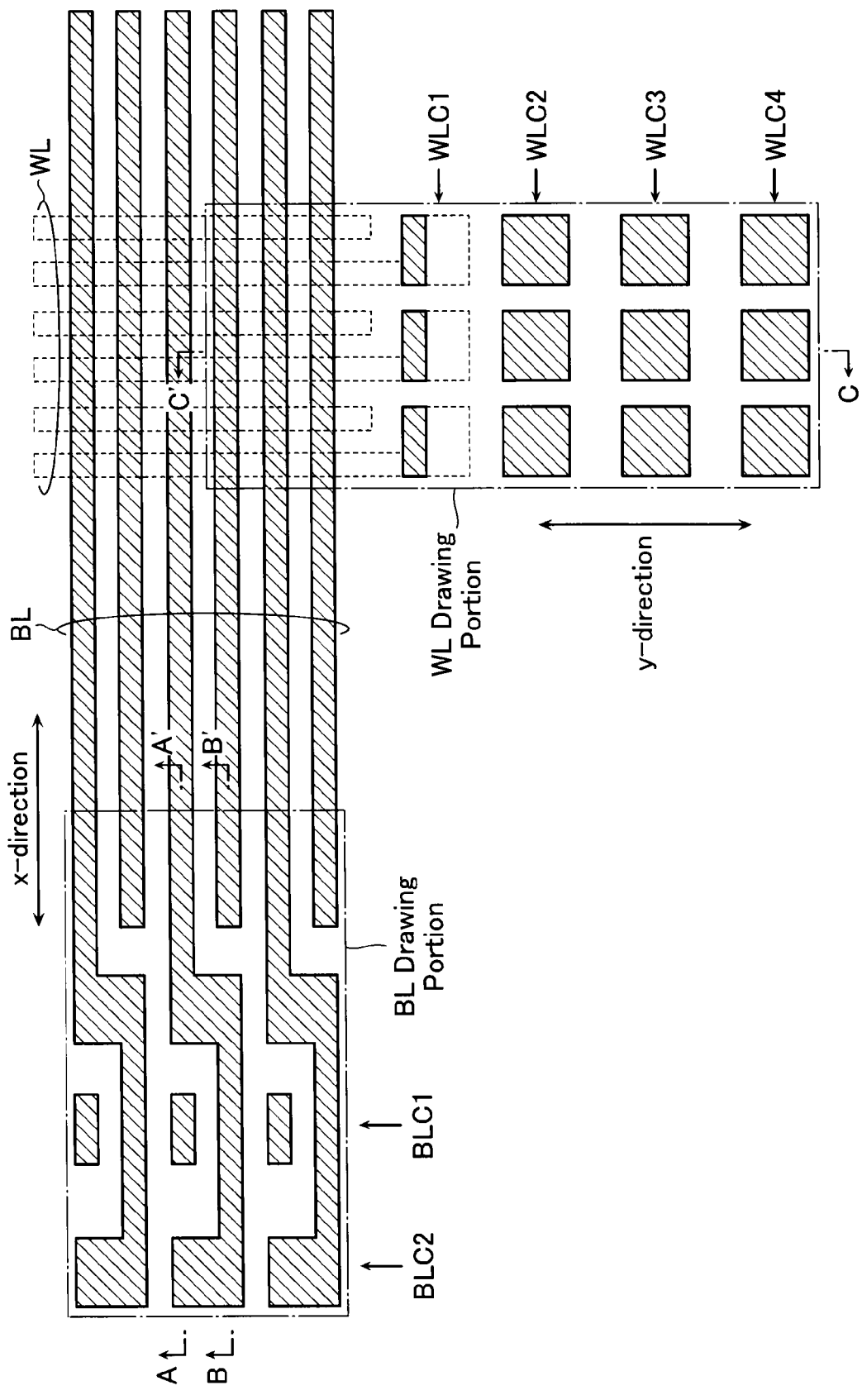
FIG. 32 shows A-A', B-B' and C-C' sectional view positions in the embodiment.

BL direction and WL direction are x-direction and y-direction, respectively, which are perpendicular to each other. FIG. 32 shows this situation, in which the relationship between the BL drawing portion (x-direction) and the WL drawing portion (y-direction) is shown in the whole layout of 3rd metal line pattern described later. However, these two directions are shown as the same lateral directions in FIGS. 25-27 and 28-30.

As apparent from the layout shown in FIG. 32, the corresponding patterns in FIGS. 25-27 and FIGS. 28-30 (listed up below) designate different parts in a pattern.

(1) 1st contact trench patterns for metal layer on the Si substrate shown in FIGS. 25 and 28; (2) 1st metal line patterns shown in FIGS. 25 and 28; (3) 2nd contact trench patterns on the periphery of cell array shown in FIGS. 25 and 28; (4) 2nd metal line patterns shown in FIG. 25 and 28; (5) 3rd metal line patterns shown in FIGS. 26 and 29; (6) 4th metal line patterns shown in FIGS. 26 and 29; (7) 5th metal line patterns shown I FIGS. 26 and 29; (8) 6th metal line patterns shown in FIGS. 26 and 29; (9) 7th metal line patterns shown in FIGS. 27 and 30; and (10) 8th metal line patterns shown FIGS. 27 and 30.

With these contact trench patterns, metal line patterns and mask patterns thereof used in the respective mats of 3D-cell array, the conventional contact hole pattern with the minimum feature device size becomes unnecessary.

The respective process patterns will be explained in brief below.

(1) 1st contact trench pattern for exposing the uppermost metal line on Si substrate (FIGS. 25 and 28):

This contact trench pattern is used, prior to stacking the 3d-cell array, for etching the interlayer insulating film covering the Si substrate so as to expose the contact portions of the uppermost metal lines formed on the Si substrate, on which the control circuit is formed.

With respect to both of two columns of bit line contact portions BLC1 and BLC2, stripe-shaped contact trenches are formed in such a manner that each trench is extended over multiple bit line contact portions (FIG. 25).

Similarly, with respect to four columns of word line contact portions WLC1 to WLC4, stripe-shaped contact trenches are formed in such a manner that each trench is extended over multiple word line contact portions (FIG. 28).

In these contact trenches, the uppermost metal lines on the Si substrate are short-circuited when a metal layer is buried. However, as explained later, the metal layer buried in each contact trench is divided into multiple metal pieces dispersely arranged in the elongated direction (i.e., disposed in corresponding to the multiple contact portions) in the trench by IE etching.

(2) 1st metal line pattern (FIGS. 25 and 28)

This is the lowest metal line pattern in the 3D-cell array, which serves as bit lines BL, bit line contact portions (FIG. 25), and word line contact portions (FIG. 28). The bit lines BL with this 1st metal line pattern are contacted with the metal lines formed on Si substrate at one trench corresponding to the inner bit line contact portions BLC1 within two columns of BLC1 and BLC2.

(3) 2nd contact trench pattern for burying vertical wirings on the periphery of cell array (FIGS. 25 and 28):

These contact trenches are formed in the interlayer insulating film on the periphery of cell array at the respective bit line contact portions and word line contact portions. The stripe-shaped trenches formed in parallel with other are used for burying metal layer on the bottom and on the sidewall so as to constitute vertical wirings. These trenches may be formed rough, after the respective metal lines are formed, in such a manner that width D2 of the trench is set to be larger than that, D1, of the above-described (1) 1st contact trench pattern.

(4) 2nd metal line pattern (FIGS. 25 and 28):

This 2nd metal line pattern includes metal lines crossing the 1st metal lines in the cell array area. Cross-point cells are formed between the 2nd metal lines and 1st metal lines. Further, the second metal line pattern serves bit line contact portions BLC1, BLC2 (FIG. 25) and word line contact portions WLC1 to WLC4 (FIG. 28). The word lines WL are 1st word lines, and coupled to the innermost contact portions WLC1 within four columns of WLC1 to WLC4.

Noticing the bit line contact portions BLC1, BLC2 and word line contact portions WLC1 to WLC4, where the vertical wirings are to be arranged at a certain pitch, metal layers are patterned to metal pieces arranged in the elongated direction in the respective trenches. The divided metal pieces in the trenches are sequentially stacked, so that the vertical wirings are formed to couple bit lines BL and word lines WL to the substrate.

Figure 29:
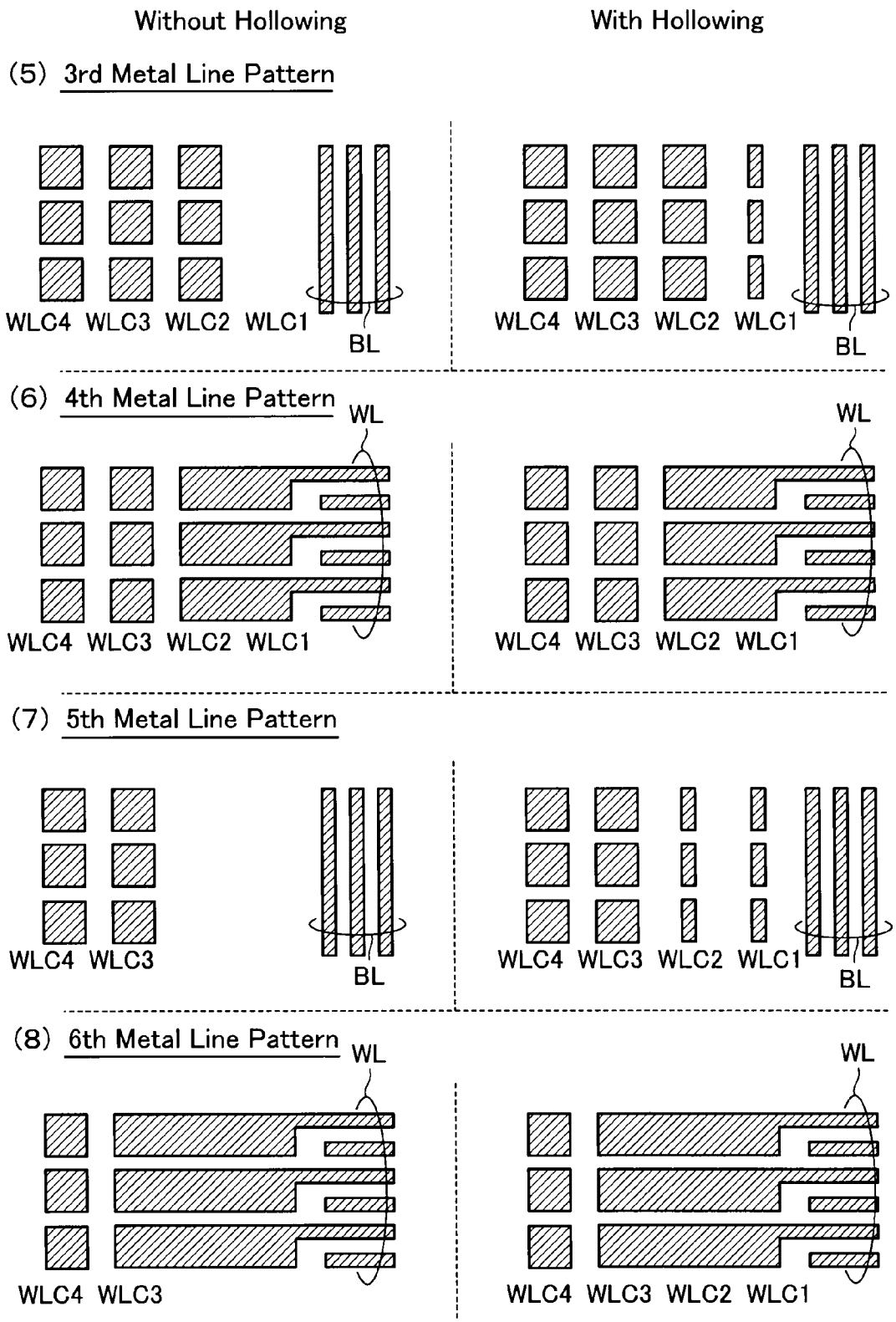
FIG. 29 shows metal line patterns at word line drawing portion (part-2) in accordance with the embodiment.

(5) 3rd metal line pattern (FIGS. 26 and 29):

This 3rd metal line pattern includes metal lines crossing the 2nd metal lines in the cell array area. Cross-point cells are formed between the 3rd metal lines and 2nd metal lines. Further, the 3rd metal line pattern serves as bit line contact portions BLC1, BLC2 (FIG. 26) and word line contact portions WLC1 to WLC4 (FIG. 29). The bit lines are 2nd bit lines, and coupled to the outer contact portions BLC2 within two columns of BLC1 and BLC2.

(6) 4th metal line pattern (FIGS. 26 and 29):

This 4th metal line pattern serves as metal lines (2nd word lines WL) crossing the 3rd metal lines (2nd bit lines BL) in the cell array, bit line contact portions BLC1, BLC2 (FIG. 26) and word line contact portions WLC1 to WLC4 (FIG. 29). The 2nd word lines WL are coupled to the second inner contact portion, WLC2, within the four columns of WLC1 to WLC4.

(7) 5th metal line pattern (FIGS. 26 and 29):

This 5th metal line pattern serves as metal lines (3rd bit lines BL) crossing the 4th metal lines (2nd word lines WL) in the cell array, bit line contact portions BLC1, BLC2 (FIG. 26) and word line contact portions WLC1 to WLC4 (FIG. 29). The bit lines BL are 3rd bit lines and coupled to the inner contact portion, BLC1, within the two columns of BLC1 and BLC2.

(8) 6th metal line pattern (FIGS. 26 and 29):

This 6th metal line pattern serves as metal lines (3rd word lines WL) crossing the 5th metal lines (3rd bit lines BL) in the cell array area, bit line contact portions BLC1, BLC2 (FIG. 26) and word line contact portions WLC1 to WLC4 (FIG. 29). The 3rd word lines WL are coupled to the inner third contact portion, WLC3, within the four columns of WLC1 to WLC4.

(9) 7th metal line pattern (FIGS. 27 and 30):

This 7th metal line pattern serves as metal lines (4th bit lines BL) crossing the 6th metal lines (3rd word lines WL) in the cell array area, bit line contact portions BLC1, BLC2 (FIG. 27) and word line contact portions WLC1 to WLC4 (FIG. 30). The 4th bit lines BL are coupled to the inner contact portion, BLC1, within the two columns of BLC1 and BLC2.

(10) 8th metal line pattern (FIGS. 27 and 30):

This 8th metal pattern serves as metal lines (4th word lines WL) crossing the 7th metal lines (4th bit lines BL) in the cell array, bit line contact portions BLC1, BLC2 (FIG. 27) and word line contact portions WLC1 to WLC4 (FIG. 30). The 4th word lines WL are coupled to the outermost contact portion, WLC4, within the four columns of WLC1 to WLC4.

It should be noted that as described above, trench forming steps with the (3) 2nd contact trench pattern shown in FIGS. 25 and 28 are adapted between the respective metal deposition steps.

Figure 31:
FIG. 31 shows the contact pattern used for the contact portion of the uppermost metal line.

FIG. 31 shows mask patterns used for coupling the uppermost line formed on the 3D-cell array to the metal line formed on the Si substrate with respect to two cases of "without hollowing" and "with hollowing".

1st contact pattern is the lowest contact pattern for exposing the metal line formed on Si substrate at contact portion SC. That is, this contact pattern corresponds to the above-described (1) 1st contact trench pattern shown in FIGS. 25 and 28. 1st metal pattern is one corresponding to the above-described (2) 1st metal line pattern shown in FIGS. 25 and 28. 2nd contact pattern corresponds to the above-described (3) 2nd contact trench pattern shown in FIGS. 25 and 28. 2nd metal pattern corresponds to the above-described (2) 2nd metal line pattern shown in FIGS. 25 and 28. The following metal patterns are the same as the 2nd metal pattern.

In case of "without hollowing", the respective masks are prepared only at the metal line contact portion SC. However, 2nd contact pattern and the following patterns are formed to have a larger size than the contact portion SC.

In case of "with hollowing", it is required to form a 3D-cell array supporting structure for supporting the periphery of the hollowed portion in the cell array. Therefore, in the 1st metal pattern and the following patterns, there are prepared additional patterns surrounding the contact portion SC. That is, after forming the contact hole for the Si substrate with the 1st contact pattern, 1st metal layer is deposited and patterned to have a contact portion and some supporting portions with the 1st metal pattern. Following it, metal layers are sequentially stacked on the contact portion and the supporting portions with mask patterns with an enlarged width.

Next, fabrication processes of the 3D-cell array and the vertical wirings will be explained with reference to the respective sectional views. The positions of the respective sectional views to be referred to are shown on the 3rd metal line pattern layout shown in FIG. 32. Bit lines BL and word lines WL are drawn in such a way that one of adjacent two lines is drawn from one side; and the other from the other side (opposite side). In FIG. 32, x-direction is the bit line direction while y-direction is the word line direction.

With respect to the bit lines BL, even-numbered bit lines are coupled in common to each other, and odd-numbered bit lines also are coupled in common to each other, whereby the vertical wiring structures of adjacent two bit lines are different from each other. Therefore, it will be used two sectional views, A-A' and B-B' sectional views, corresponding to adjacent two bit line contact portions. By contrast, with respect to the word line contact portions, only one C-C' sectional view is prepared.

(In Case of "Without Hollowing")

First, the fabrication process will be explained in such a case that 3D-cell array is not hollowed.

Figure 33A:
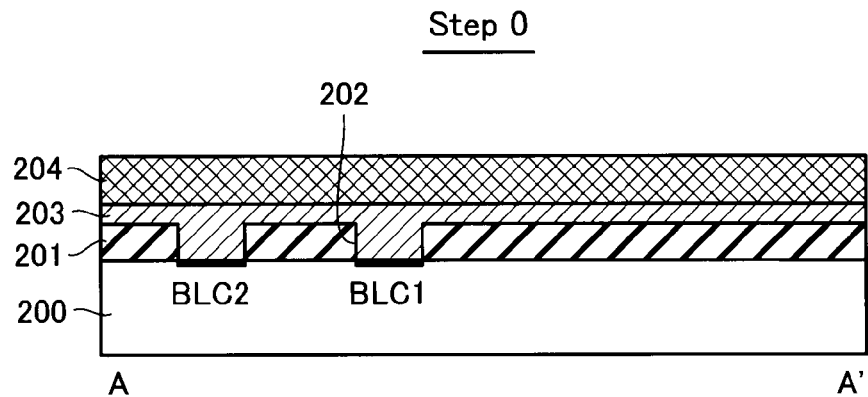
FIGS. 33A to 33C show A-A', B-B' and C-C' sectional views at step 0 in the embodiment.
Figure 33B:
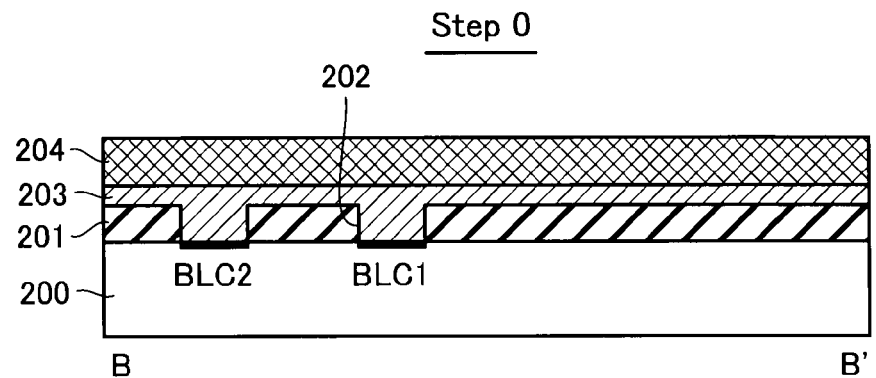
Figure 33C:
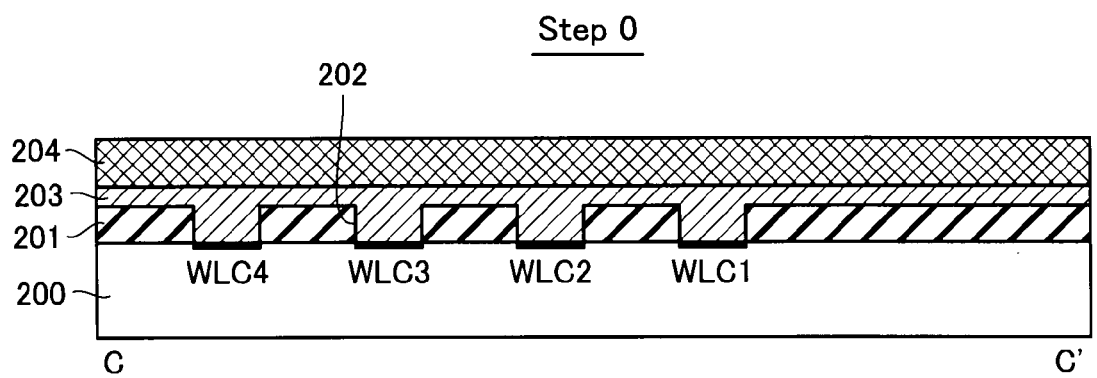

Step 0 (FIGS. 33A, 33B and 33C)

Si substrate 200, on which the control circuit is formed, is covered by interlayer insulating film 201. Engrave the insulating layer 201 to form stripe-shaped contact trenches 202 at the bit line and word line contact portions BLC1, BLC2 and WLC1-WLC4 by IE etching with the (1) 1st contact pattern shown in FIGS. 25 and 28. Each trench is formed to be elongated over multiple contact portions.

Then, deposit and planarize 1st metal layer 203 such as W, and successively deposit 1st memory cell layer 204 for constituting cross-point cells. Memory cell layer 204 is, as described above, a lamination layer formed of something line a transition metal layer serving as variable resistance element and a polysilicon layer serving as diodes.

It is material that the insulating film 201 is resistant against the etching process for the interlayer insulating film used in the successive steps such as a spin coat film in accordance with spin on glass (SOG) method (referred to as a SOG film hereinafter). Therefore, for example, a CVD oxide film is used as the insulating film 201. The insulating film 201 is expected to serve as a stopper in the following SOG etching process.

A-A' sectional view shown in FIG. 33A and B-B' sectional view shown in FIG. 33B are the same as each other. In the following sectional views, the substrate 200 will be omitted excepting the bit line contact portions BLC1, BLC2 and word line contact portions WLC1-WLC4 are clearly shown.

Figure 34A:
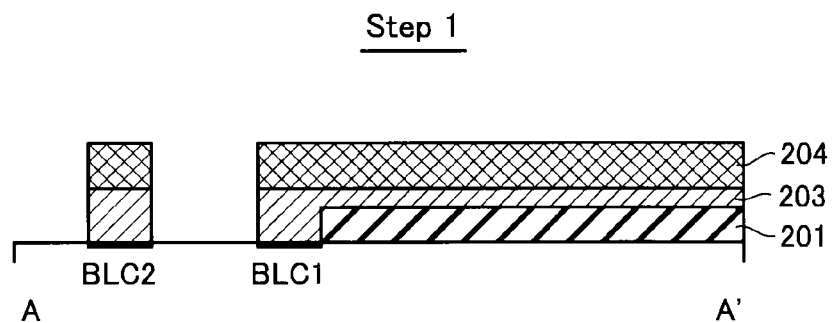
FIGS. 34A to 34C show A-A', B-B' and C-C' sectional views at step 1 in the embodiment.
Figure 34B:
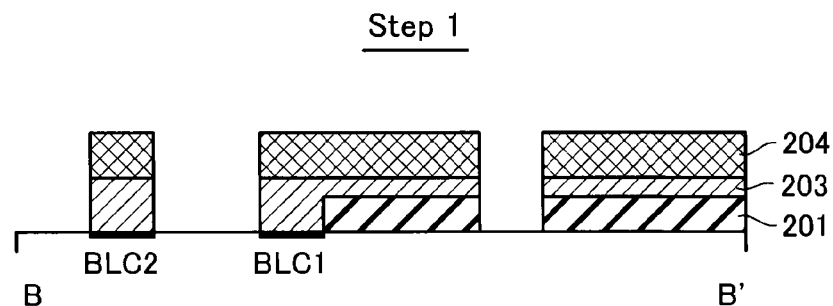
Figure 34C:
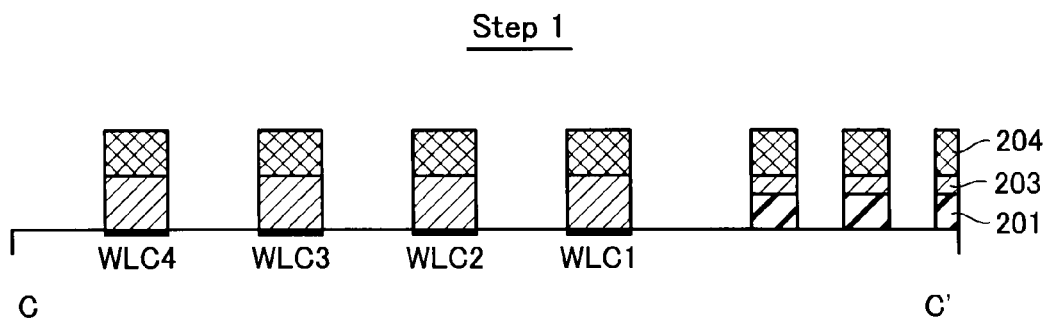

Step 1 (FIGS. 34A, 34B and 34C)

Pattern the 1st memory cell layer 204 and metal layer 203 to expose the surface of Si substrate by IE etching with the (2) 1st metal line pattern shown in FIGS. 25 and 28. As a result, 1st bit lines (BL), and BL and WL contact portions are patterned with memory cell layers 204 stacked. Although it is shown here as if the insulating layer 201 is perfectly removed, the insulating layer 201 may be remained as a stopper. However, it will be shown in the following drawings only such a case that insulating film 201 is perfectly removed.

Figure 35A:
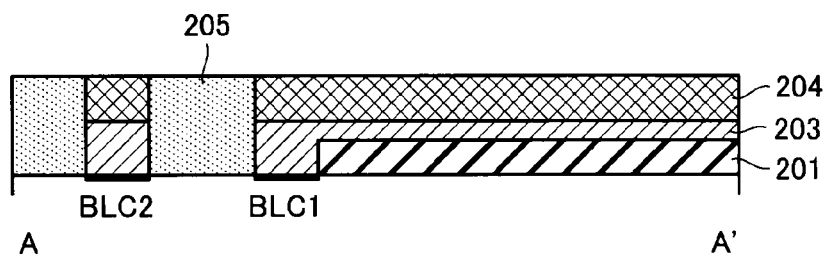
FIGS. 35A to 35C show A-A', B-B' and C-C' sectional views at step 2 in the embodiment.
Figure 35B:
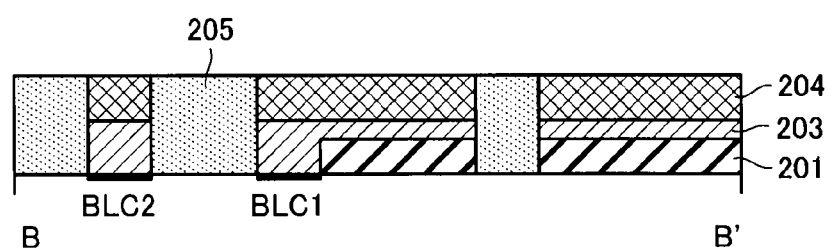
Figure 35C:
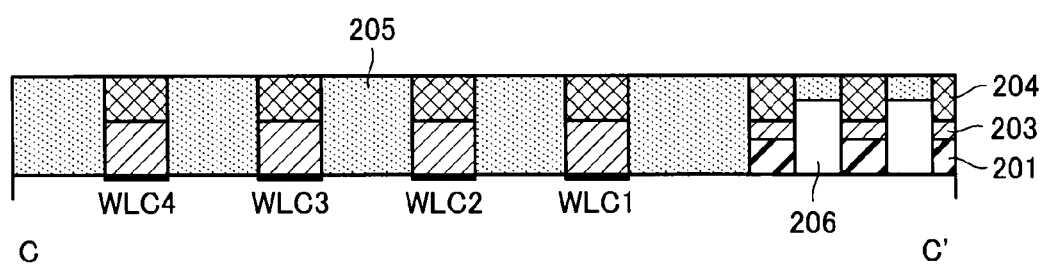

Step 2 (FIGS. 35A, 35B and 35C)

Coat SOG film 205 as the following interlayer insulating film to be buried in the resultant trench portions formed by the above-described etching. SOG film 205 is planarized by a CMP (Chemical Mechanical Polishing) process until when memory cell layers 204 are exposed.

In this step, large trenches formed around the cell array are sufficiently embedded with SOG film. However, there are small trenches between cells (i.e., between bit lines) within the cell array area, which are not buried sufficiently, and voids or hollows 206 are formed therein. These voids 206 formed between cells and between bit lines serve for reducing thermal or electric influences between cells and lines.

Figure 36A:
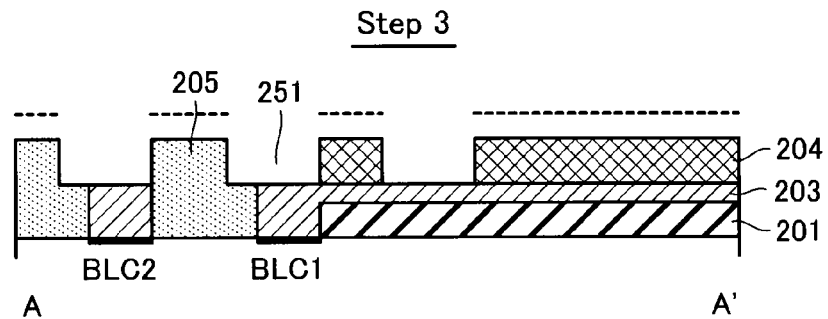
FIGS. 36A to 36C show A-A', B-B' and C-C' sectional views at step 3 in the embodiment.
Figure 36B:
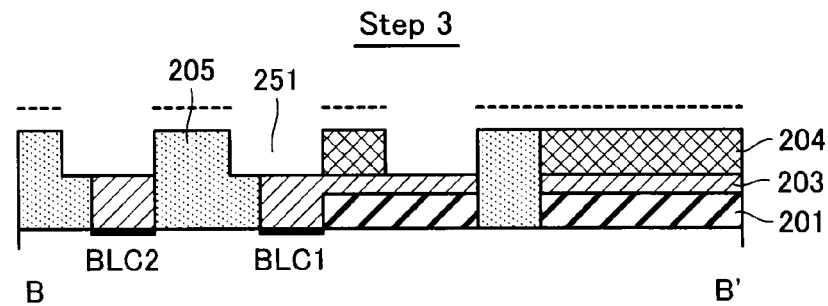
Figure 36C:
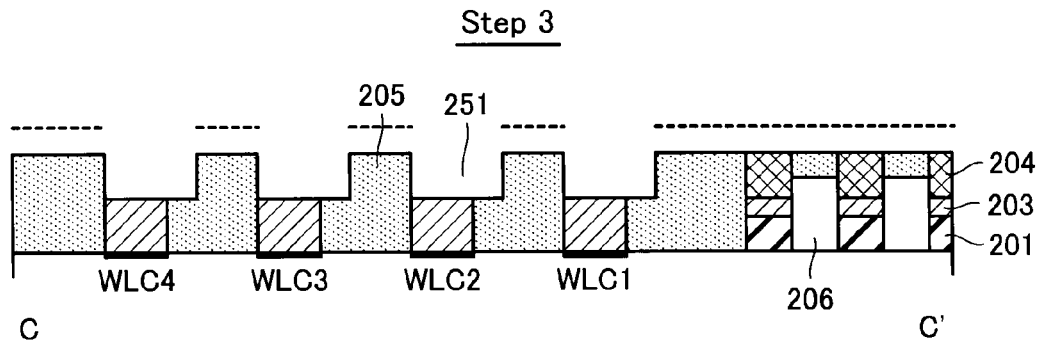

Step 3 (FIGS. 36A, 36B and 36C)

Following the step 2, etch the resultant surface to expose the 1st metal line layer 203 with the (3) 2nd contact trench pattern shown in FIGS. 25 and 28. As a result, stripe-shaped contact trenches 251 are formed at the contact portions of BLC1, BLC2 and WLC1-WLC4 in place of the conventional contact holes. Each contact trench is elongated over multiple contact portions. The width of the trenches 251 is wider than that of the contact trenches 202. Dotted lines in FIGS. 36A, 36B and 36C designate the mask-set position.

Figure 37A:
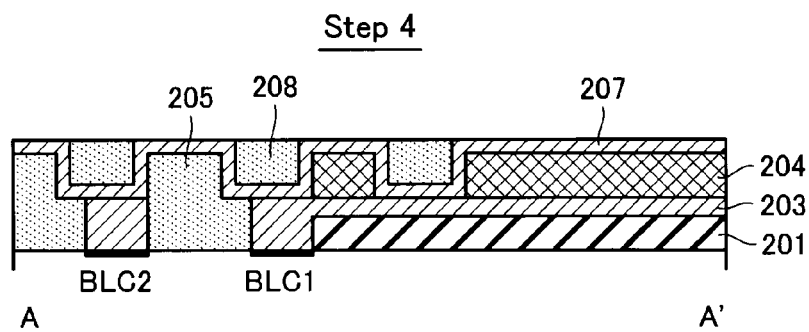
FIGS. 37A to 37C show A-A', B-B' and C-C' sectional views at step 4 in the embodiment.
Figure 37B:
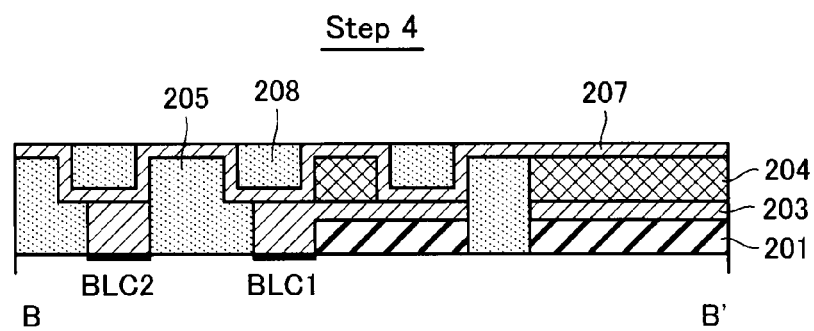
Figure 37C:
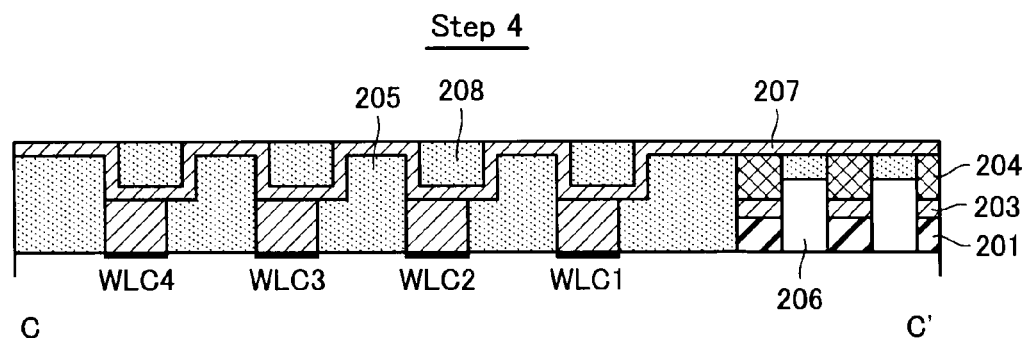

Step 4 (FIGS. 37A, 37B and 37C)

Deposit 2nd metal layer 207 about uniformly on the surface of the cell array and on the surface of the contact trenches (i.e., bottom and side wall thereof) 251, and then bury SOG film 208 in the resultant trenches. SOG film 208 is planarized, so that the metal layer 207 on the cell array area is exposed.

Figure 38A:
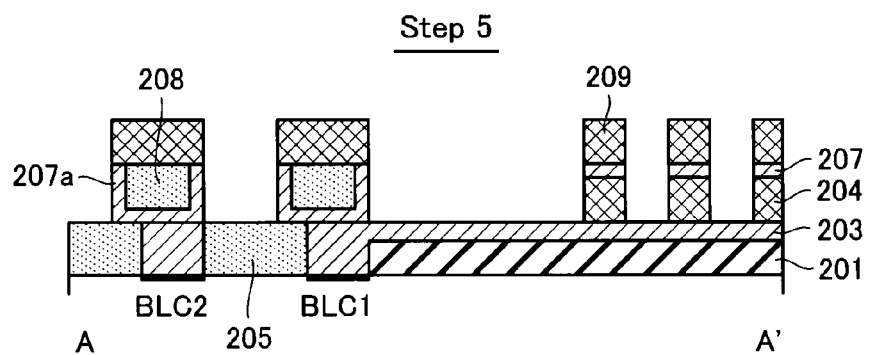
FIGS. 38A to 38C show A-A', B-B' and C-C' sectional views at step 5 in the embodiment.
Figure 38B:
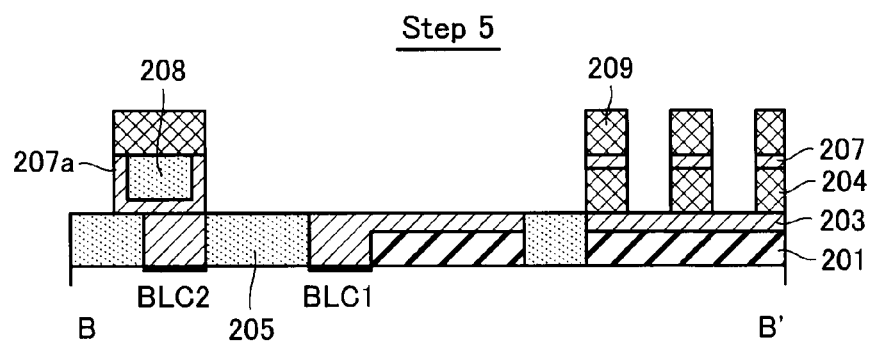
Figure 38C:
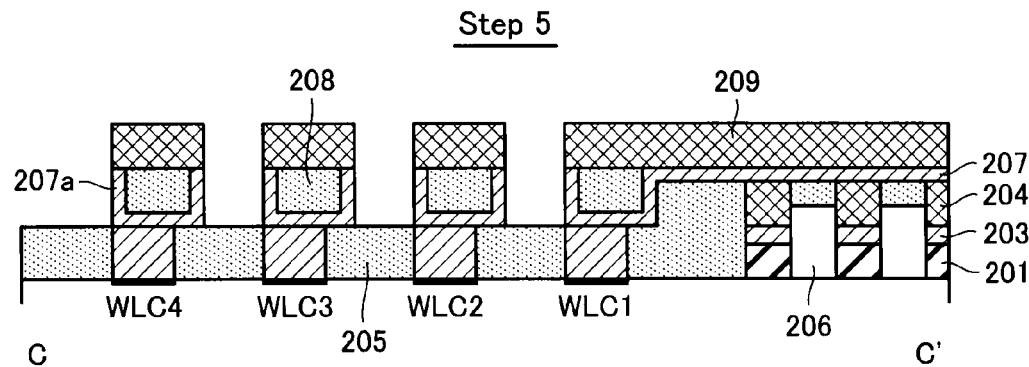

Step 5 (FIGS. 38A, 38B and 38C)

Deposit 2nd memory cell layer 209 on the resultant surface, and etch the memory cell layer 209, 2nd metal layer 207 and 1st memory cell layer 204 by IE etching with the (4) 2nd metal line pattern shown in FIGS. 25 and 28. As a result, 1st word lines WL and the respective contact portions are patterned with the memory cell layers 209 stacked. In the cell array area, 1st memory cell layers 204 are remained only at the respective cross-points of word lines WL and bit lines BL as independent cells.

In this step, SOG film supplied for the surface, on which the metal layer 207 is deposited, is removed and spaces appear between cells. However, memory cell layers are not stacked on these space areas. Therefore, the influence of the etching appears on the insulating film 201 if it is remained on the substrate. This is because that the insulating film 201 is formed as an etching-resistant film. In the drawings, however, it is assumed that the insulating film 201 is perfectly removed excepting the cell array area.

Metal layer 207 formed in each stripe-shaped contact trench 251 is patterned as multiple concave metal pieces 207a, which are dispersedly arranged in the elongated direction in the trench 251. These metal pieces 207a will be stacked at the contact portions and constitute the respective vertical wirings.

Figure 39A:
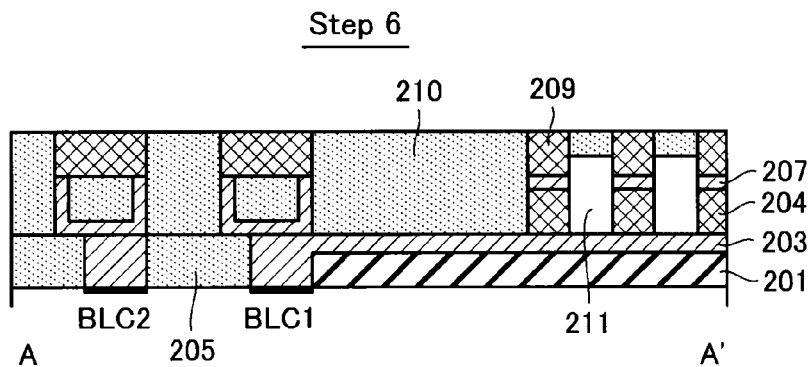
FIGS. 39A to 39C show A-A', B-B' and C-C' sectional views at step 6 in the embodiment.
Figure 39B:
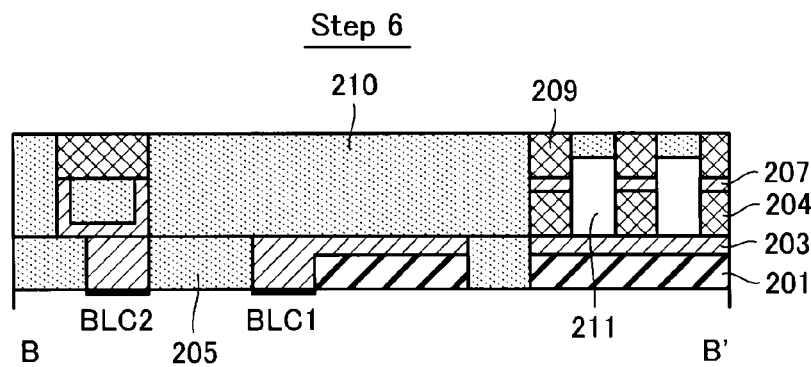
Figure 39C:
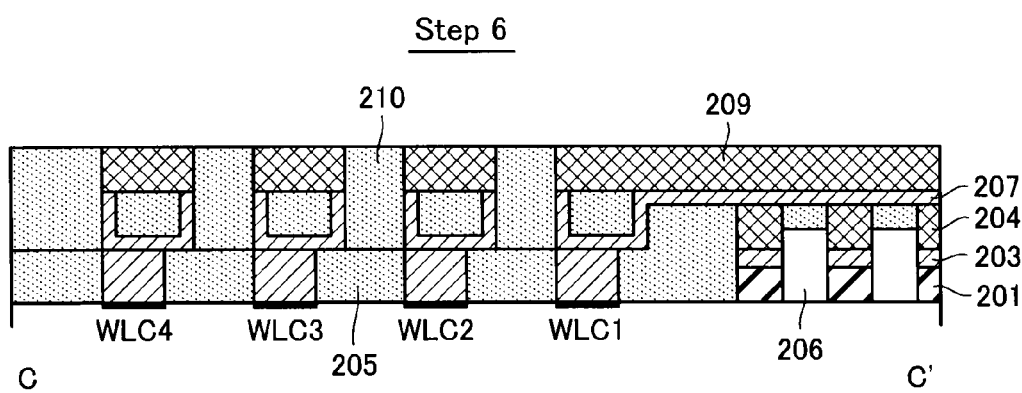

Step 6 (FIGS. 39A, 39B and 39C)

Deposit SOG film 210 on the resultant surface and planarize it to expose the memory cell layer 209. In this step, there are formed voids 211 between word lines in the cell array area, which serve for reducing the thermal and electric influences between cells.

Figure 40A:
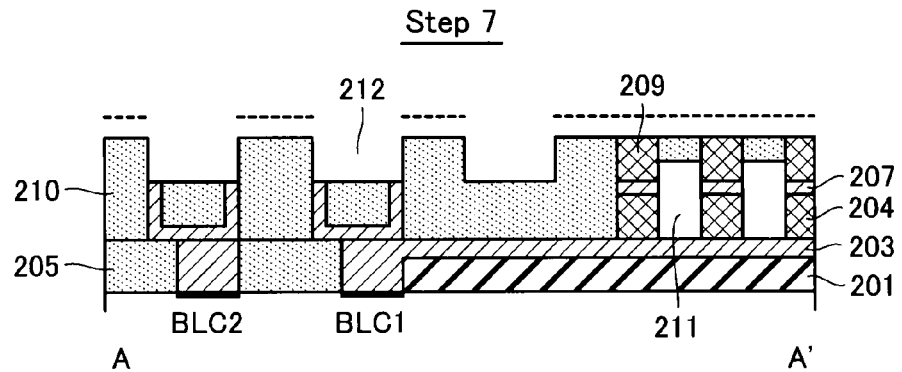
FIGS. 40A to 40C show A-A', B-B' and C-C' sectional views at step 7 in the embodiment.
Figure 40B:
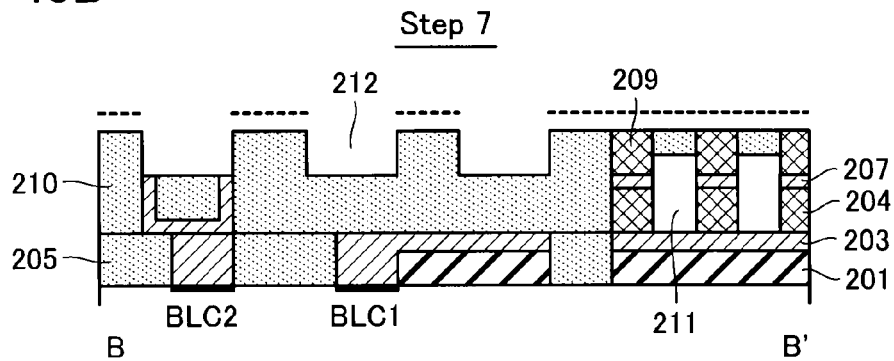
Figure 40C:
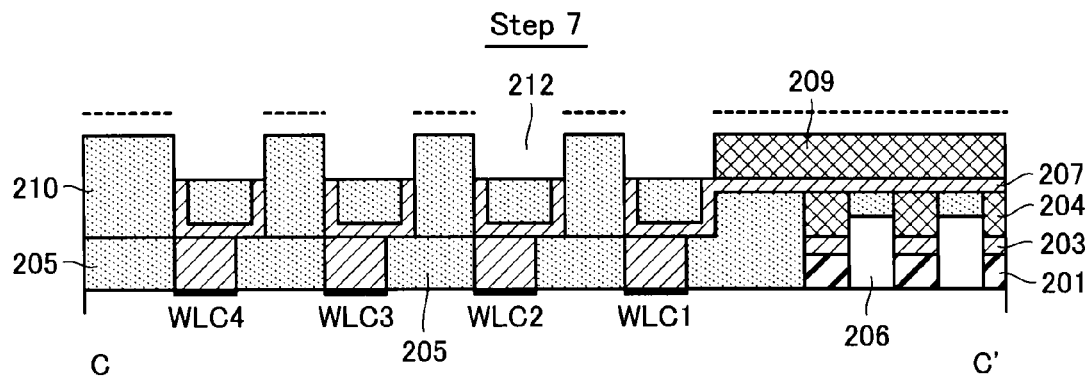

Step 7 (FIGS. 40A, 40B and 40C)

Following the step 6, etch the resultant surface to expose the 2nd metal layer 207 with the (3) 2nd contact trench pattern shown in FIGS. 25 and 28. As a result, stripe-shaped contact trenches 212 are formed at the contact portions BLC1, BLC2 and WLC1-WLC4 and extended over multiple contact portions.

Figure 41A:
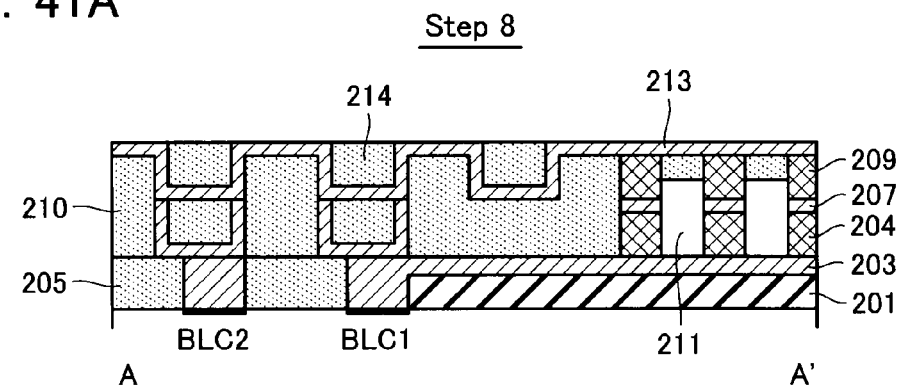
FIGS. 41A to 41C show A-A', B-B' and C-C' sectional views at step 8 in the embodiment.
Figure 41B:
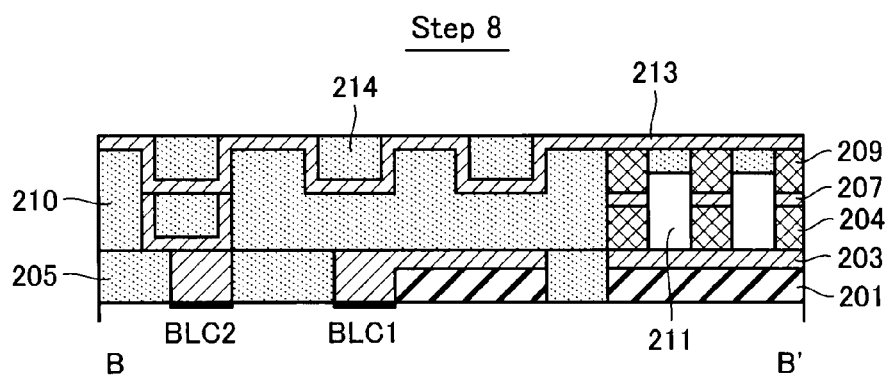
Figure 41C:
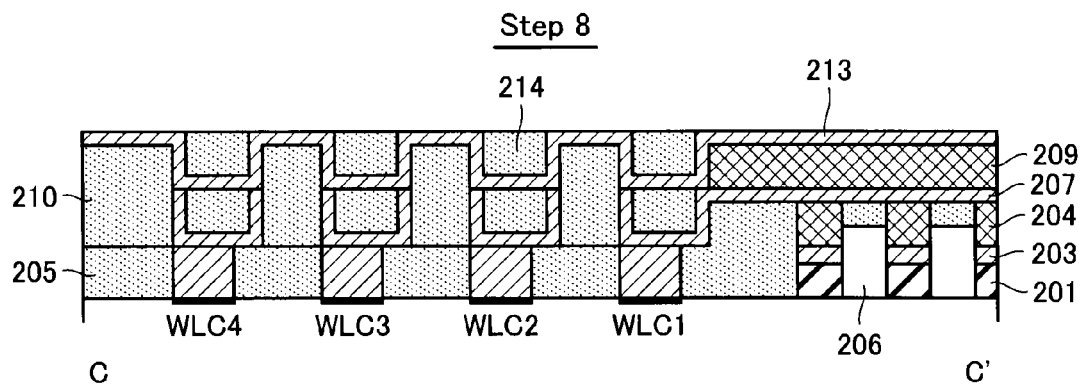

Step 8 (FIGS. 41A, 41B and 41C)

Deposit 3rd metal layer 213 about uniformly on the surface of the cell array and on the surface of the contact trench (i.e., bottom and side wall) 212, and then bury SOG film 214 in the resultant trenches. SOG film 214 is planarized, so that the metal layer 213 on the cell array area is exposed.

Figure 42A:
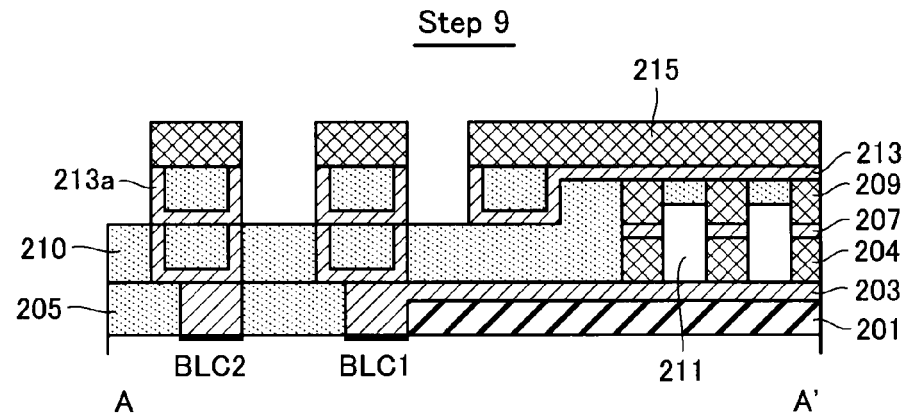
FIGS. 42A to 42C show A-A', B-B' and C-C' sectional views at step 9 in the embodiment.
Figure 42B:
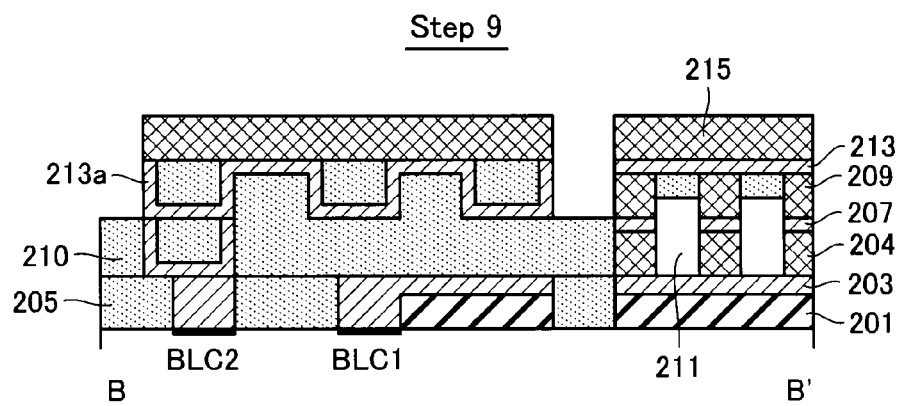
Figure 42C:
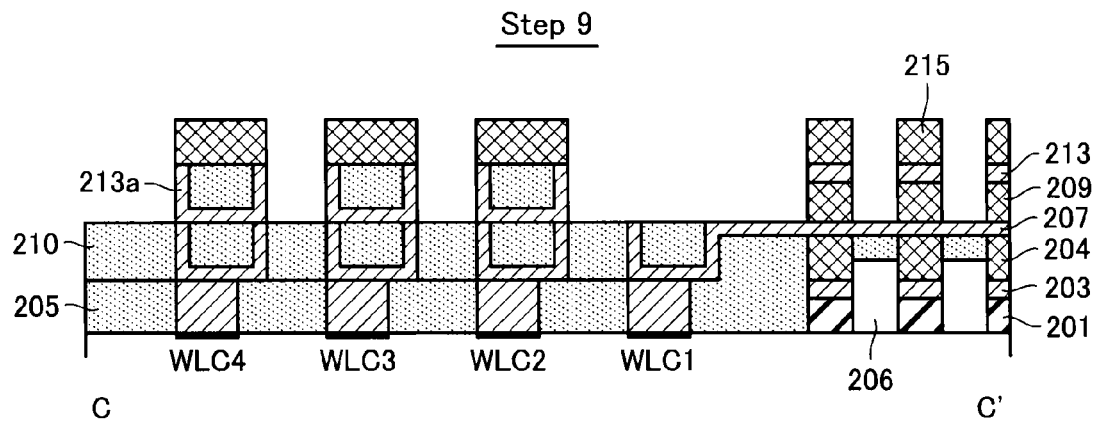

Step 9 (FIGS. 42A, 42B and 42C)

Figure 26:
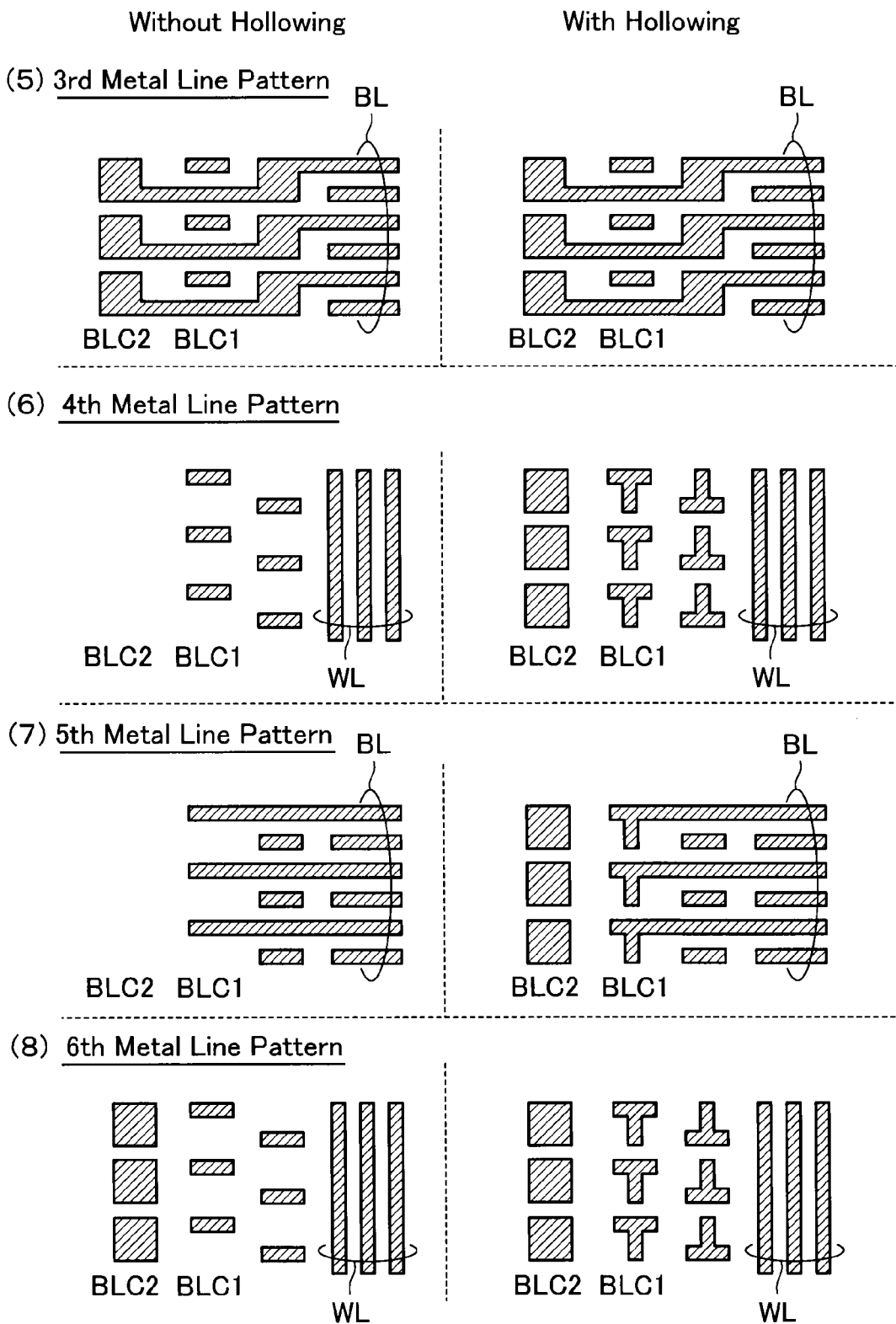
FIG. 26 shows metal line patterns at bit line drawing portion (part-2) in accordance with the embodiment.

Deposit 3rd memory cell layer 215 on the surface of the metal layer 213, and etch the memory cell layer 215, 3rd metal layer 213 and memory cell layer 209 until when 2nd metal layer 207 is exposed by IE etching with the (5) 3rd metal line pattern shown in FIGS. 26 and 29. As a result, metal layer 213 is patterned together with memory cell layer 215 to become bit lines, and memory cell layer 209 is remained as cross-point cells between bit lines and underlying word lines. Further, in this step, 2nd concave metal pieces 213a patterned from metal layer 213 are stacked on the underlying metal pieces at the respective vertical wiring portions.

Figure 43A:
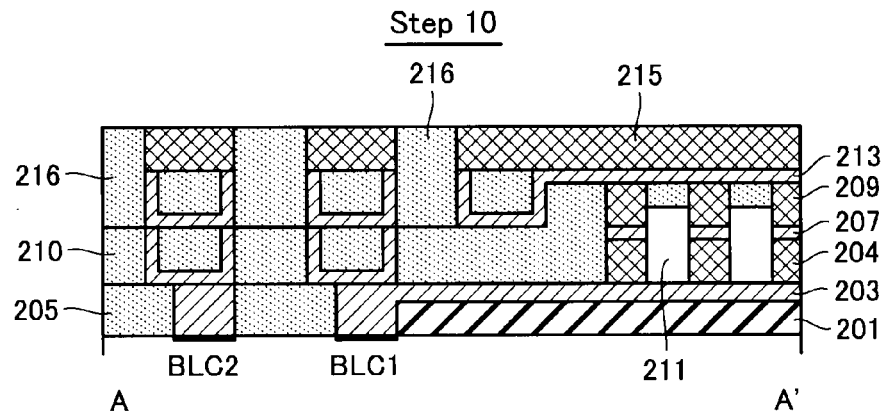
FIGS. 43A to 43C show A-A', B-B' and C-C' sectional views at step 10 in the embodiment.
Figure 43B:
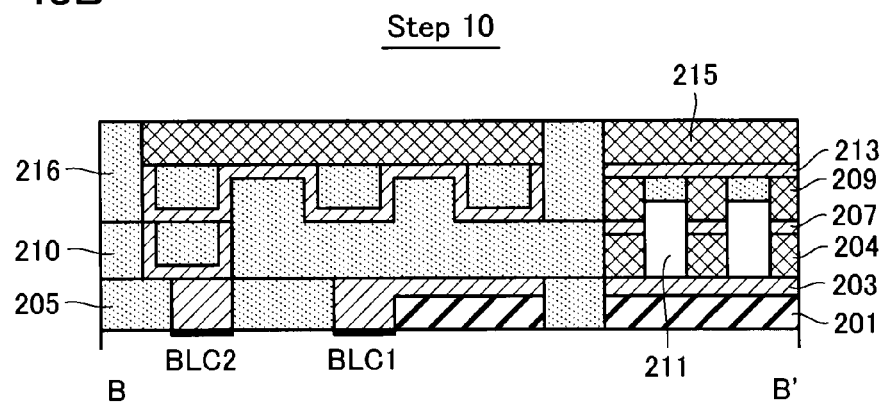
Figure 43C:
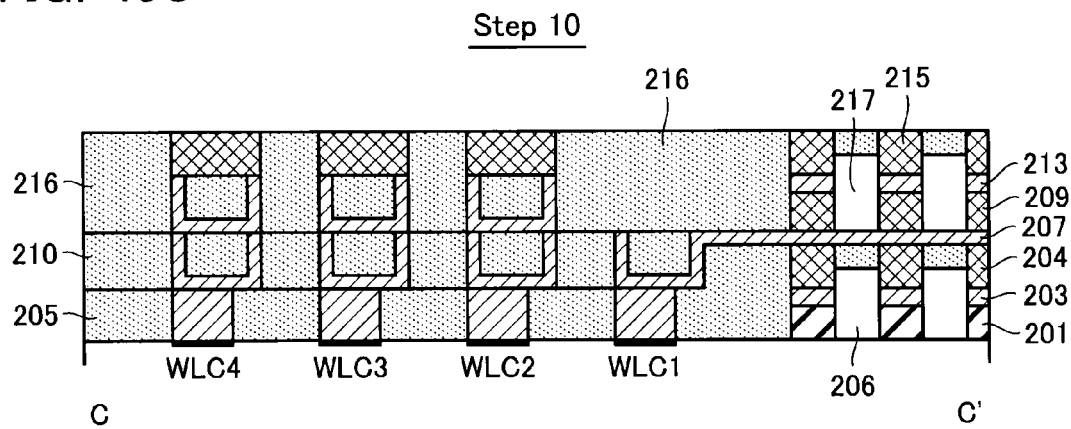

Step 10 (FIGS. 43A, 43B and 43C)

Deposit SOG film 216 on the resultant surface and planarize it to expose the memory cell layer 215. In this step, there are formed voids 217 between word lines in the cell array area (see C-C' sectional view shown in FIG. 43C).

Figure 44A:
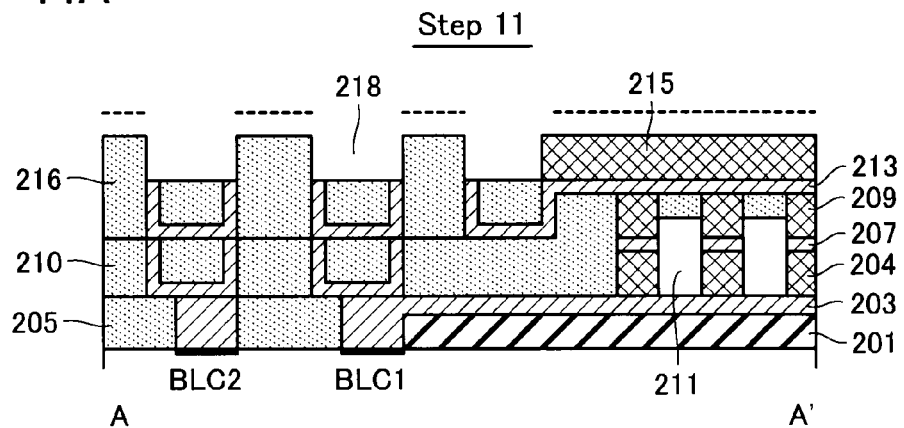
FIGS. 44A to 44C show A-A', B-B' and C-C' sectional views at step 11 in the embodiment.
Figure 44B:
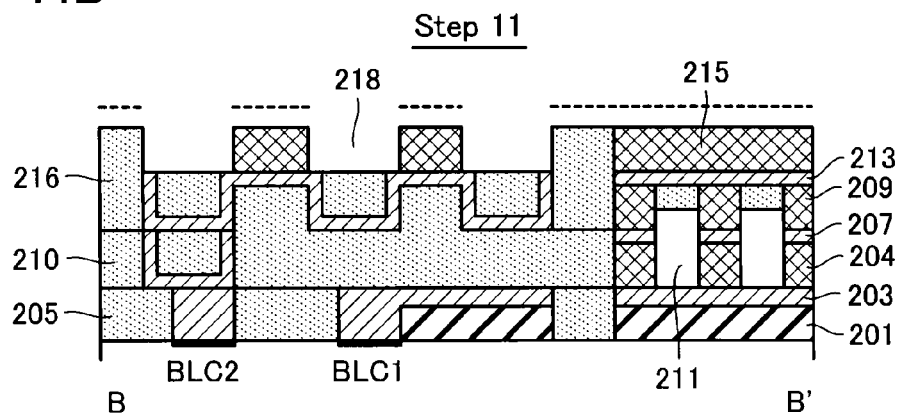
Figure 44C:
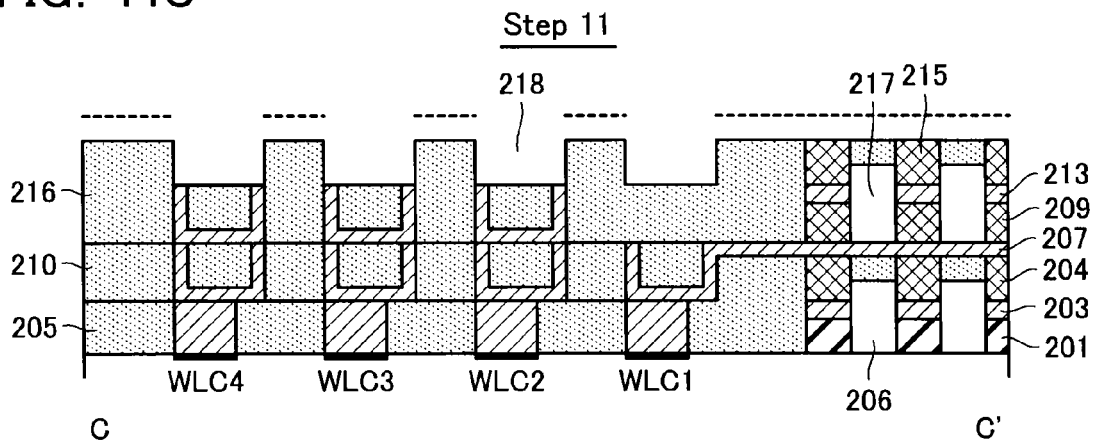

Step 11 (FIGS. 44A, 44B and 44C)

Following the step 10, etch the resultant surface to expose the 3rd metal layer 213 with the (3) 2nd contact trench pattern shown in FIGS. 25 and 28. As a result, stripe-shaped trenches 218 are formed at the contact portions BLC1, BLC2 and WLC1-WLC4.

Figure 45A:
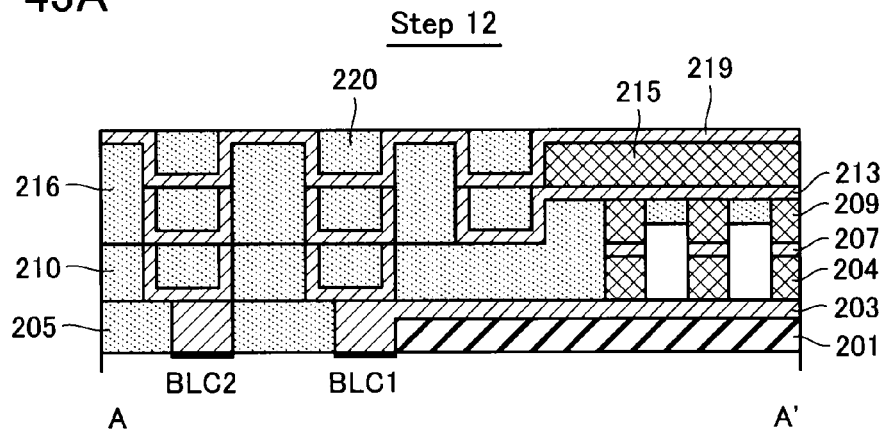
FIGS. 45A to 45C show A-A', B-B' and C-C' sectional views at step 12 in the embodiment.
Figure 45B:
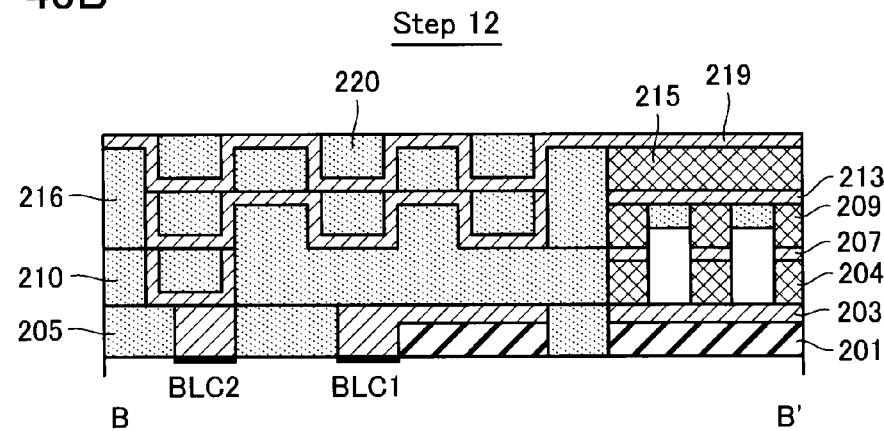
Figure 45C:
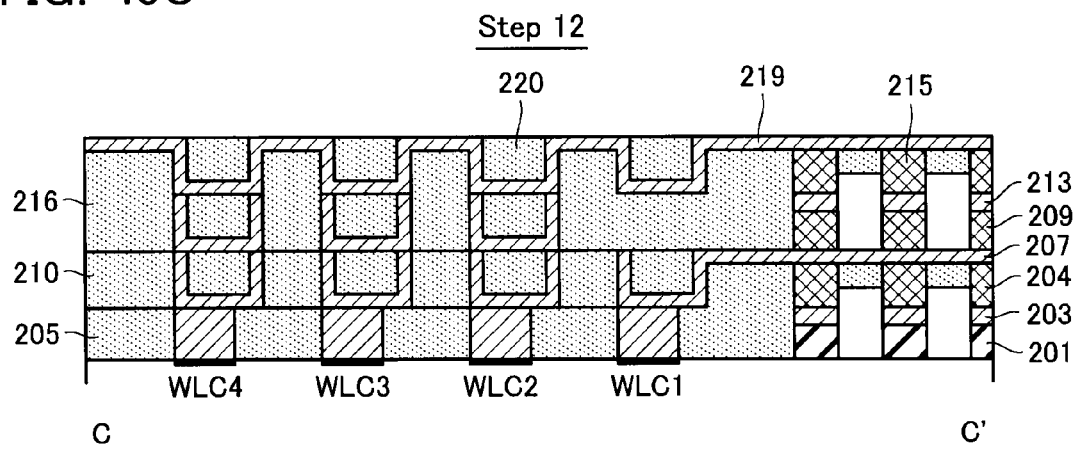

Step 12 (FIGS. 45A, 45B and 45C)

Deposit 4th metal layer 219 about uniformly on the surface of the cell array and on the surface of the contact trench (i.e., bottom and side wall) 218, and then bury SOG film 220 in the resultant trenches. SOG film 220 is planarized, whereby the metal layer 219 is exposed.

Figure 46A:
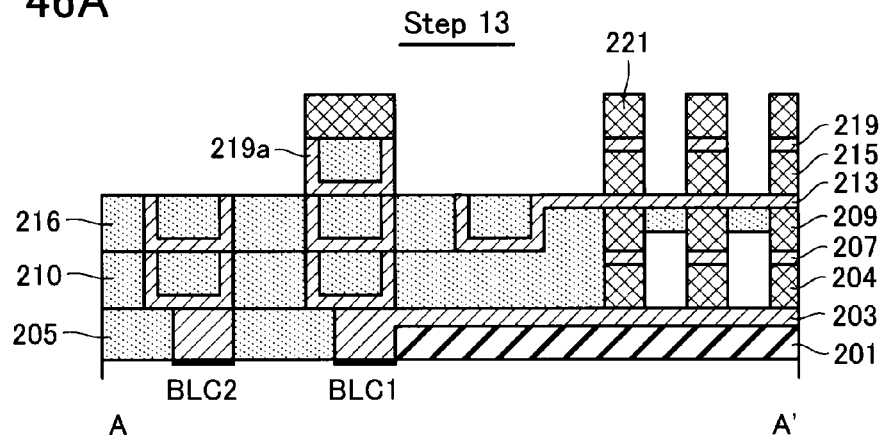
FIGS. 46A to 46C show A-A', B-B' and C-C' sectional views at step 13 in the embodiment.
Figure 46B:
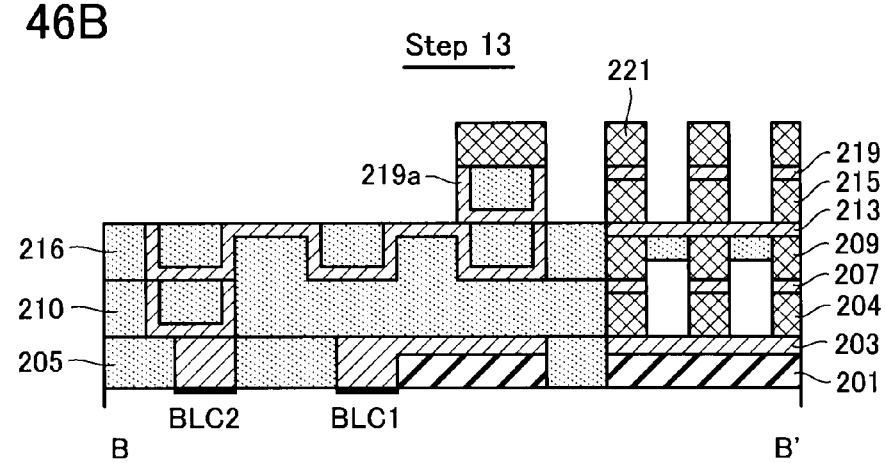
Figure 46C:
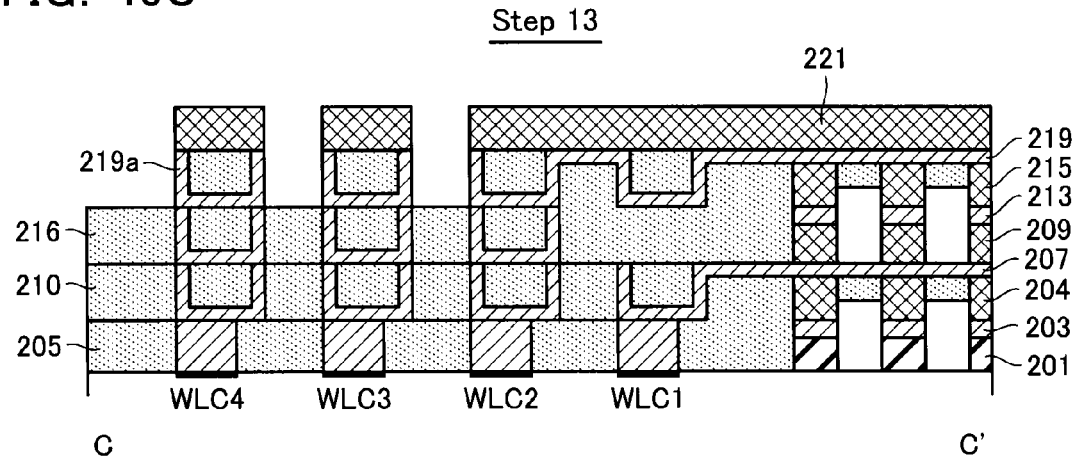

Step 13 (FIGS. 46A, 46B and 46C)

Deposit 4th memory cell layer 221 on the surface of the metal layer 219, and etch the memory cell layer 221, 4th metal layer 219 and memory cell layer 215 until when 3rd metal layer 213 is exposed by IE etching with the (6) 4th metal line pattern shown in FIGS. 26 and 29. In this step, 3rd concave metal pieces 219a patterned from metal layer 219 are stacked on the underlying metal pieces at the respective vertical wiring portions.

Figure 47A:
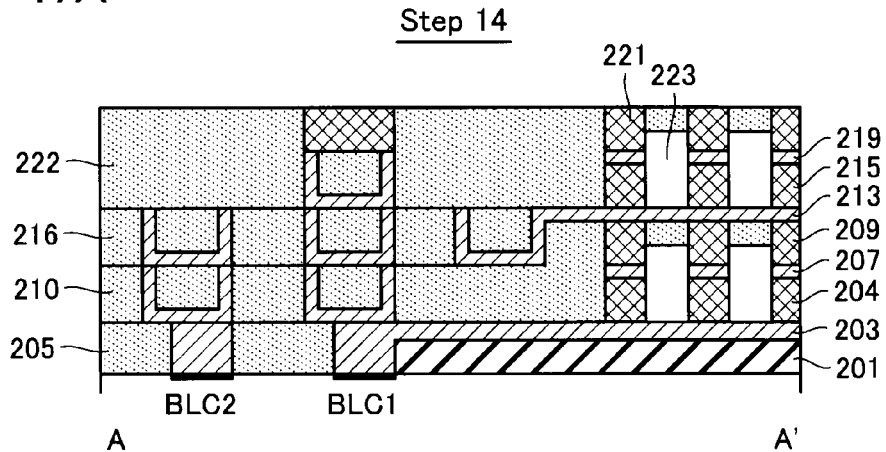
FIGS. 47A to 47C show A-A', B-B' and C-C' sectional views at step 14 in the embodiment.
Figure 47B:
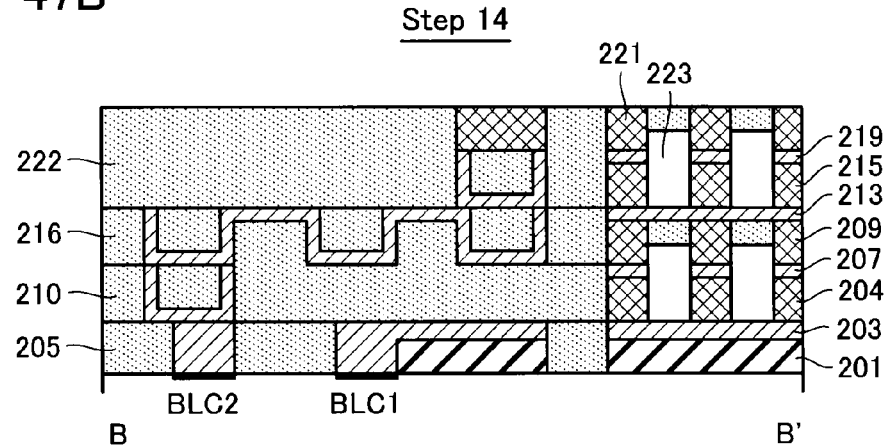
Figure 47C:
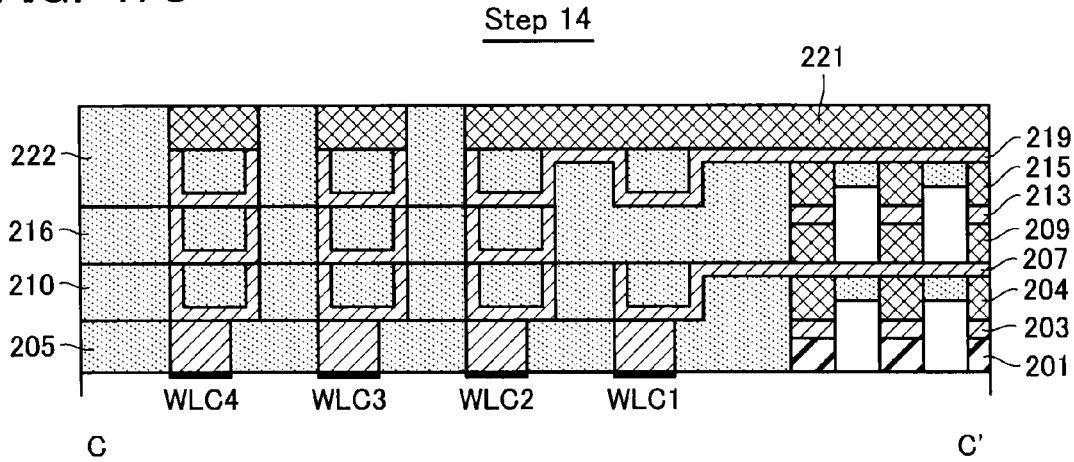

Step 14 (FIGS. 47A, 47B and 47C)

Deposit SOG film 222 on the resultant surface and planarize it to expose the memory cell layer 221. In this step, there are formed voids 223 between cells (see A-A' and B-B' sectional views shown in FIGS. 47A and 47B).

Figure 48A:
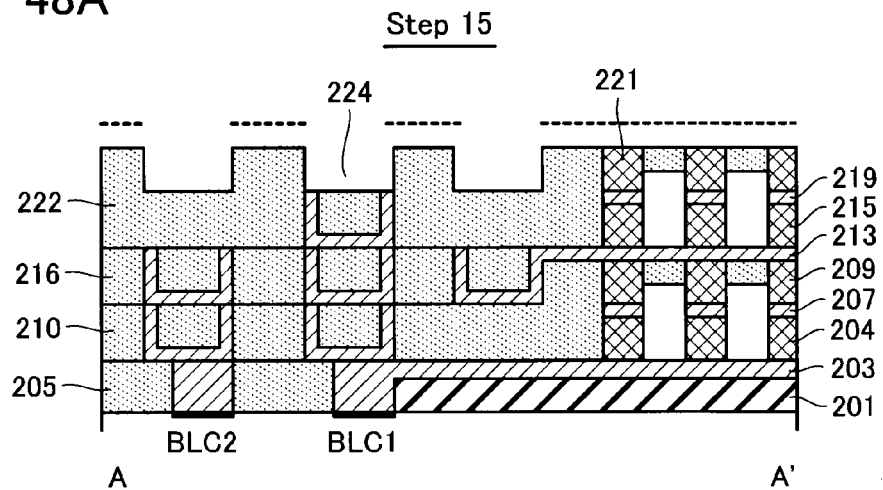
FIGS. 48A to 48C show A-A', B-B' and C-C' sectional views at step 15 in the embodiment.
Figure 48B:
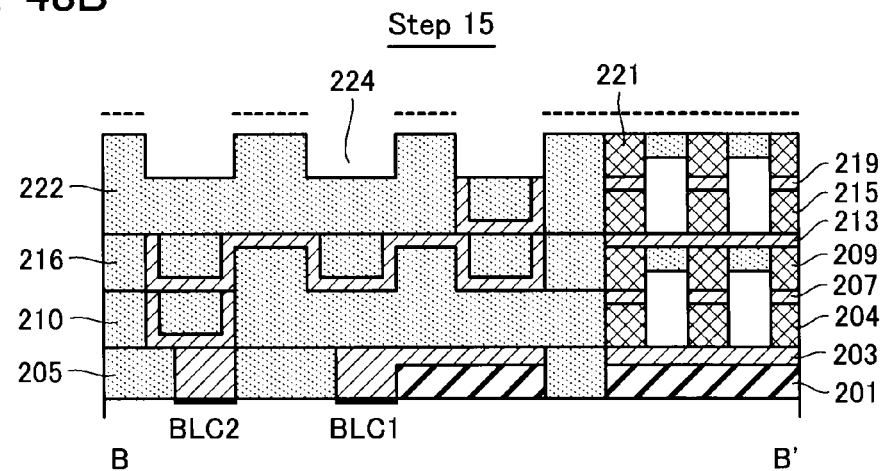
Figure 48C:
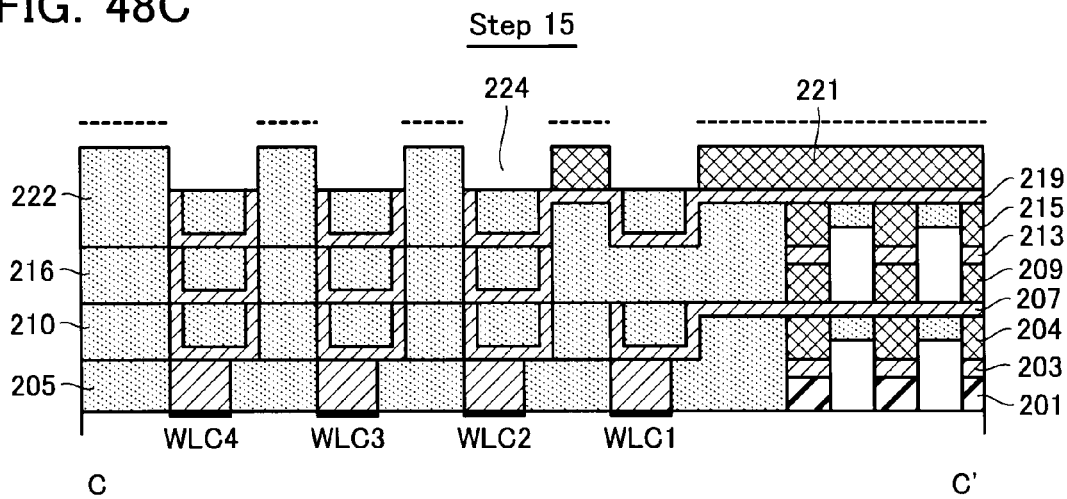

Step 15 (FIGS. 48A, 48B and 48C)

Following the step 14, etch the resultant surface to expose the 4th metal layer 219 with the (3) 2nd contact trench pattern shown in FIGS. 25 and 28. As a result, stripe-shaped contact trenches 224 are formed at the contact portions BLC1, BLC2 and WLC1-WLC4.

Figure 49A:
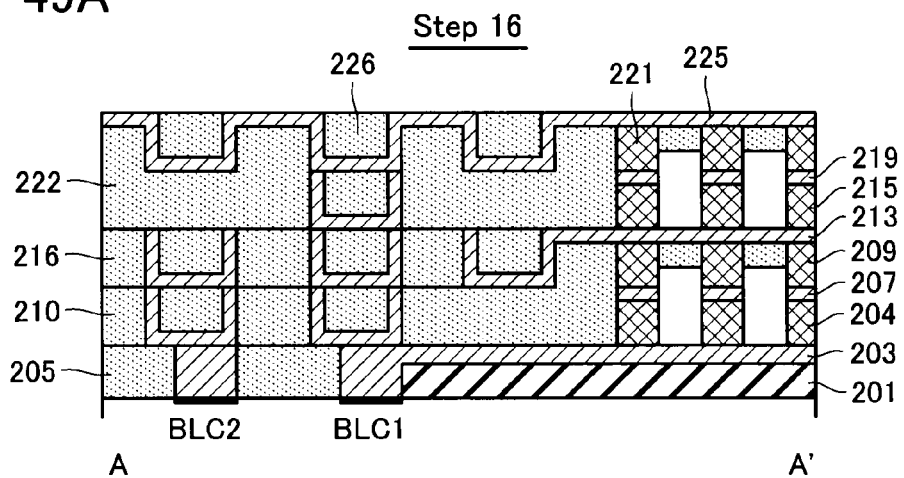
FIGS. 49A to 49C show A-A', B-B' and C-C' sectional views at step 16 in the embodiment.
Figure 49B:
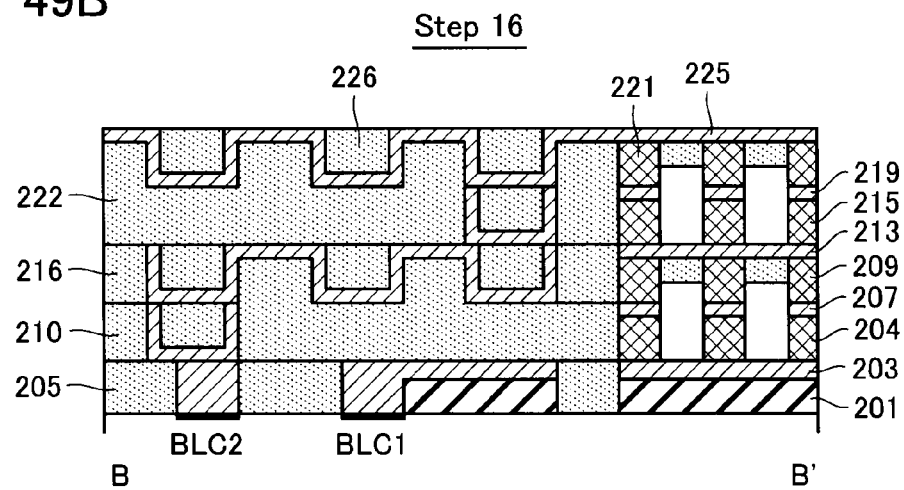
Figure 49C:
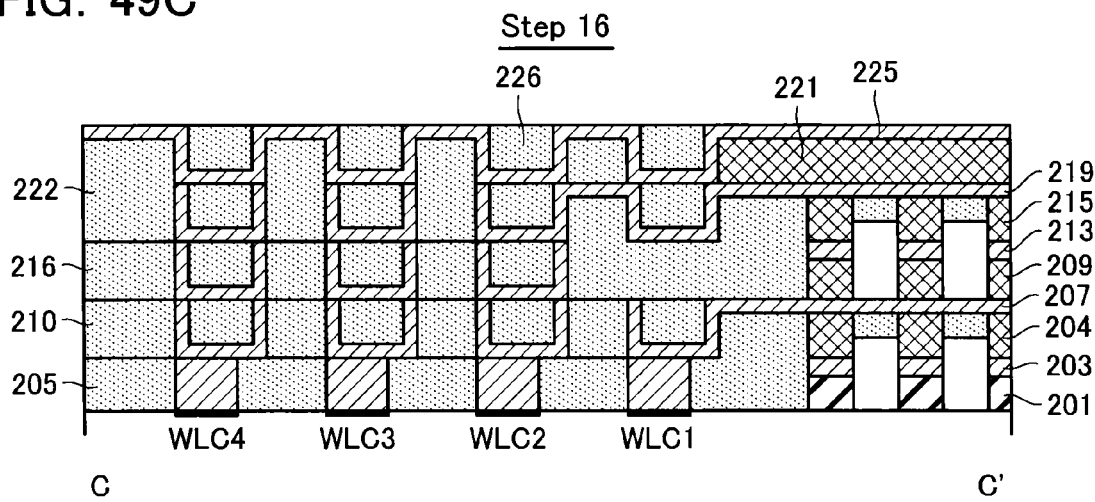

Step 16 (FIGS. 49A, 49B and 49C)

Deposit 5th metal layer 225 about uniformly on the surface of the cell array and on the surface of the contact trench (i.e., bottom and side wall) 224, and then bury SOG film 226 in the resultant trenches. SOG film 226 is planarized, whereby the metal layer 225 is exposed.

Figure 50A:
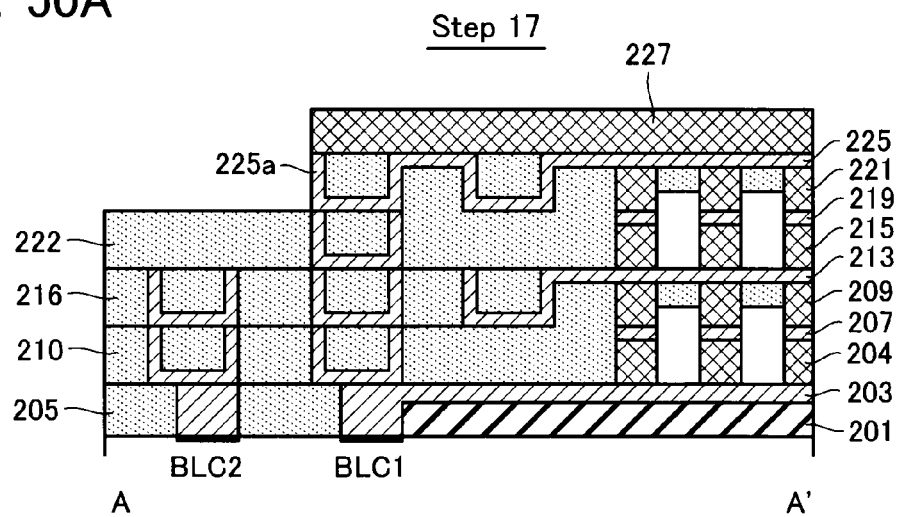
FIGS. 50A to 50C show A-A', B-B' and C-C' sectional views at step 17 in the embodiment.
Figure 50B:
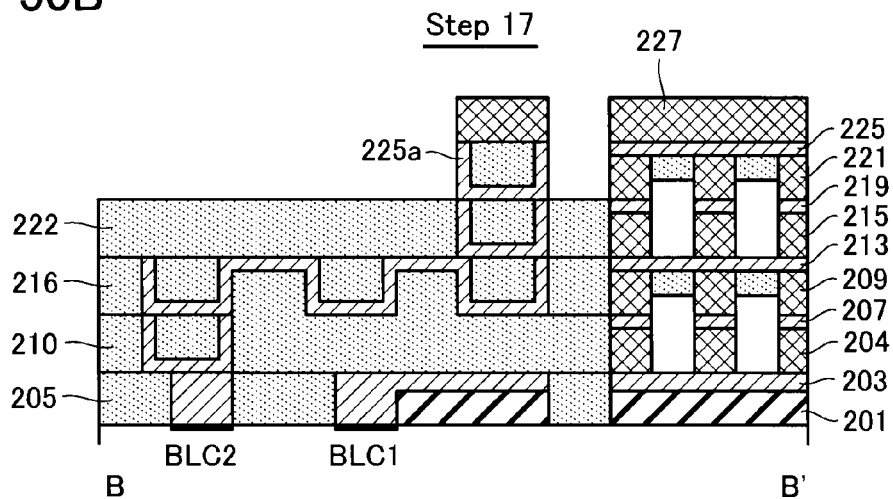
Figure 50C:
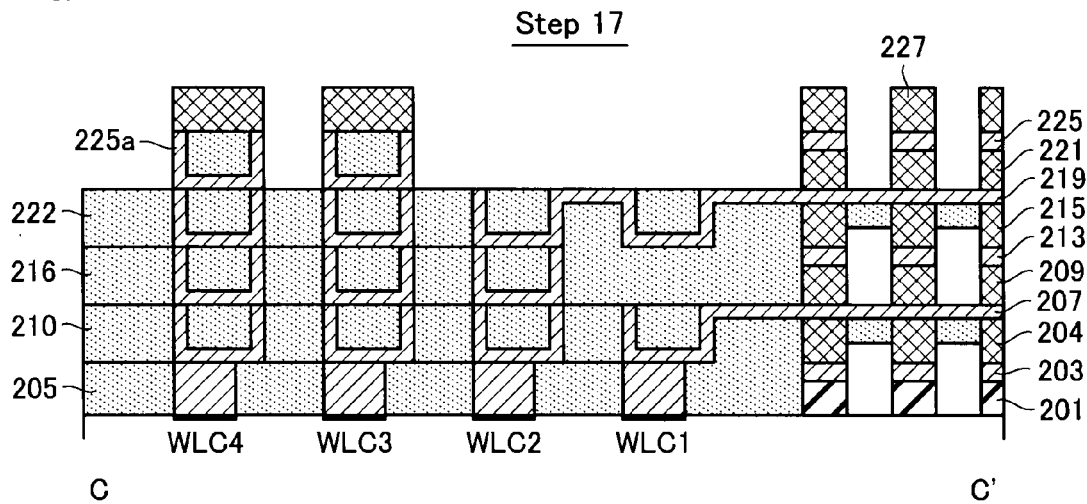

Step 17 (FIGS. 50A, 50B and 50C)

Deposit 5th memory cell layer 227 on the surface of the metal layer 225, and etch the memory cell layer 227, metal layer 225 and memory cell layer 221 until when 4th metal layer 219 is exposed by IE etching with the (7) 5th metal line pattern shown in FIGS. 26 and 29. In this step, 4th concave metal pieces 225a patterned from metal layer 225 are stacked on the underlying metal pieces at the respective vertical wiring portions.

Figure 51A:
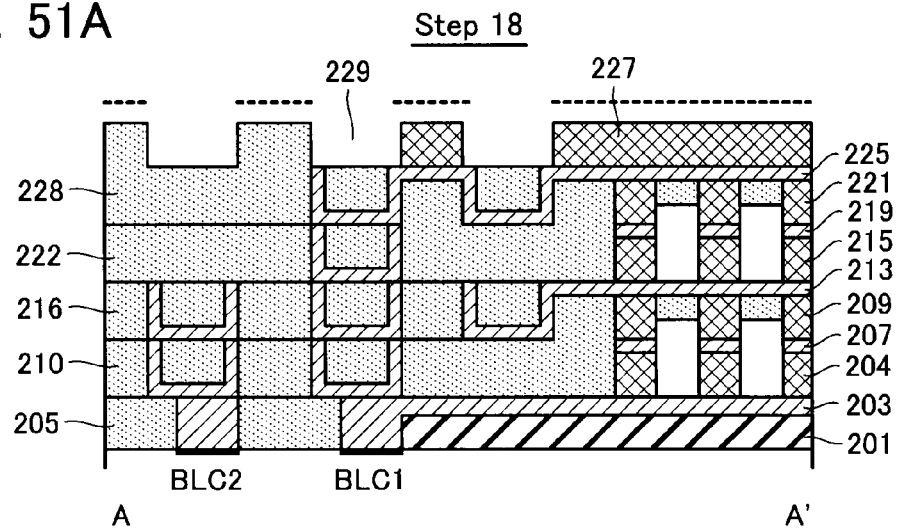
FIGS. 51A to 51C show A-A', B-B' and C-C' sectional views at step 18 in the embodiment.
Figure 51B:
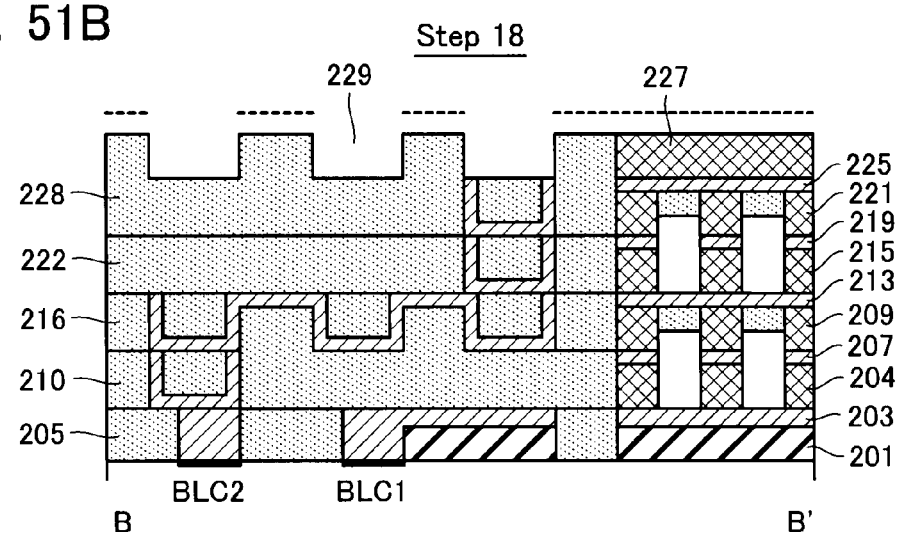
Figure 51C:
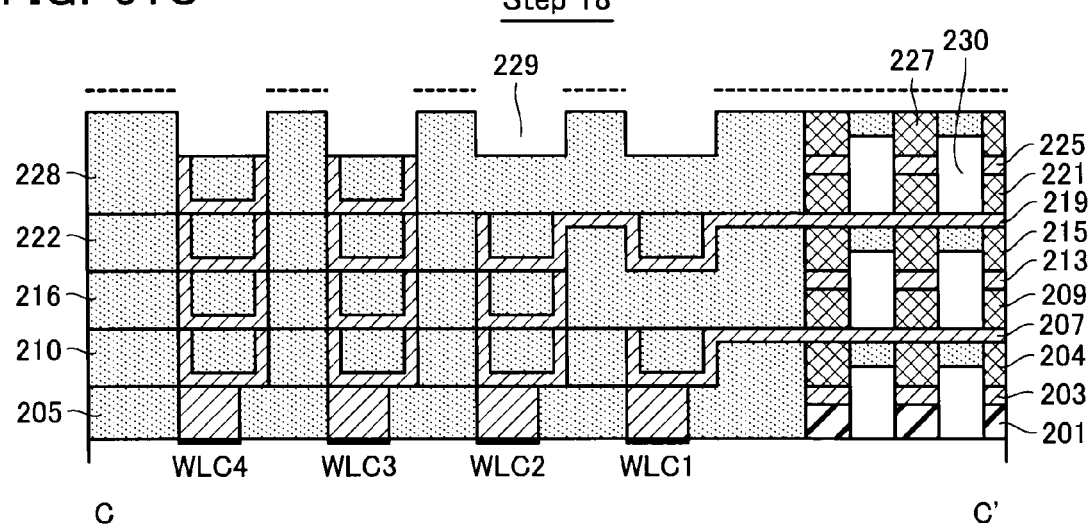

Step 18 (FIGS. 51A, 51B and 51C)

Following step 17, deposit SOG film 228 on the resultant surface and planarize it, and then etch SOG film 228 to expose the 5th metal layer by IE etching with the (3) 2nd contact trench pattern shown in FIGS. 25 and 28. As a result, stripe-shaped contact trenches 229 are formed at the contact portions BLC1, BLC2 and WLC1-WLC4.

Figure 52A:
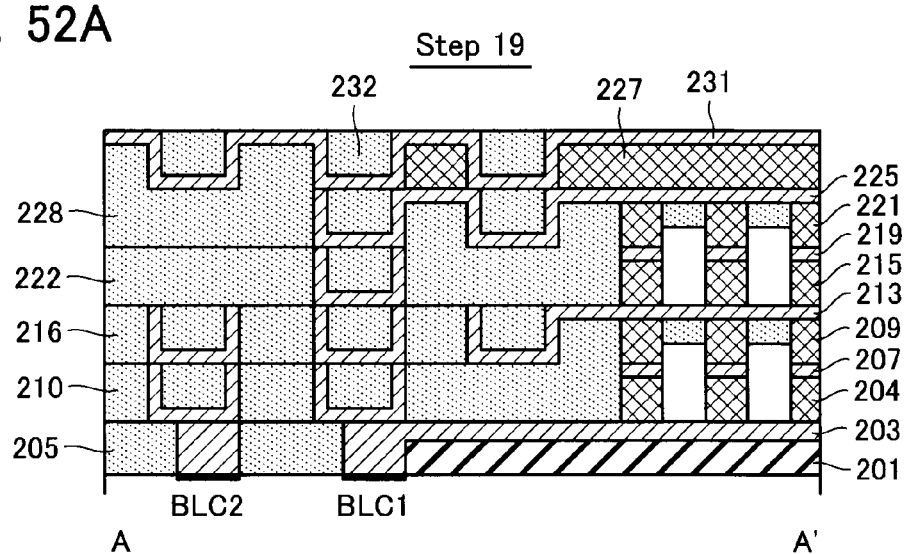
FIGS. 52A to 52C show A-A', B-B' and C-C' sectional views at step 19 in the embodiment.
Figure 52B:
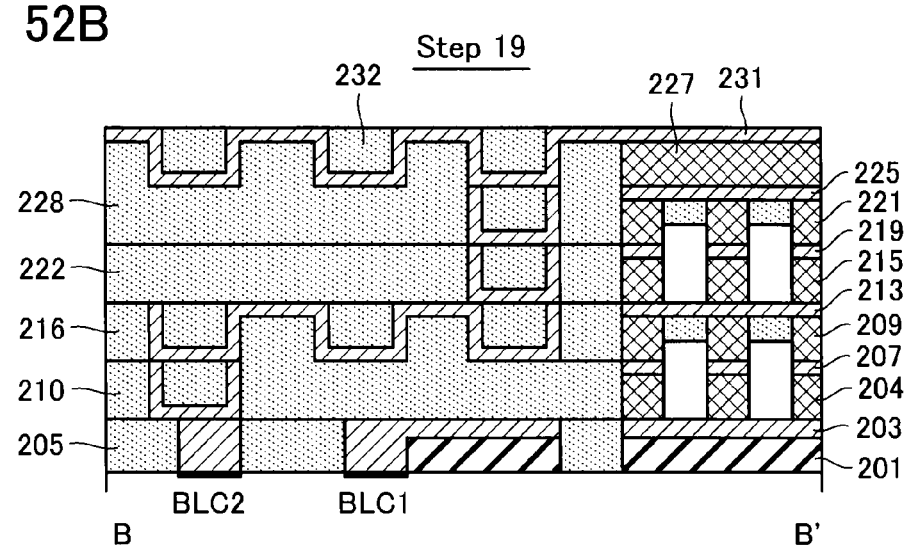
Figure 52C:
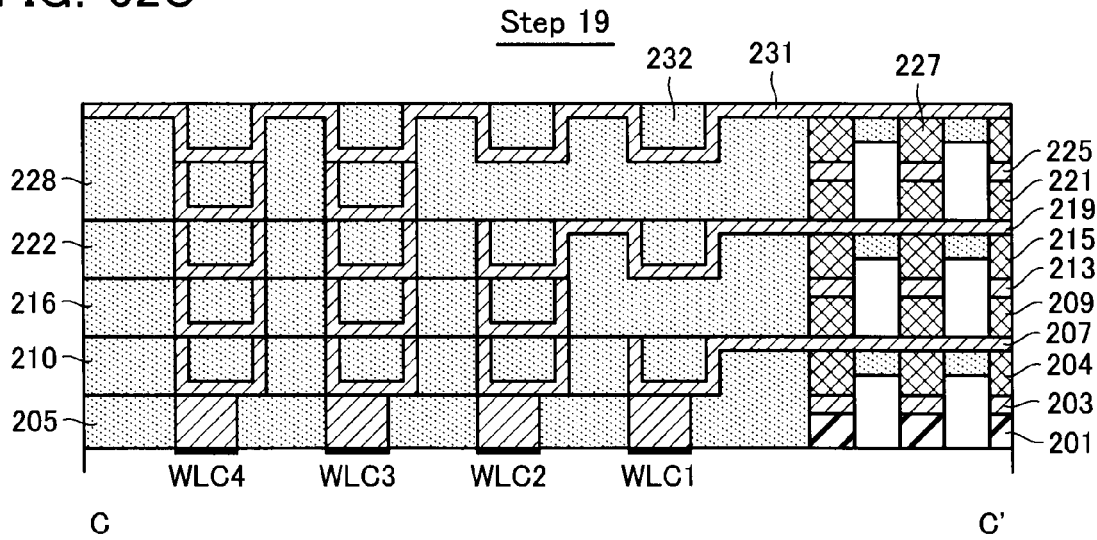

Step 19 (FIGS. 52A, 52B and 52C)

Deposit 6th metal layer 231 about uniformly on the surface of the cell array and on the surface of the contact trench (i.e., bottom and side wall) 229, and then bury SOG film 232 in the resultant trenches. SOG film 232 is planarized, whereby the metal layer 231 is exposed.

Figure 53A:
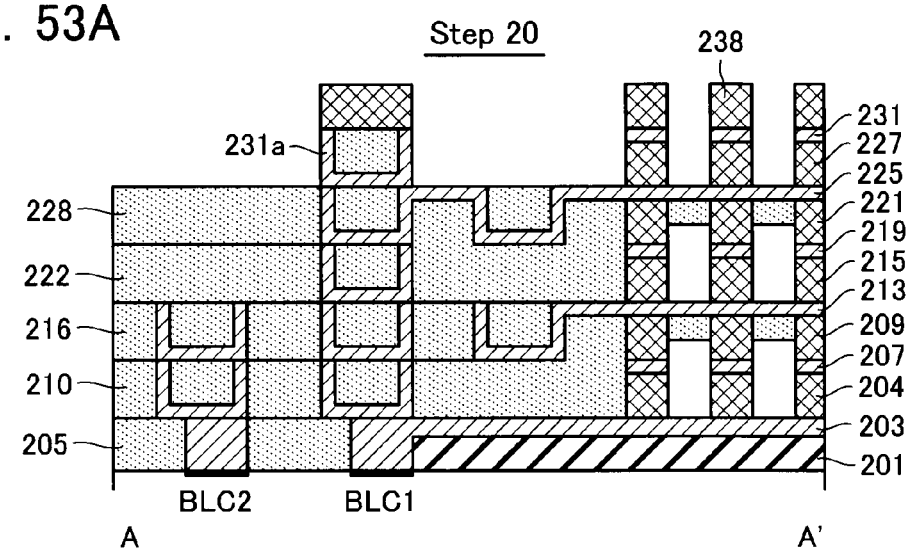
FIGS. 53A to 53C show A-A', B-B' and C-C' sectional views at step 20 in the embodiment.
Figure 53B:
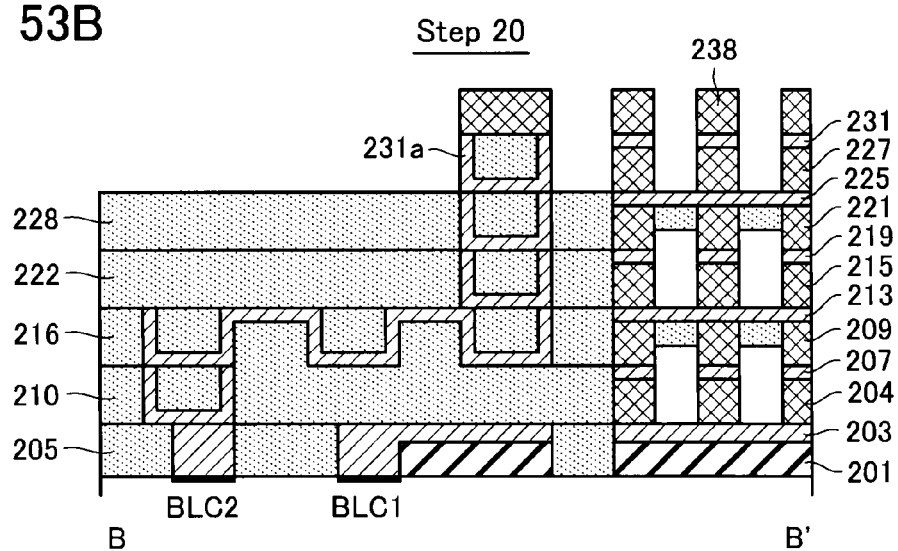
Figure 53C:
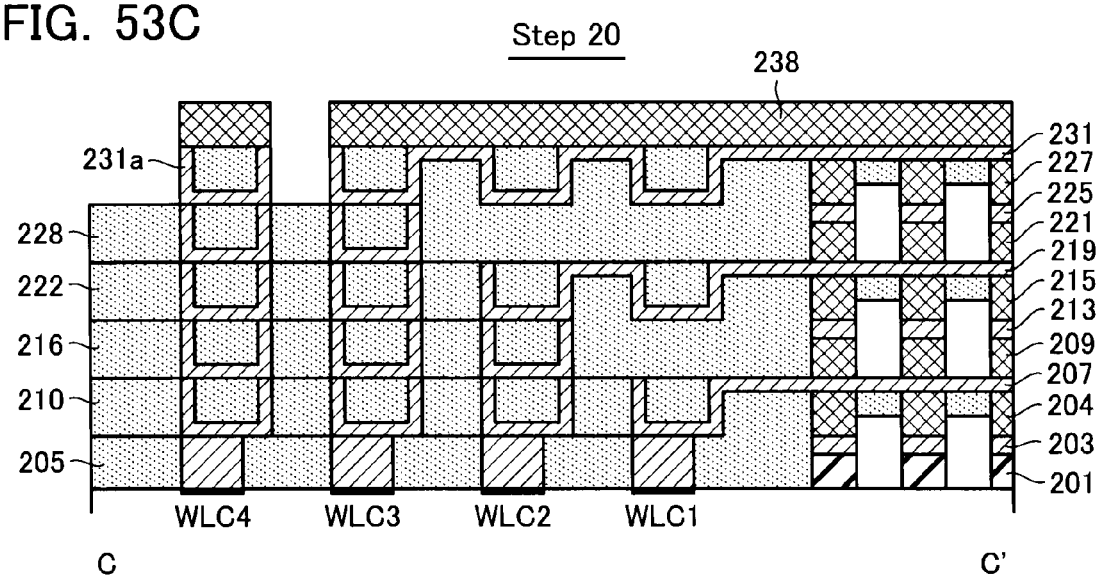

Step 20 (FIGS. 53A, 53B and 53C)

Deposit 6th memory cell layer 238 on the surface of the metal layer 231, and etch the memory cell layer 238, metal layer 231 and memory cell layer 227 until when 5th metal layer 225 is exposed by IE etching with the (8) 6th metal line pattern shown in FIGS. 26 and 29. In this step, 5th concave metal pieces 231a patterned from metal layer 231 are stacked on the underlying metal pieces at the respective vertical wiring portions.

Figure 54C:
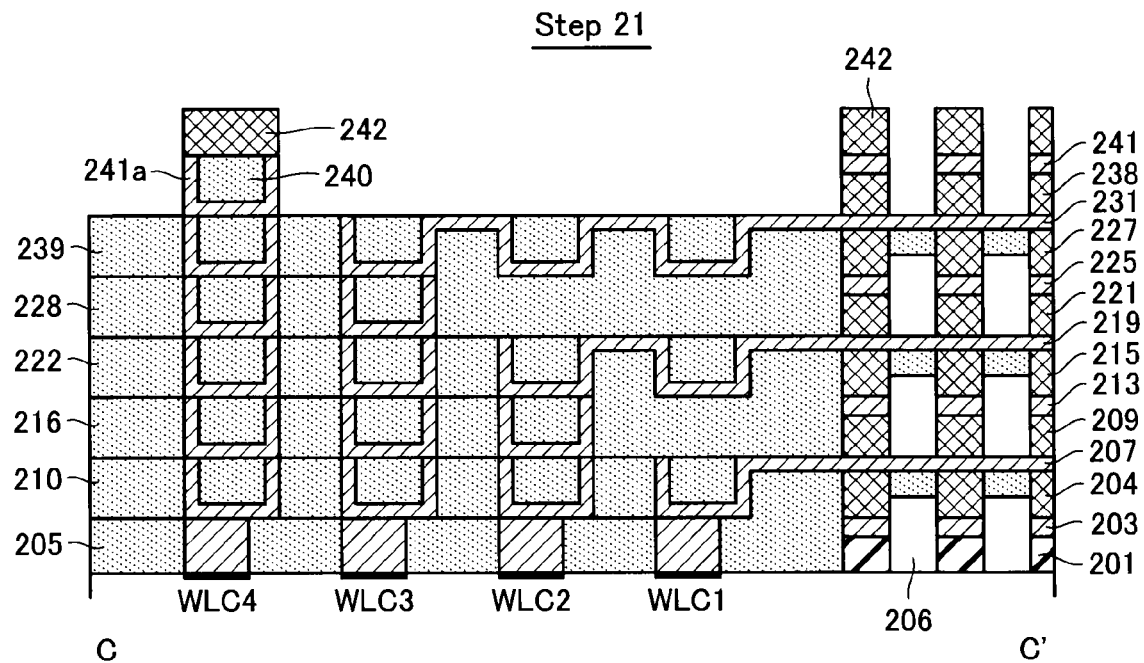

Step 21 (FIGS. 54A, 54B and 54C)

SOG film 239 is coated and planarized; contact trenches are formed on the SOG film 239; 7th metal layer 241 is deposited; and SOG film 240 is buried. Following these processes, deposit 7th memory cell layer 242 on the resultant surface, and pattern it. That is, with the (9) 7th metal line pattern shown in FIGS. 27 and 30, IE etching is performed to expose the 6th metal layer 231. Voids 243 appear between cells in the step of coating SOG film 239 (see A-A' sectional view shown in FIG. 54A and B-B' sectional view shown in FIG. 54B). At the respective vertical wiring portions, 6th concave metal pieces 241a are stacked on the underlying metal pieces.

Figure 55A:
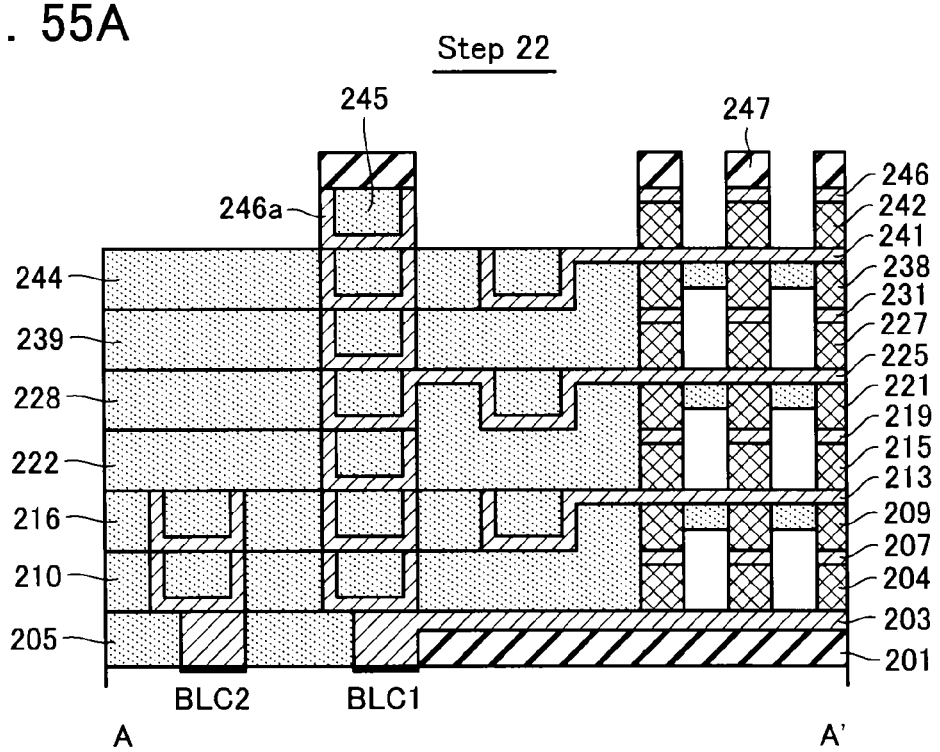
FIGS. 55A to 55C show A-A', B-B' and C-C' sectional views at step 22 in the embodiment.
Figure 55B:
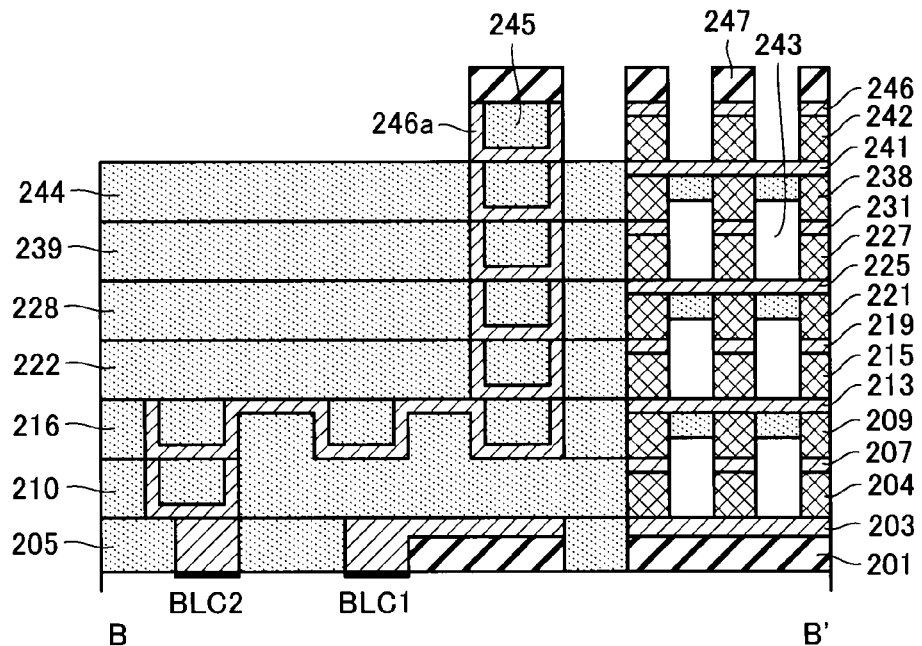
Figure 55C:
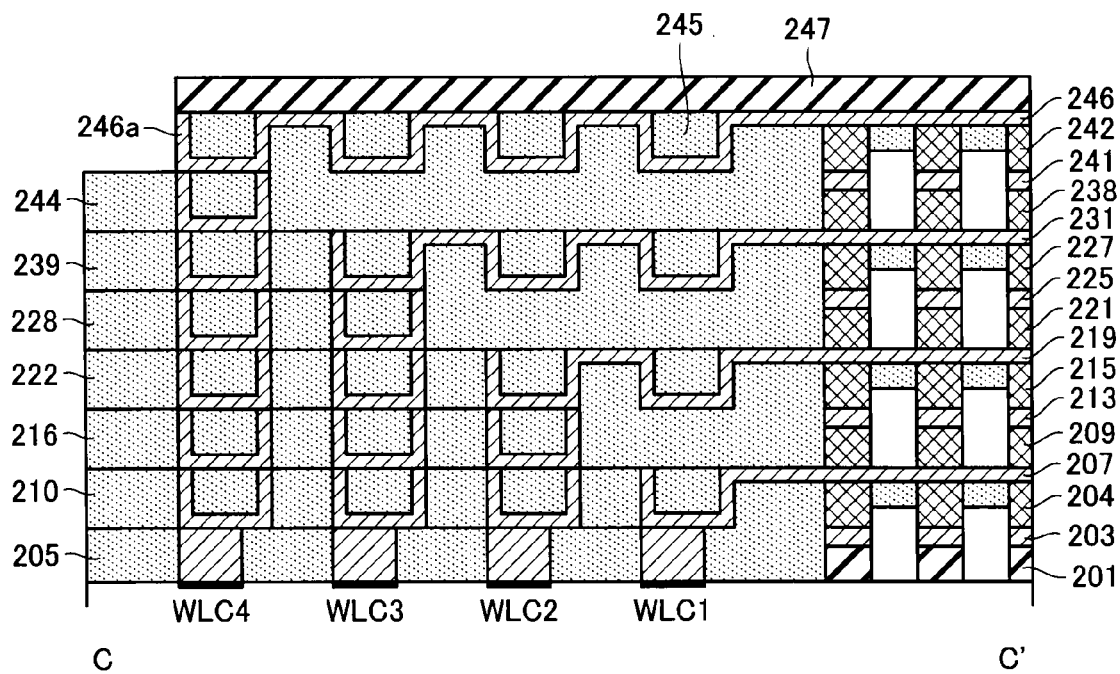

Step 22 (FIGS. 55A, 55B and 55C)

SOG film 244 is coated and planarized; contact trenches are formed on the SOG film 244; 8th metal layer 246 is deposited; and SOG film 245 is buried. Following these processes, deposit passivation insulating film 247, e.g., CVD oxide film. Then, etch the memory cell layer 242 and 8th metal layer 246 to expose 7th metal layer by IE etching with the (10) 8th metal line pattern shown in FIGS. 27 and 30. At the respective vertical wiring portions, 7th concave metal pieces 246a are stacked on the underlying metal pieces.

Figure 56A:
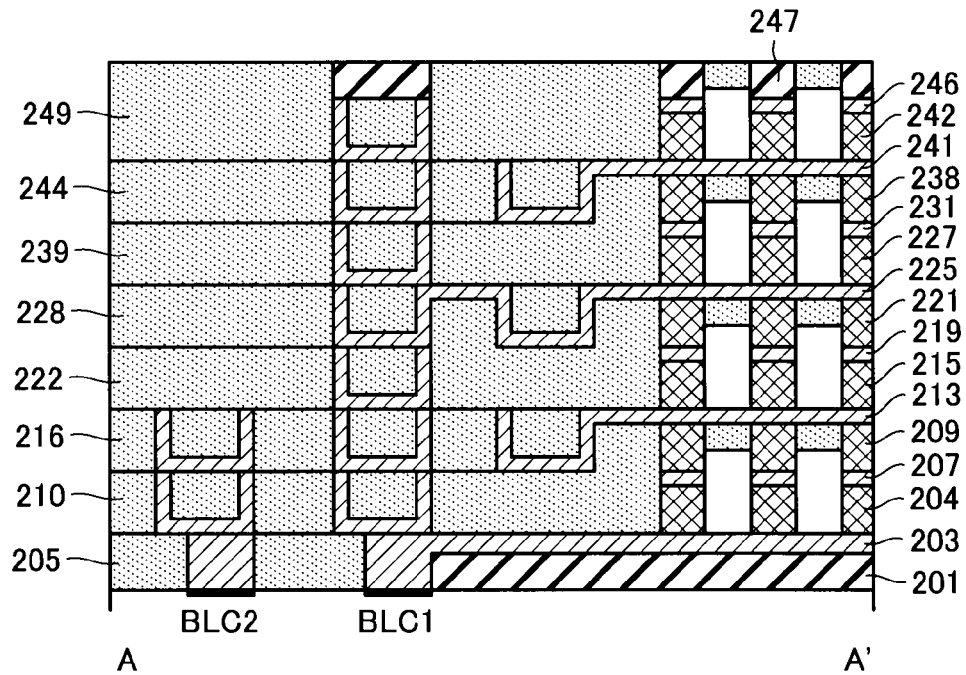
FIGS. 56A to 56C show A-A', B-B' and C-C' sectional views at step 23 in the embodiment.
Figure 56B:
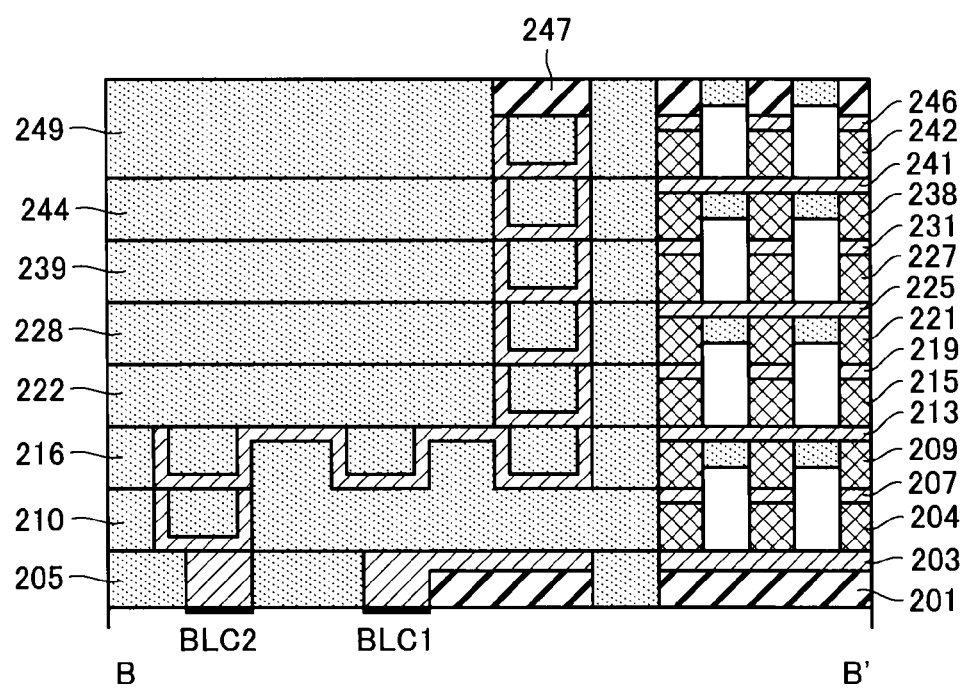
Figure 56C:
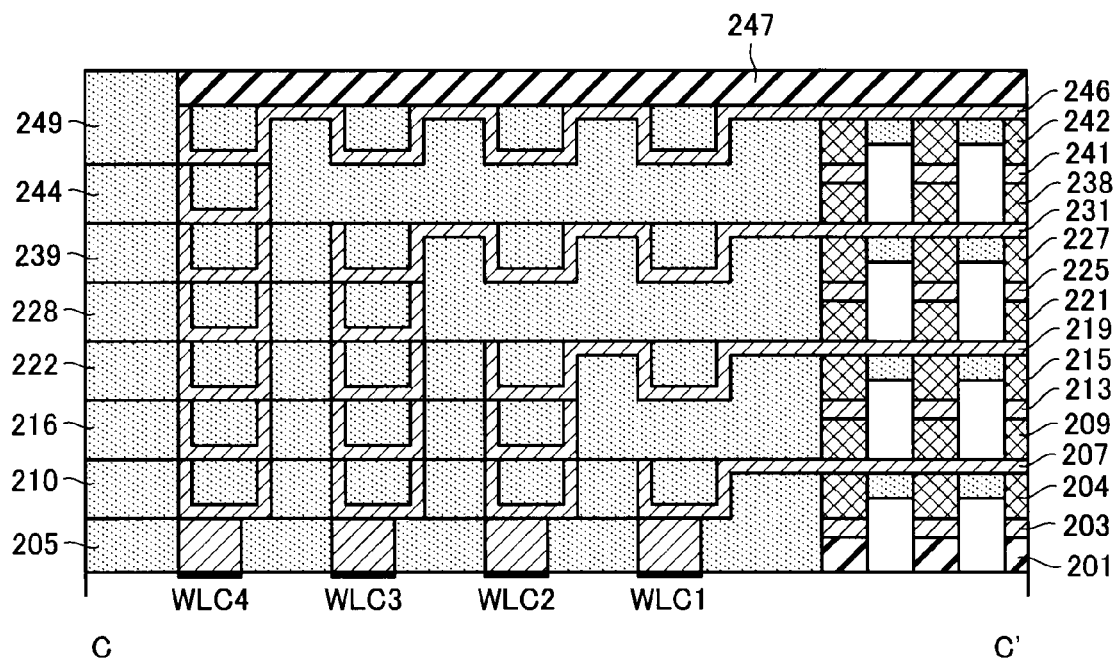

Step 23 (FIGS. 56A, 56B and 56C)

Bury SOG film 249 in the resultant trenches, and planarize it by a CMP process.

Figure 57A:
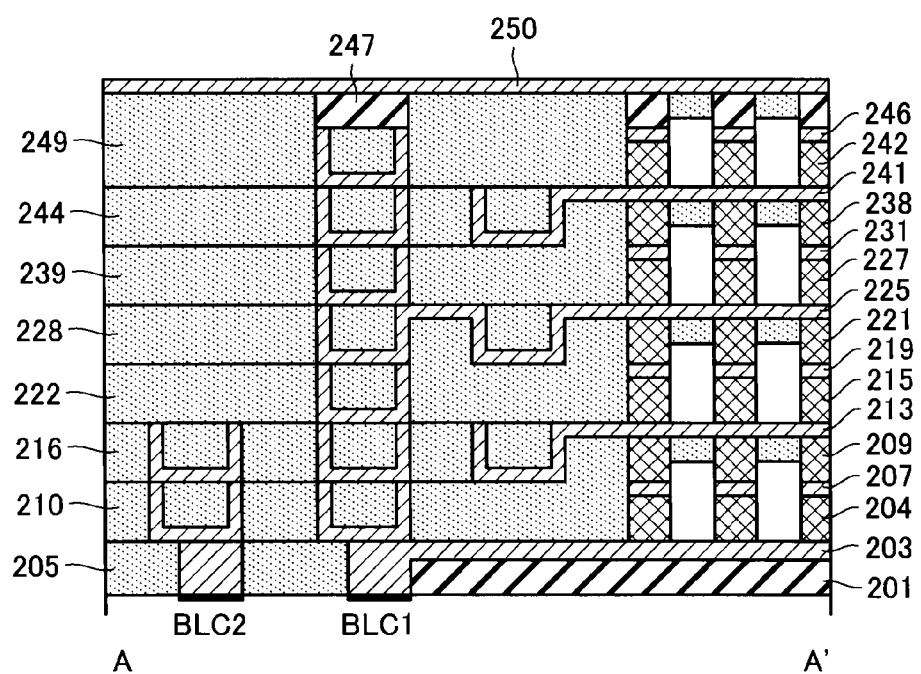
FIGS. 57A to 57C show A-A', B-B' and C-C' sectional views at step 24 in the embodiment.
Figure 57B:
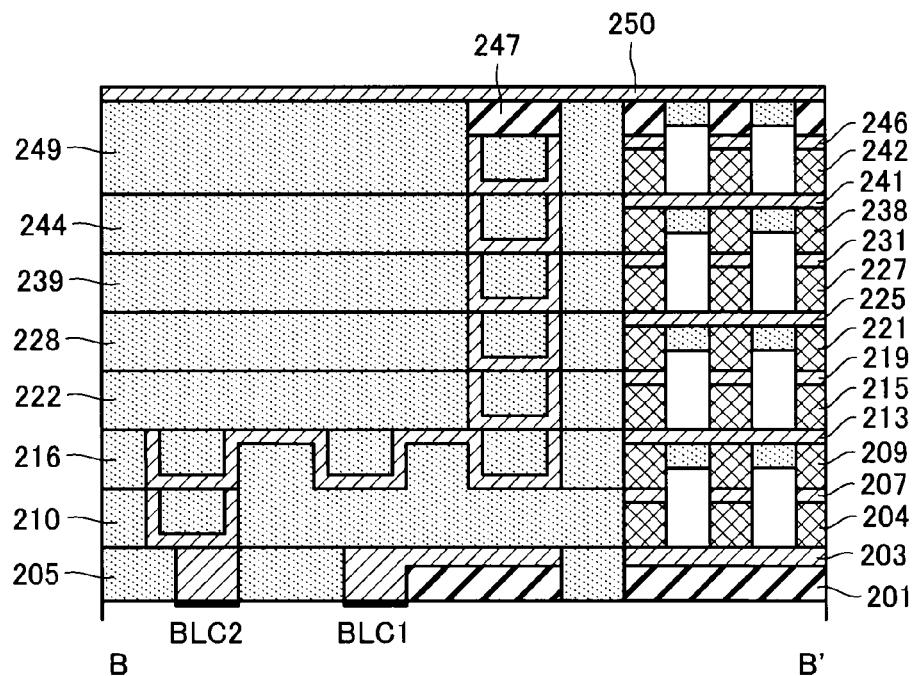
Figure 57C:
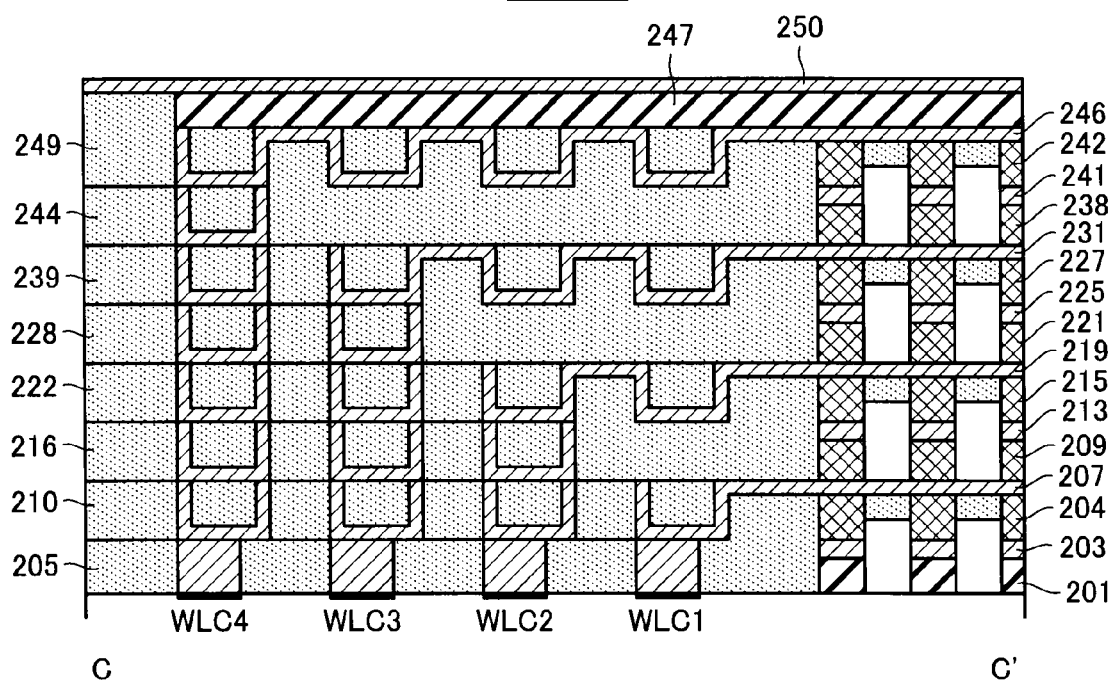

Step 24 (FIGS. 57A, 57B and 57C)

To couple the uppermost metal layers to the underlying metal layers, after forming contact holes shown in FIG. 31, deposit metal layer 250 and pattern it. As a result, 3D-cell array block and the underlying control circuit are coupled with each other.

In the above-described processes, it is assumed that a metal layer is deposited to be followed the concave or convex surface under the condition of a good step coverage property. Therefore, SOG films are coated for planarizing the rough surface. The vertical wirings are formed of concave metal pieces stacked, and inner and outer spaces thereof are buried with SOG films.

By contrast, by use of, for example, a damascene method, a metal layer may be buried perfectly and evenly in a stripe-shaped contact trench. In this case, the basic processes in the above-described embodiment will be adapted. That is, without the SOG coating process, the metal layer may be planarized.

Figure 58A:
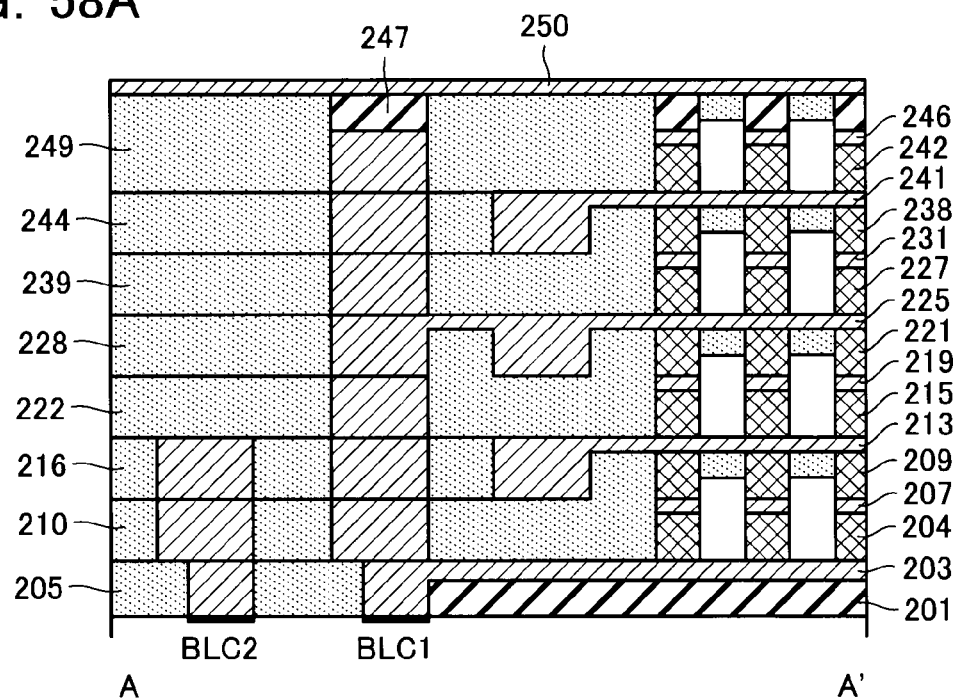
FIGS. 58A to 58C show A-A', B-B' and C-C' sectional views at step 25 in the embodiment.
Figure 58B:
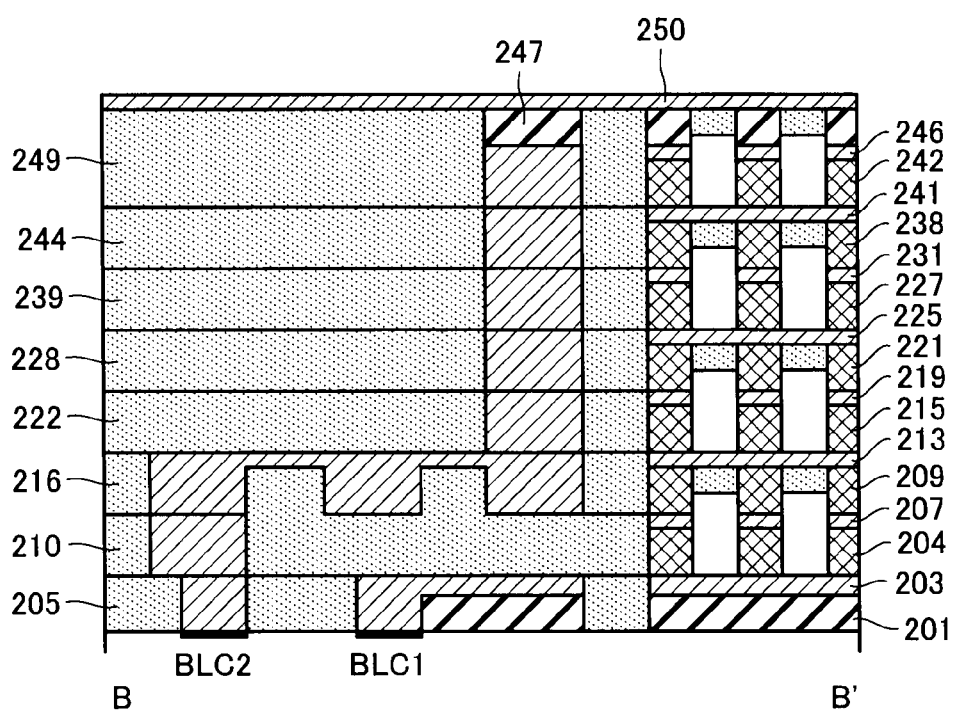
Figure 58C:
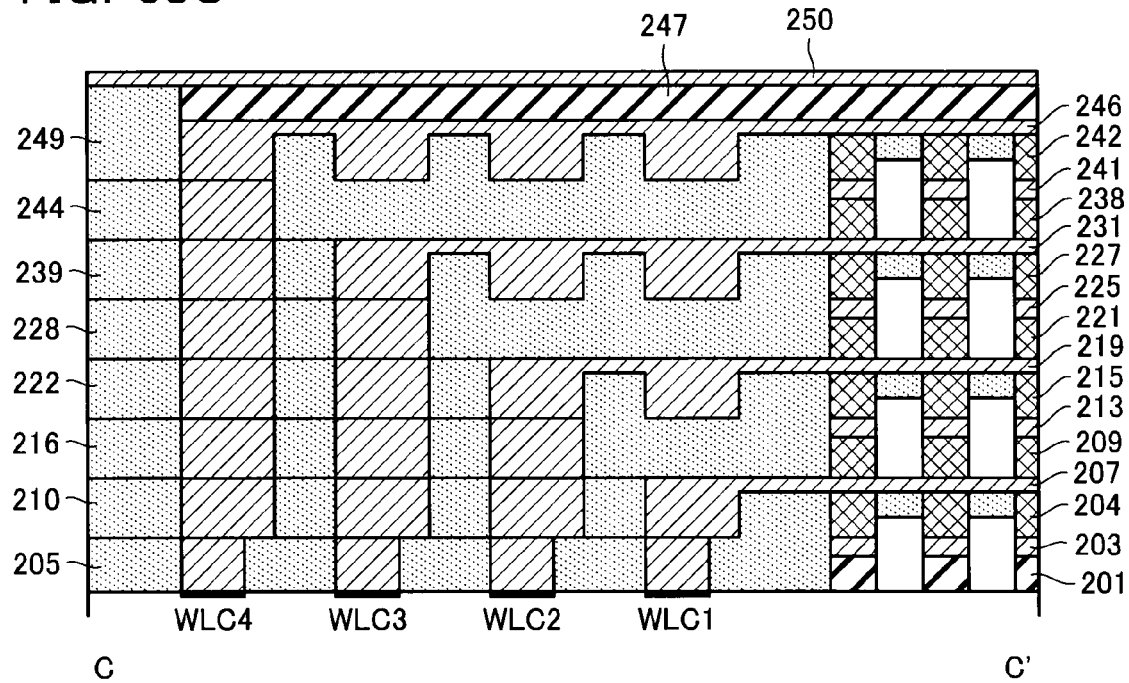

FIGS. 58A to 58C show the final structure with the above-described process without the SOG processes in correspondence to that shown in FIGS. 57A to 57C. At the bit line and word line contact portions BLC1, BLC2 and WLC1-WLC4, pillar-shaped metals are buried to be coupled to the metal lines.

(In Case of "With Hollowing")

Next, the fabrication process will be explained in such a case that 3D-cell array is hollowed finally. In this case, it is in need of preparing a process for forming a support structure for supporting a hollowed 3D-cell array. The basic contact patterns and metal line patterns in case of "with hollowing" are, as shown in FIGS. 25-27 and 28-30, not different from those in case of "without hollowing". However, to certainly support the hollowed structure, T-shaped metal patterns and sacrificial patterns will be used at the bit line detouring portions.

Figure 59:
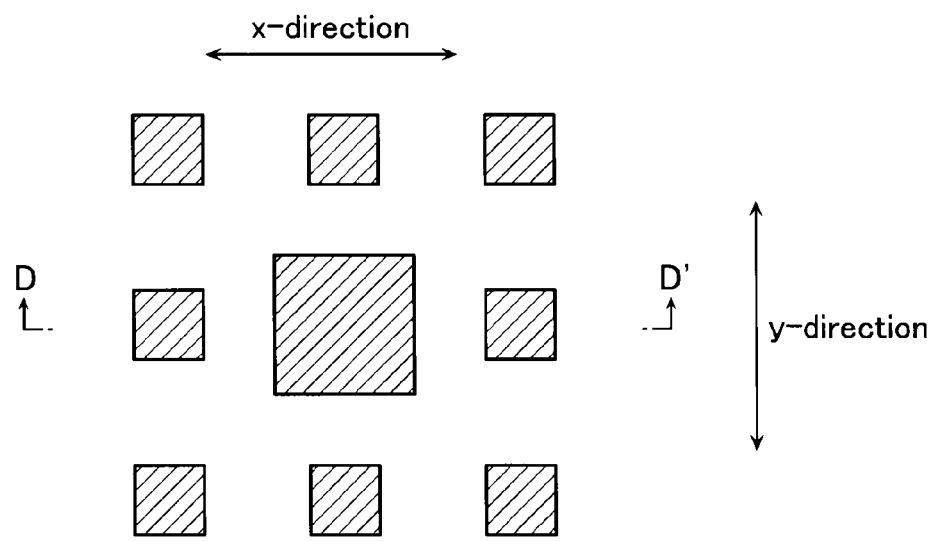
FIG. 59 shows a D-D' sectional view position used additionally in another embodiment.

In the following description, D-D' sectional view with respect to the metal contact portion SC, in which the uppermost metal lines of 3D-cell array are coupled to uppermost metal lines on the Si-substrate, will be used in addition to A-A', B-B' and C-C' sectional views. FIG. 59 shows the position of D-D sectional view on the second (and the following) metal line pattern shown in FIG. 31.

As an interlayer dielectric film, two kinds of films are used as follows: one is a CVD insulating film to be remained as a supporting material for supporting the hollowed structure; and the other is a coating type of insulating film to be removed finally. With respect to the etching method for these two kinds of insulating films, CDE (Chemical Dry Etching) is used because a large selection ratio may be selected in comparison with an isotropic etching method.

Silicon nitride ($Si_3N_4$) film known as an inorganic insulating film and CF known as a low dielectric constant film may be used as the CVD insulating films. The coating type of insulating films will be listed up as follows: usual SOG film; organic SOG film of alkylalkoxysilane or organic siloxane regin base; hydrogen silsesquioxane (HSQ); methylsilsequioxane (MSQ); and organic polymer.

In the following example, silicon nitride films are used as the CVD insulating film; and usual spin-coated SOG films are used as the coating type of insulating films.

Step 0 (FIGS. 60A-60D)

On the insulating film 301 deposited on the Si substrate 300, on which the control circuit is formed, form stripe-shaped contact trenches 302 at the bit line and word line contact portions BLC1, BLC2 and WLC10-WLC4 with the (1) 1st contact trench pattern shown in FIGS. 25 and 28. Each contact trench 302 is extended over multiple contact portions of the vertical wirings. In this step, contact hole 303 is formed simultaneously with contact trenches 302 at the contact portion of the uppermost metal line with the contact pattern shown in FIG. 31.

Figure 60A:
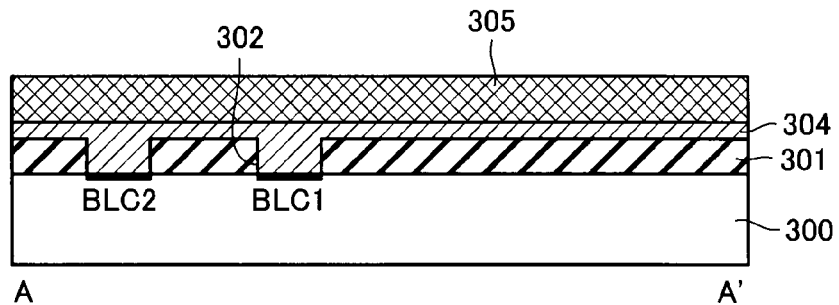
FIGS. 60A to 60D show A-A', B-B', C-C' and D-D' sectional views at step 0 in the embodiment.
Figure 60B:
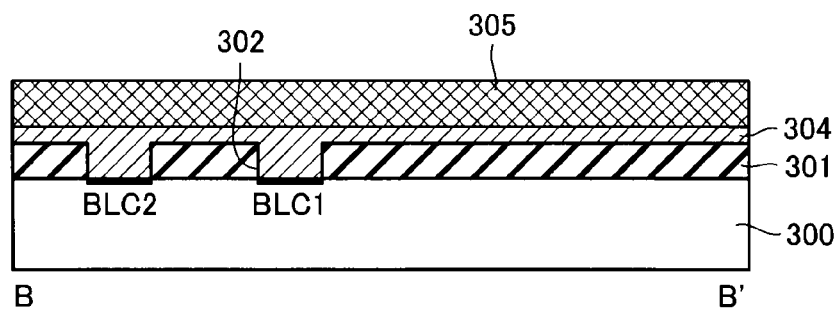
Figure 60C:
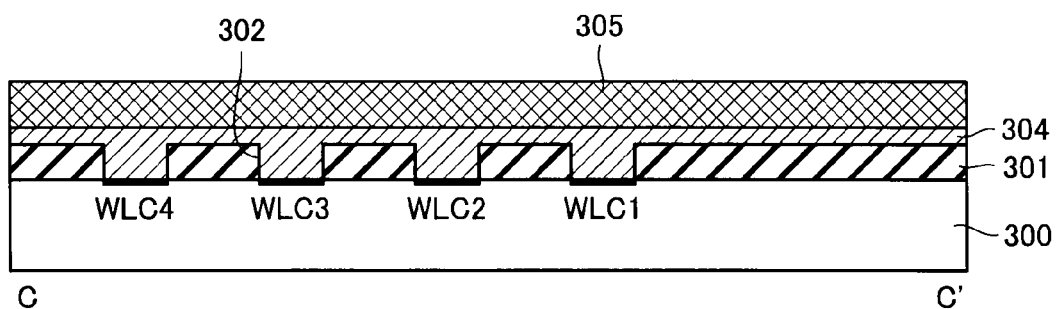
Figure 60D:
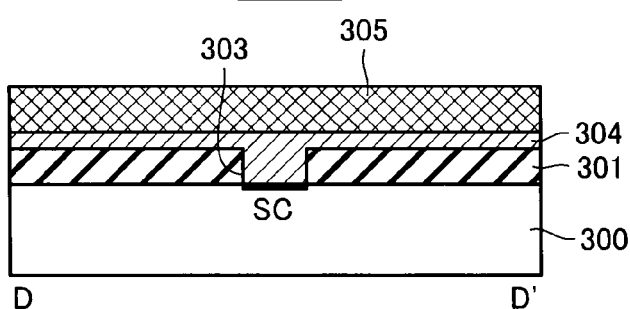
Figure 61A:
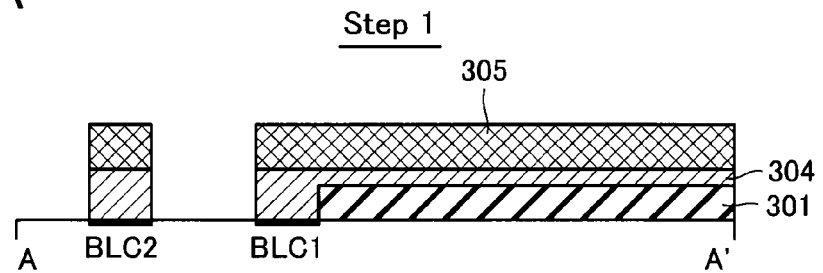
FIGS. 61A to 61D show A-A', B-B', C-C' and D-D' sectional views at step 1 in the embodiment.
Figure 61B:
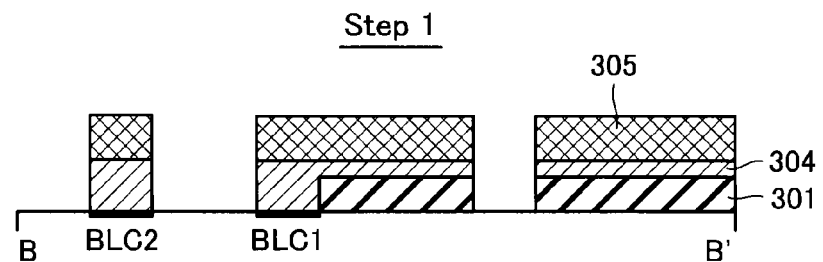
Figure 61C:
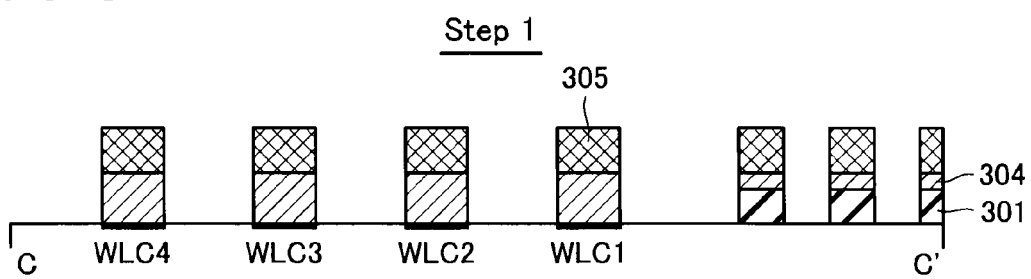
Figure 61D:
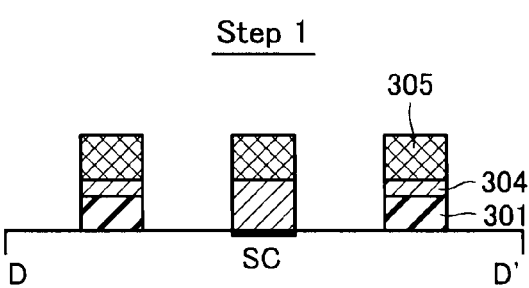

After forming these contact trenches and contact holes, deposit and planarize 1st metal layer 304, and then deposit memory cell layer 305 on the metal layer 304. A-A' sectional view shown in FIG. 60A and B-B' sectional view shown in FIG. 60B are the same as each other.

The interlayer insulating film 301 is different from the coating SOG films used as interlayer insulating films in the successive steps, and it is required of this to be resistant to the etching method adapted for the SOG film. For example, the insulating film 301 is a CVD oxide film. The reason why it is required of this film to be resistant against etching is the same as explained for the insulating film 201 shown in FIG. 34. In the following steps, the insulating film 301 will be removed perfectly excepting bit line and word line areas. This also is the same as in the above-described example.

In the drawings in the successive steps, Si substrate 300 will be omitted excepting the surface portions, i.e., bit line contact portions BLC1, BLC2, word line contact portions WLC1-WLC4 and contact portion SC.

Step 1 (FIGS. 61A-61D)

Etching the memory cell layer 305 and the 1st metal layer 304 to expose the upper metal lines on the Si substrate with the (2) 1st metal line pattern shown in FIGS. 25 and 28. As a result, first bit lines and contact metals are patterned in such a manner that memory cell layers 305 are stacked thereon. It is effective to remain the insulating film 301 in consideration of the circuit protection, but only such a case is shown in the successive drawings that the insulating film is perfectly removed.

Step 2 (FIGS. 62A-62D)

Deposit silicon nitride film 306 uniformly on the concave and convex surface, on which the bit lines are patterned, with a CVD method of a good step-coverage property, and following it deposit SOG film 307. The resultant surface is planarized by a CMP process. As a result, there is provided such a plane surface that SOG film is buried between the metal lines, and the memory cell layers 305 are exposed.

Explaining in detail a little, nitride film 306 is deposited on the inner surface of concave portions (bottom and side wall) with a uniform thickness. This nitride film 306 is remained and used as an "insulating and supporting piece" for supporting the hollowed wiring structure when SOG film 307 is removed finally. Then, SOG film 307 is spin-coated to be embedded in the trench portions.

Figure 62A:
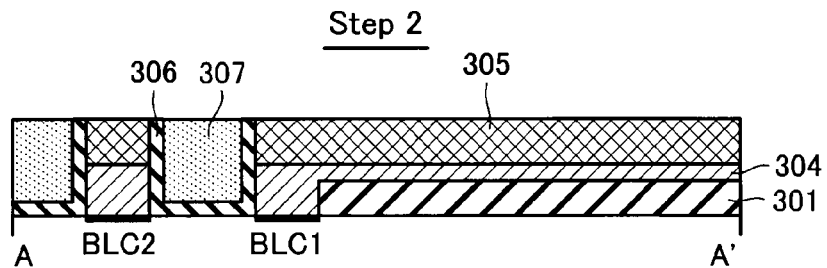
FIGS. 62A to 62D show A-A', B-B', C-C' and D-D' sectional views at step 2 in the embodiment.
Figure 62B:
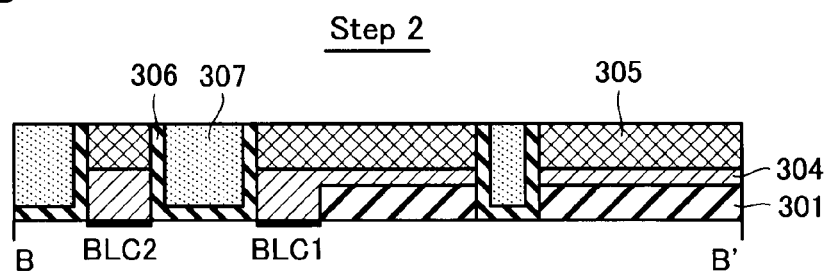
Figure 62C:
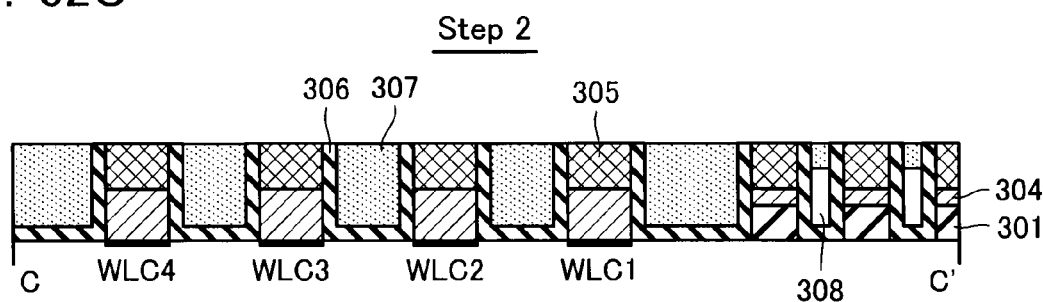
Figure 62D:
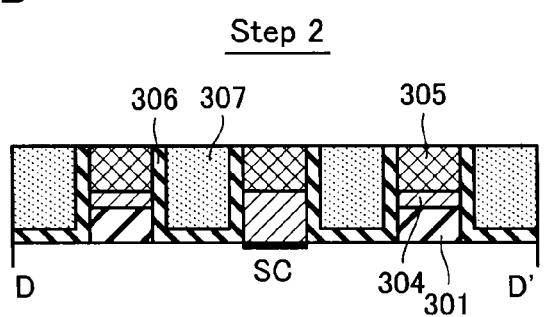
Figure 63A:
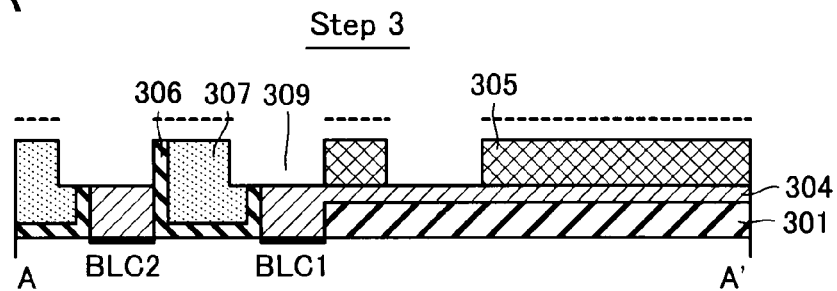
FIGS. 63A to 63D show A-A', B-B', C-C' and D-D' sectional views at step 3 in the embodiment.
Figure 63B:
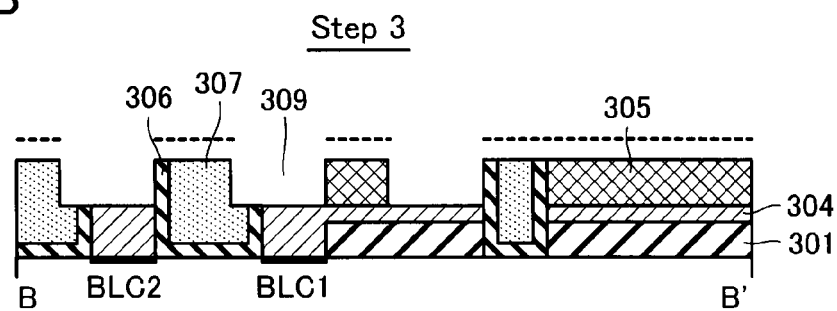
Figure 63C:
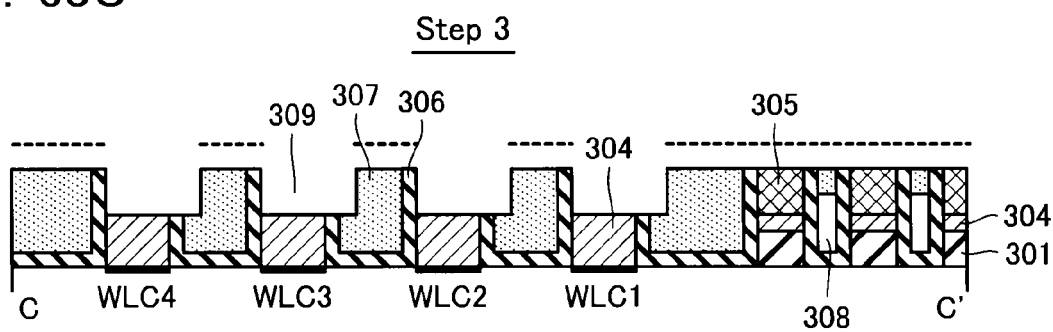
Figure 63D:
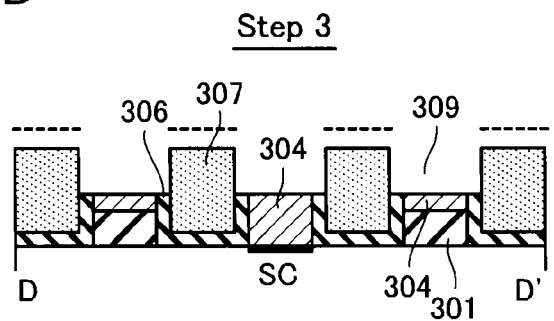
Figure 64A:
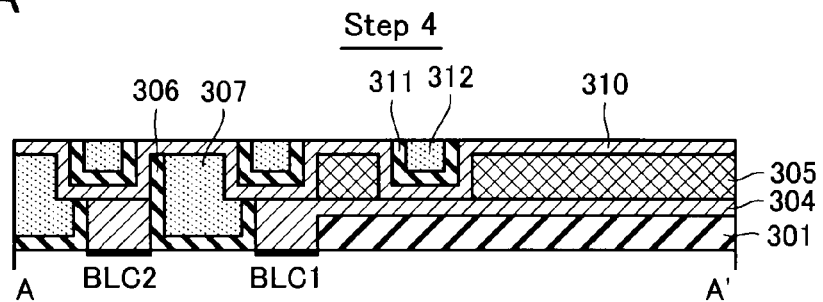
FIGS. 64A to 64D show A-A', B-B', C-C' and D-D' sectional views at step 4 in the embodiment.
Figure 64B:
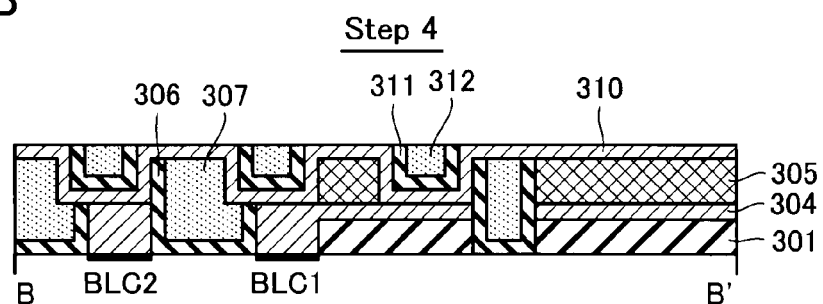
Figure 64C:
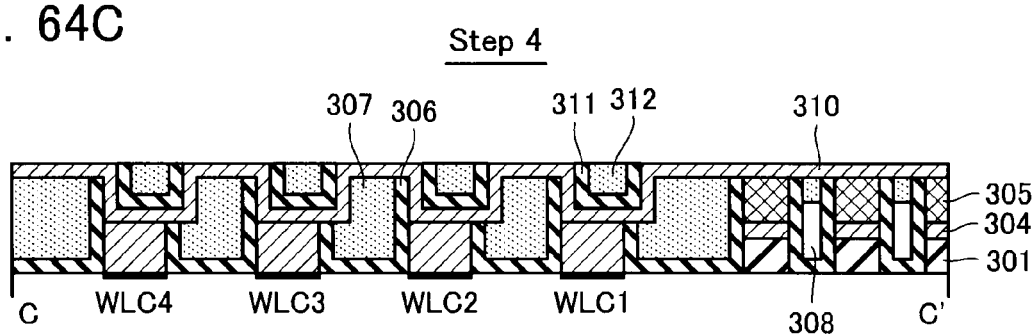
Figure 64D:
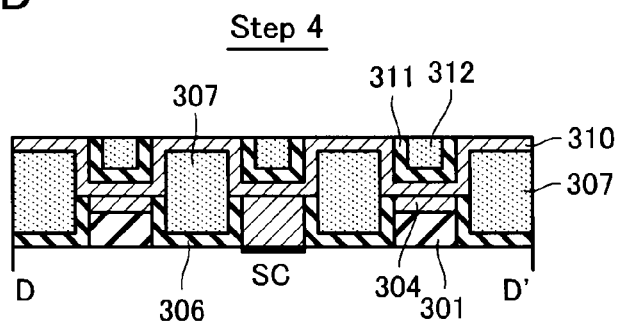
Figure 65A:
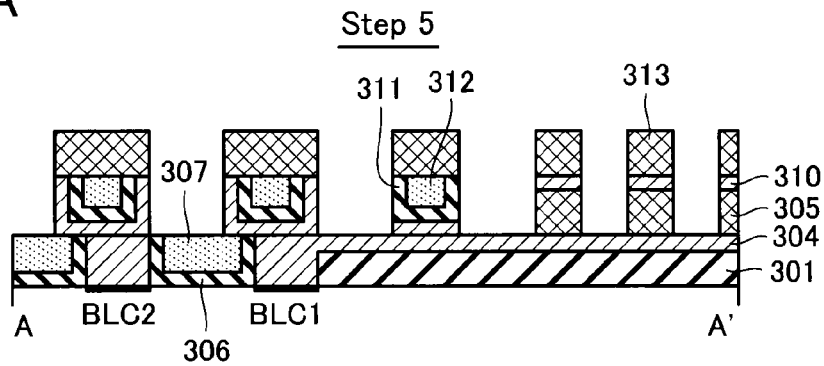
FIGS. 65A to 65D show A-A', B-B', C-C' and D-D' sectional views at step 5 in the embodiment.
Figure 65B:
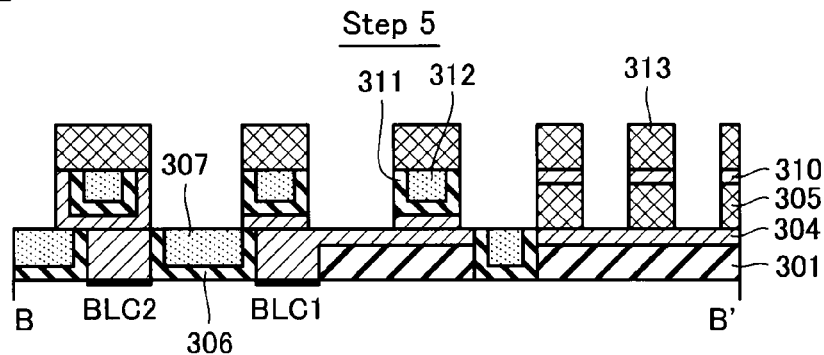
Figure 65C:
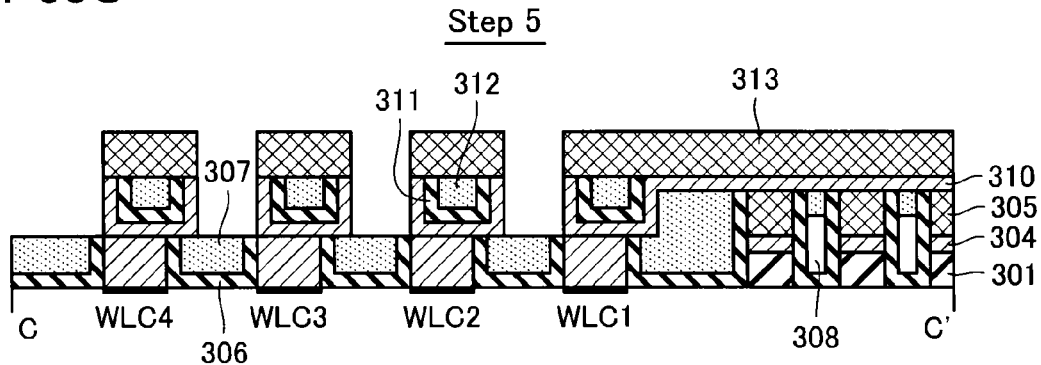
Figure 65D:
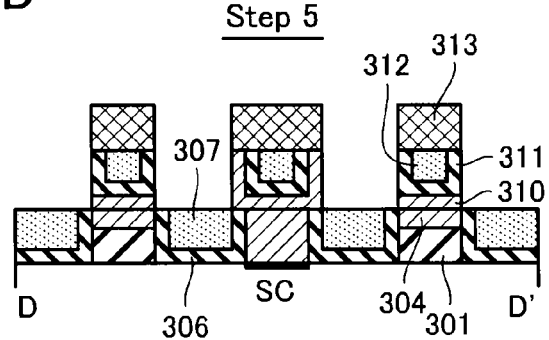
Figure 66A:
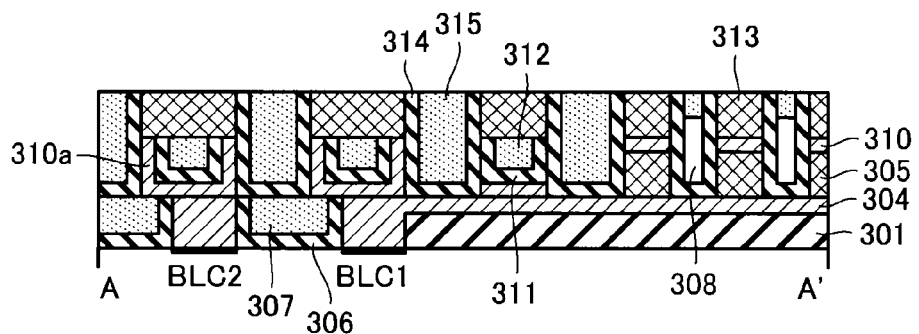
FIGS. 66A to 66D show A-A', B-B', C-C' and D-D' sectional views at step 6 in the embodiment.
Figure 66B:
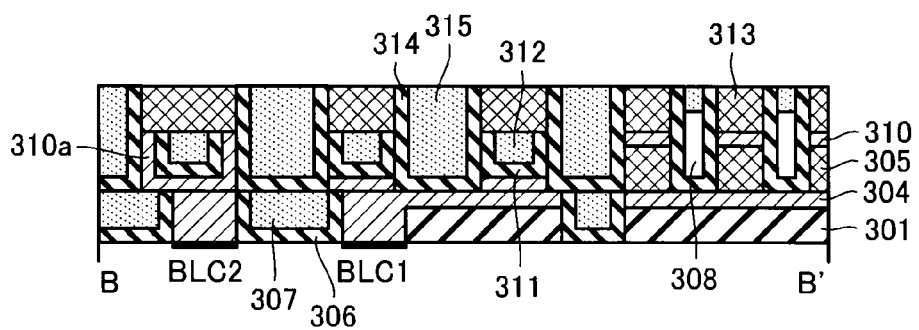
Figure 66C:
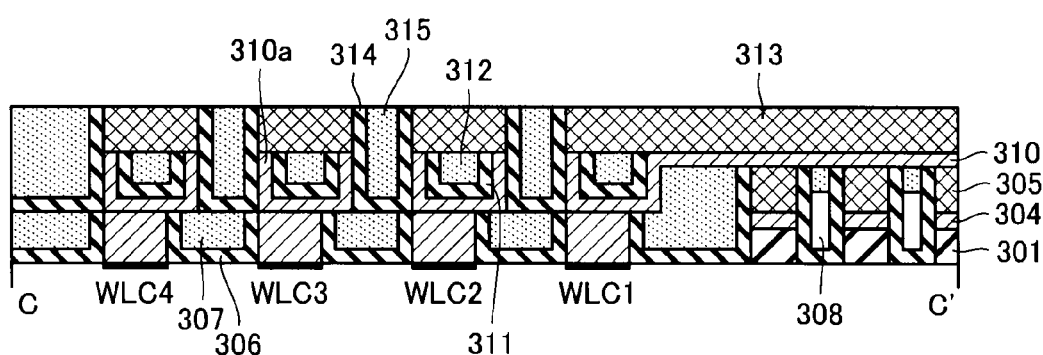
Figure 66D:
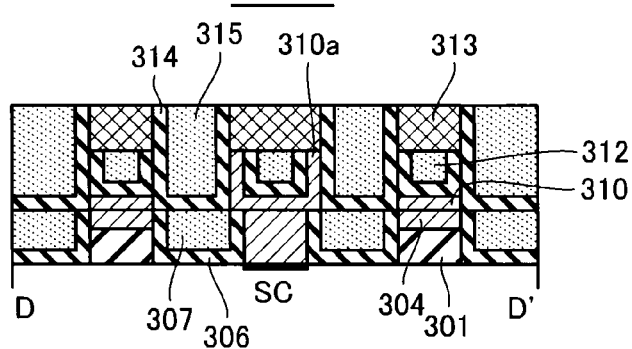
Figure 67A:
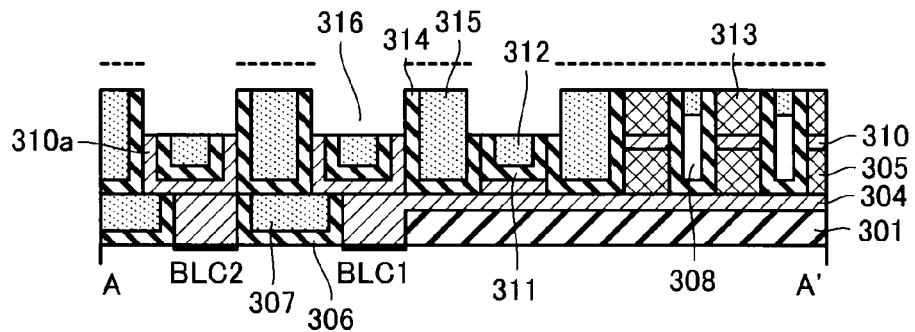
FIGS. 67A to 67D show A-A', B-B', C-C' and D-D' sectional views at step 7 in the embodiment.
Figure 67B:
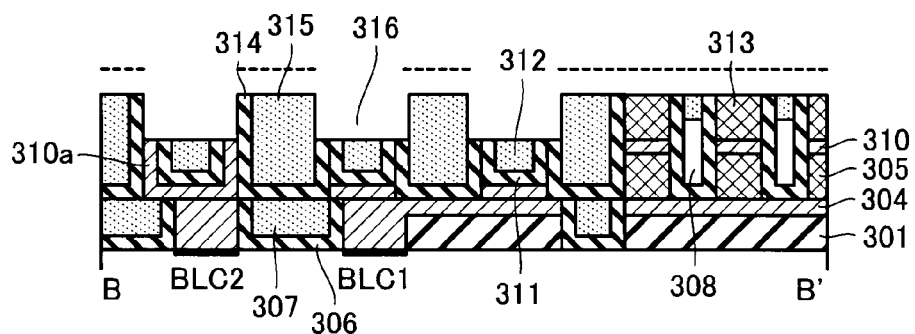
Figure 67C:
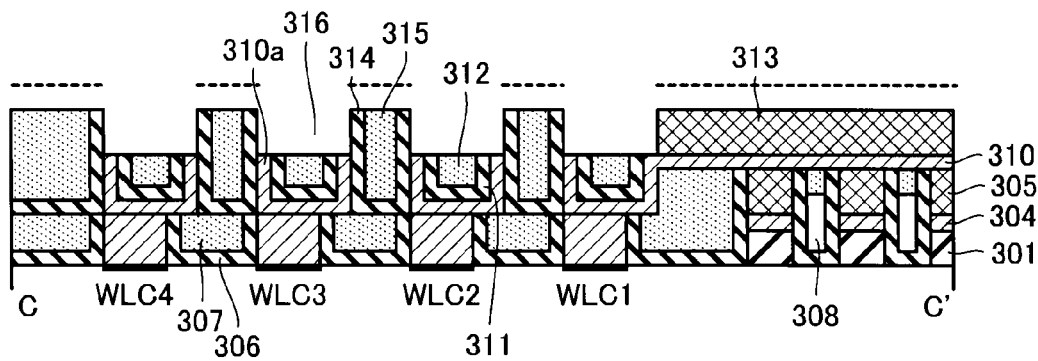
Figure 67D:
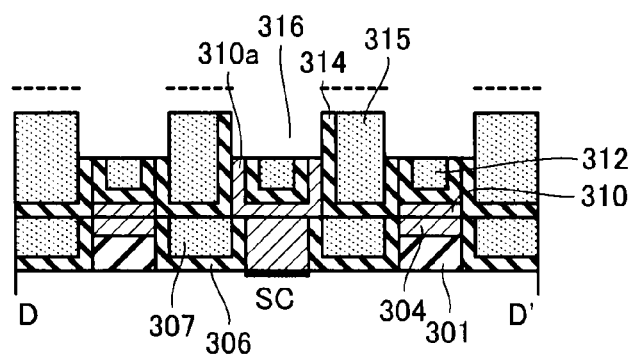
Figure 68A:
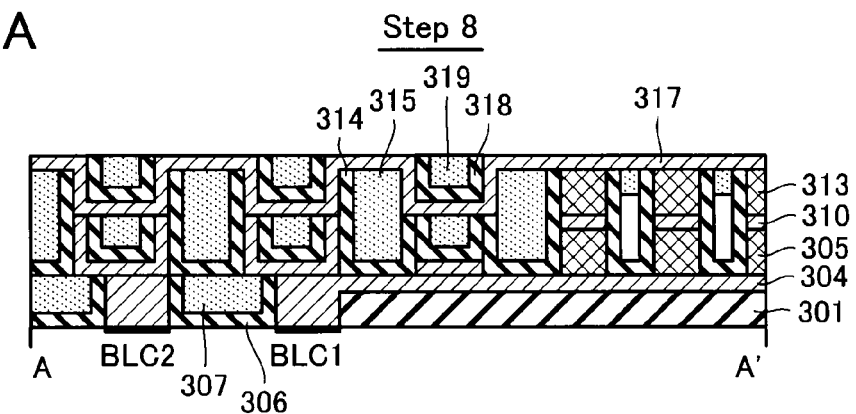
FIGS. 68A to 68D show A-A', B-B', C-C' and D-D' sectional views at step 8 in the embodiment.
Figure 68B:
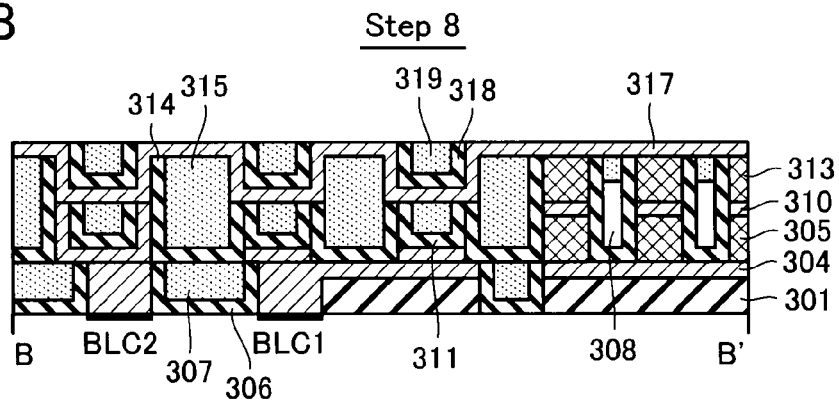
Figure 68C:
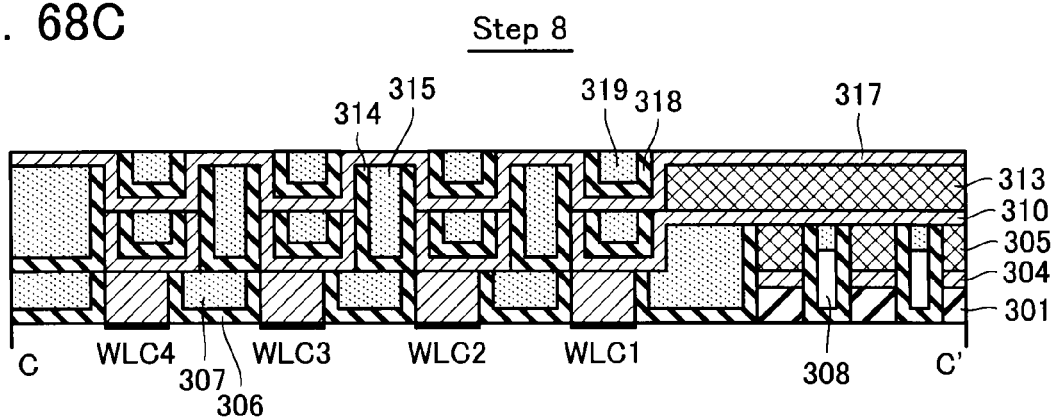
Figure 68D:
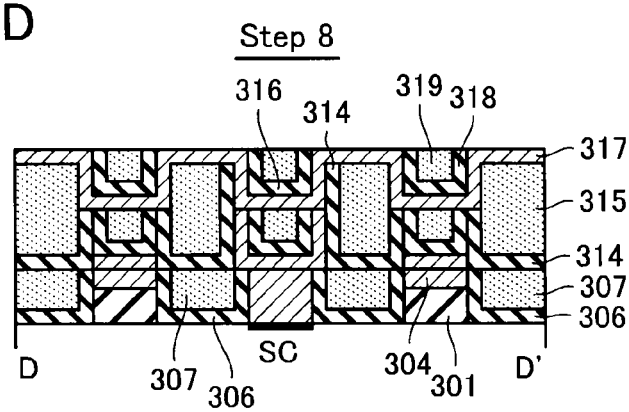
Figure 70A:
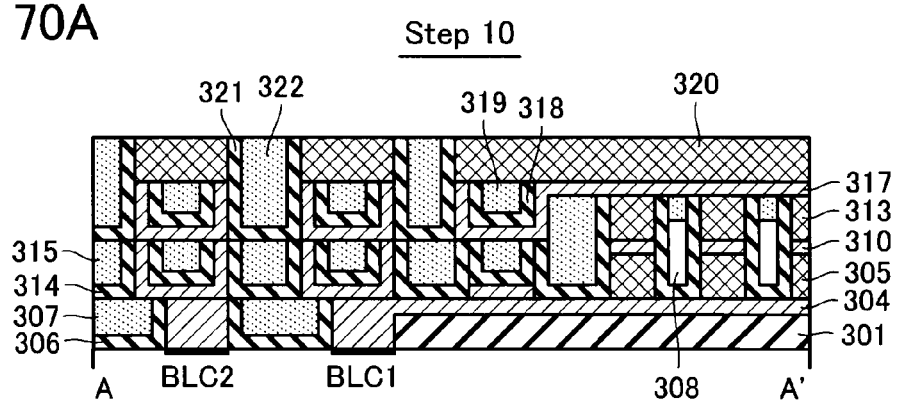
FIGS. 70A to 70D show A-A', B-B', C-C' and D-D' sectional views at step 10 in the embodiment.
Figure 70B:
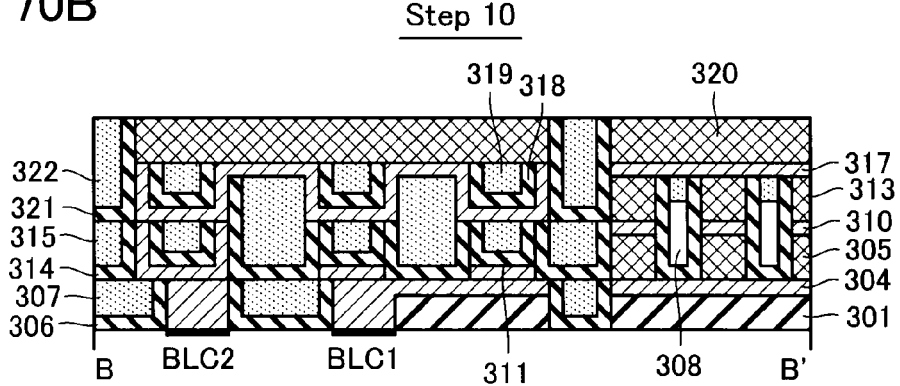
Figure 70C:
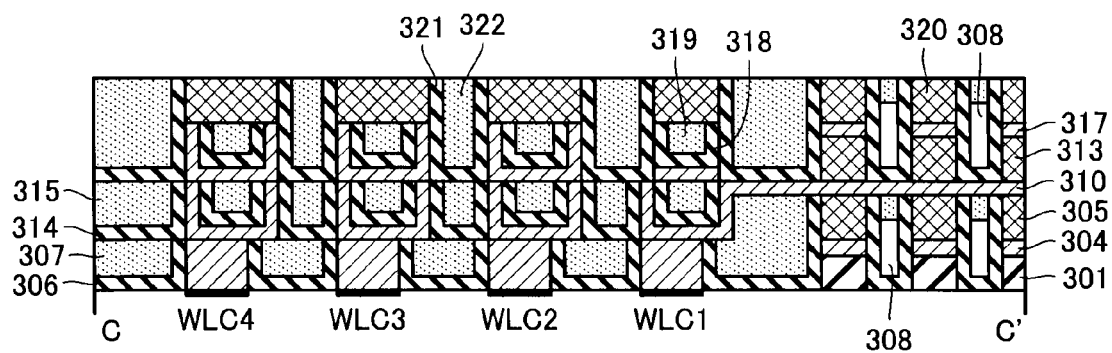
Figure 70D:
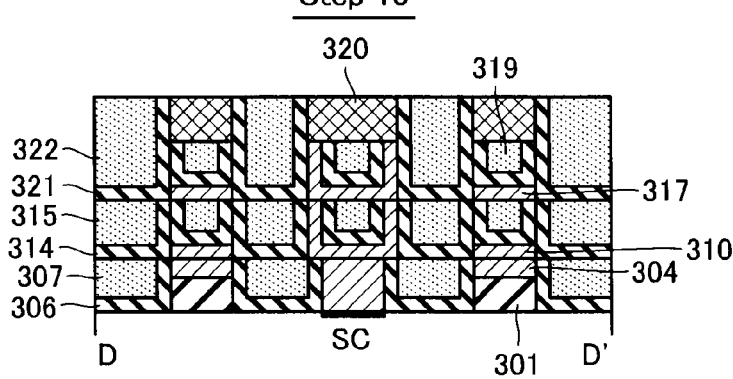
Figure 71A:
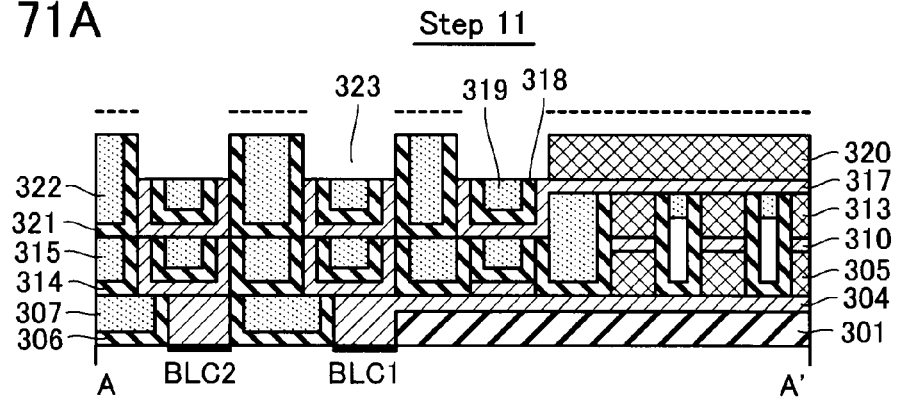
FIGS. 71A to 71D show A-A', B-B', C-C' and D-D' sectional views at step 11 in the embodiment.
Figure 71B:
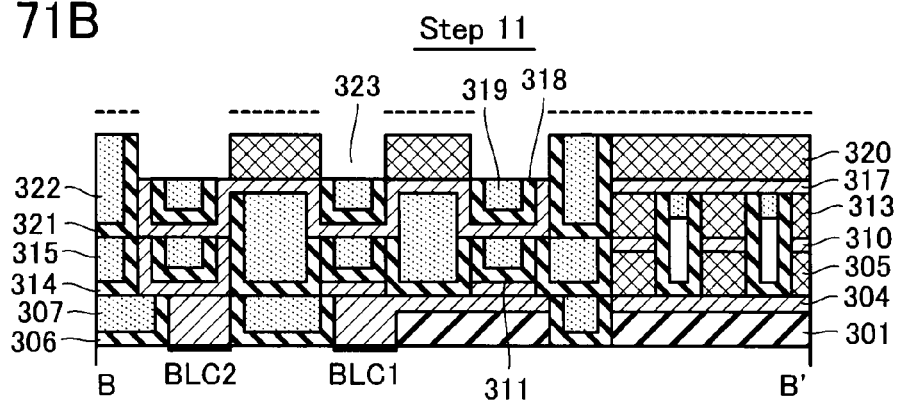
Figure 71C:
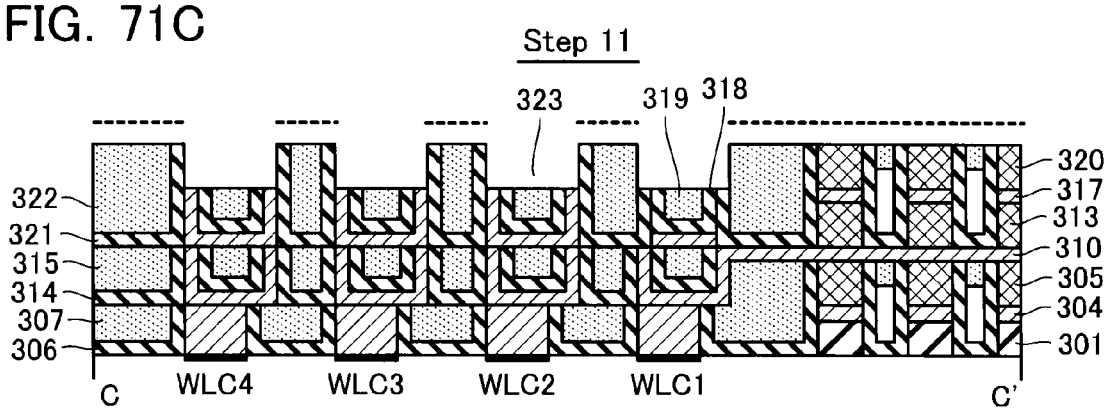
Figure 71D:
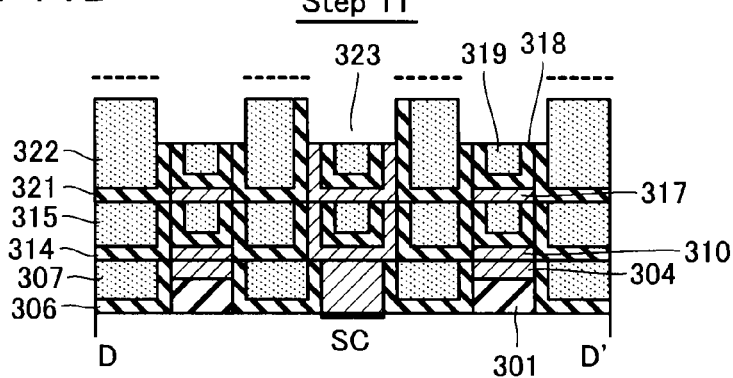
Figure 72A:
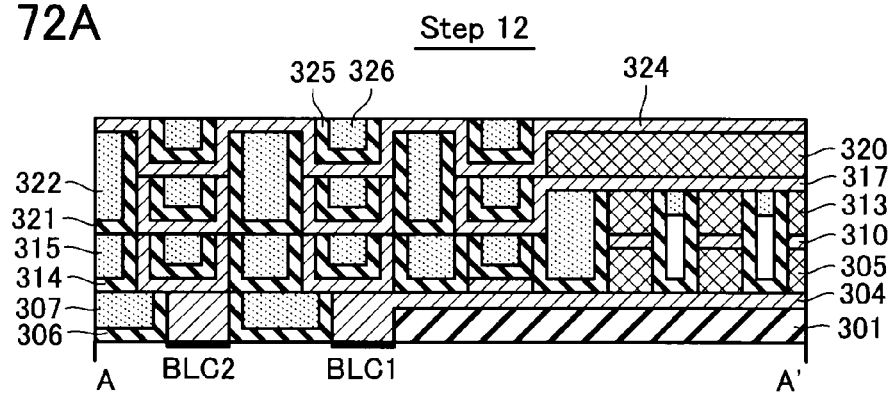
FIGS. 72A to 72D show A-A', B-B', C-C' and D-D' sectional views at step 12 in the embodiment.
Figure 72B:
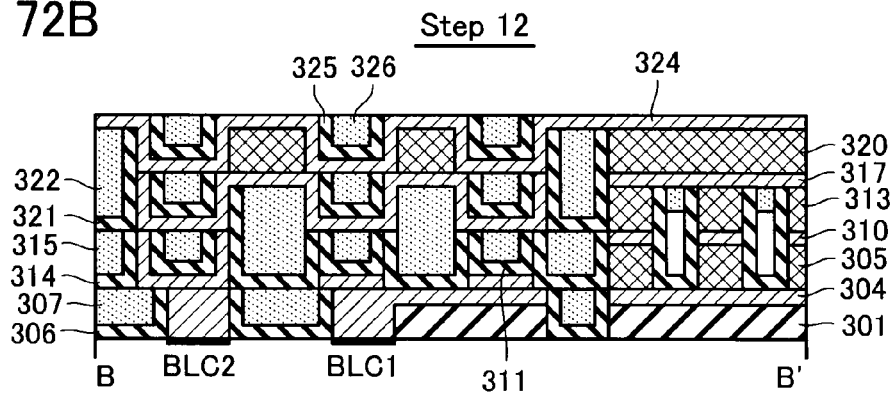
Figure 72C:
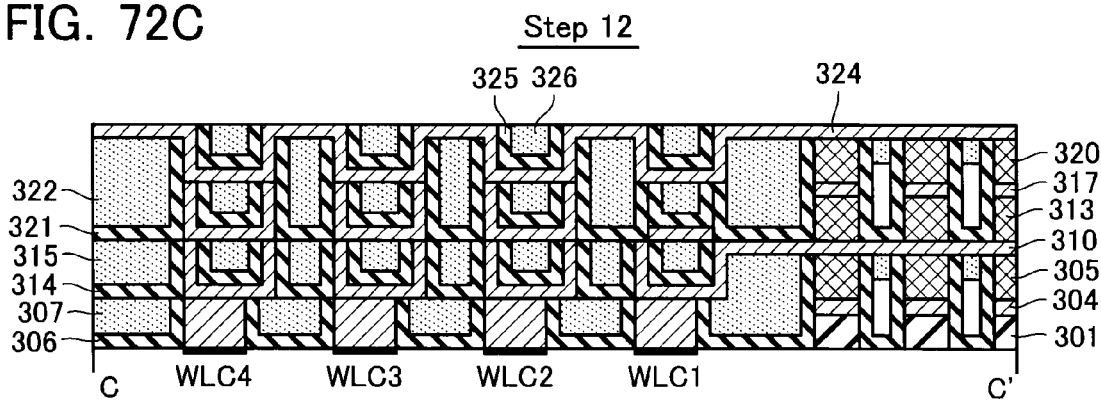
Figure 72D:
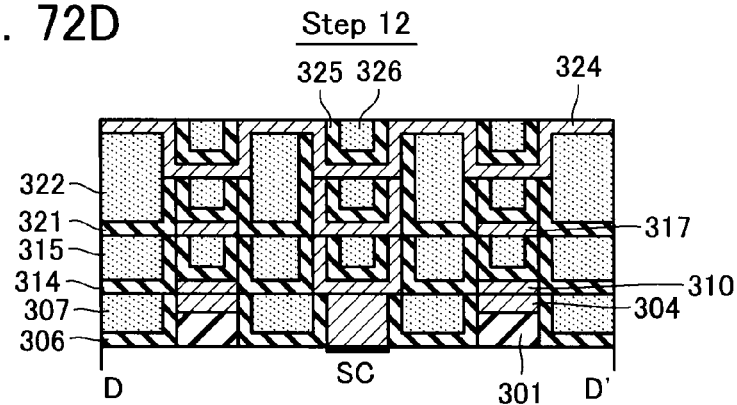
Figure 73A:
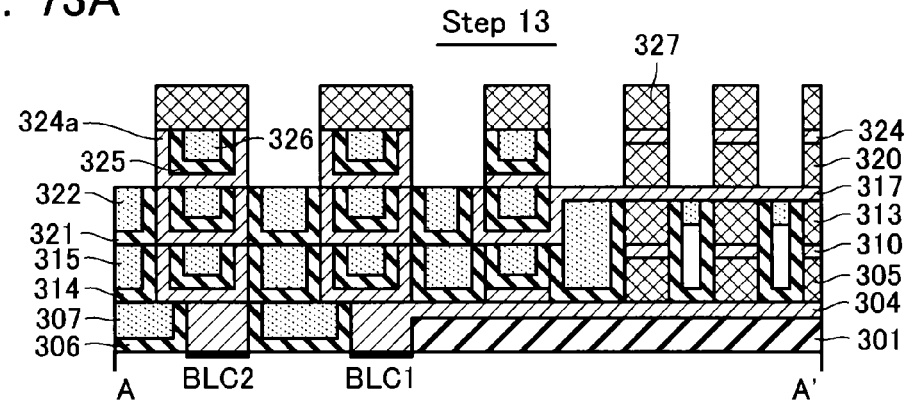
FIGS. 73A to 73D show A-A', B-B', C-C' and D-D' sectional views at step 13 in the embodiment.
Figure 73B:
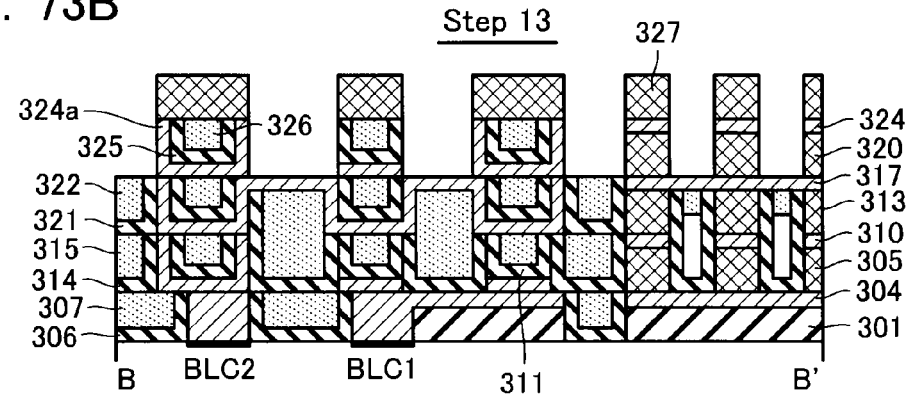
Figure 73C:
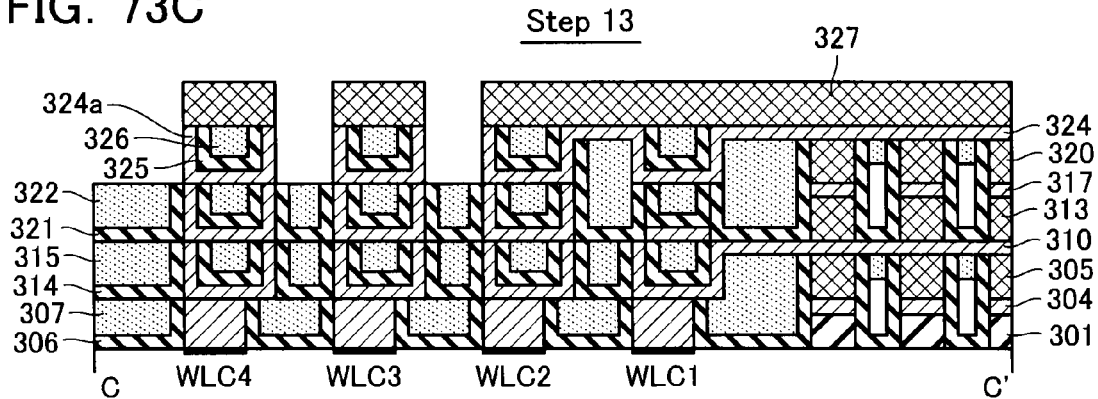
Figure 73D:
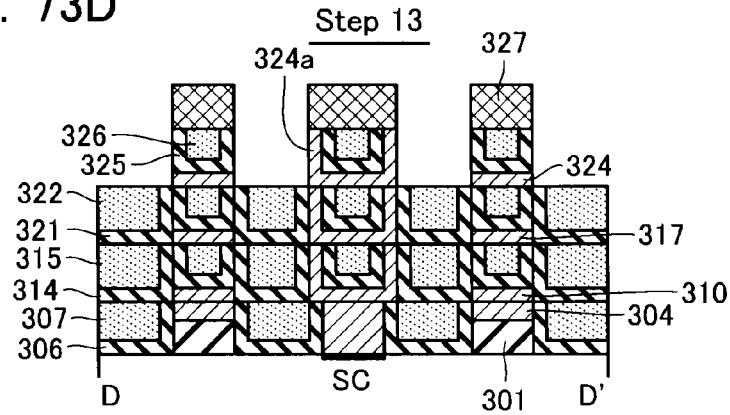
Figure 74A:
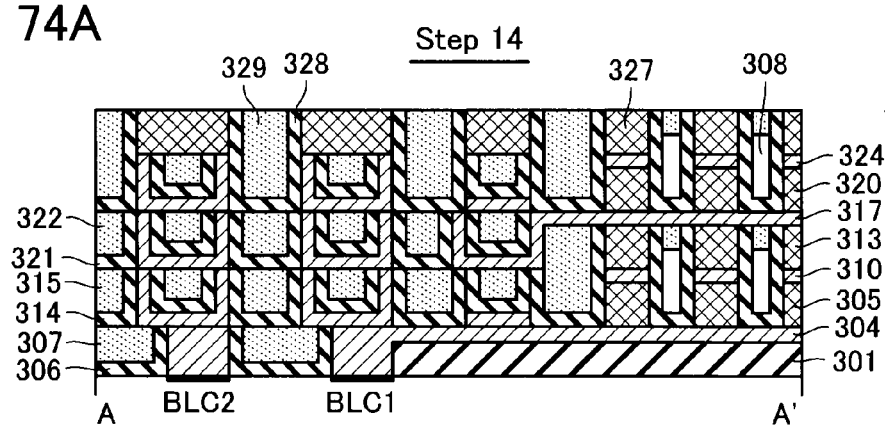
FIGS. 74A to 74D show A-A', B-B', C-C' and D-D' sectional views at step 14 in the embodiment.
Figure 74B:
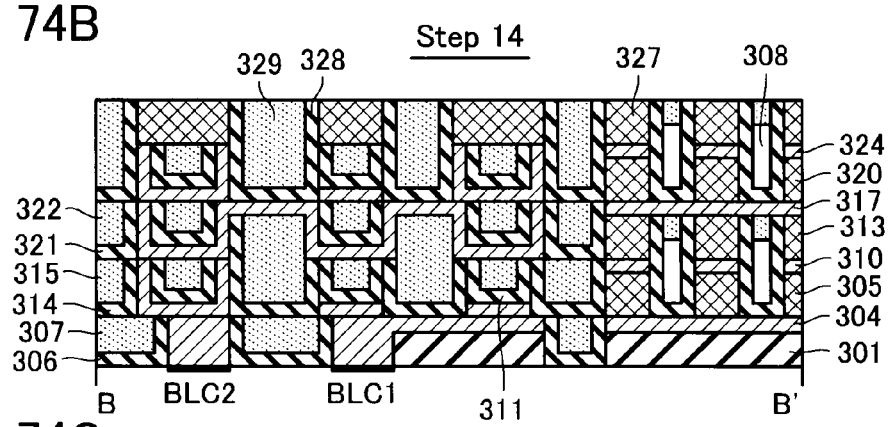
Figure 74C:
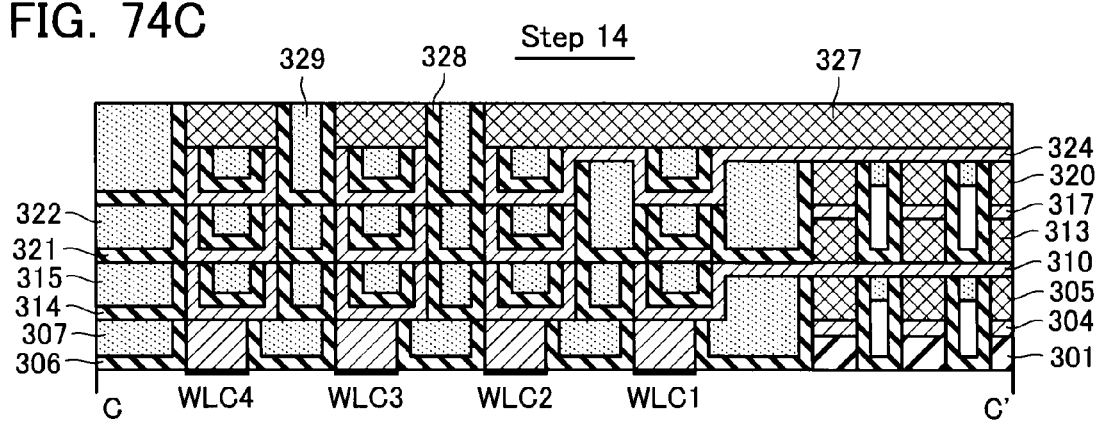
Figure 74D:
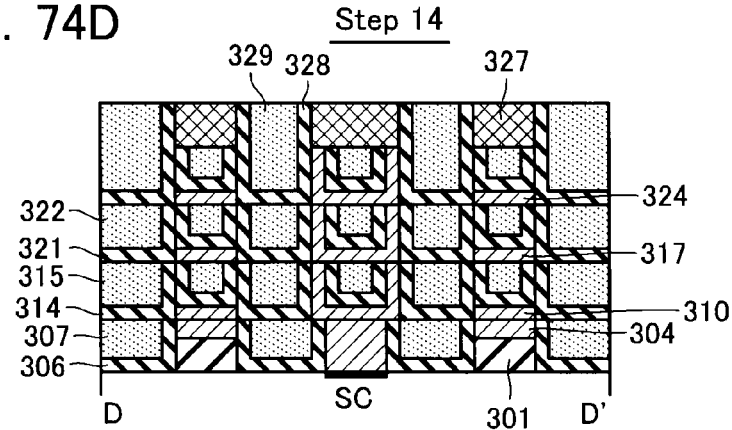

In this case, large holes located on the periphery of the cell array area will be embedded sufficiently with SOG film 307. By contrast, it is allowed that small trenches between cells in the cell array area are not sufficiently embedded to the bottom. That is, when exposing the memory cell layers, if a planed surface is obtained as sufficiently serving as a basic surface, on which the following memory cell layer is to be deposited, the others are not required. Therefore, there are generated voids 308 between bit lines, between word lines and between cells as shown in FIG. 62C. These voids 308 serve for reducing the thermal and electric influences between cells. Thereafter, the resultant surface will be planarized by a CMP process.

Following it, a stacked structure of metal pieces is constructed at BL contact portions BLC1, BLC2 and WL contact portions WLC1-WLC4 for constituting a vertical wiring. In this case, SOG films are removed finally, and vertical wirings are supported in a hollowed state. To achieve this supporting structure, concave silicon nitride film 306 serves as an insulating and supporting piece.

Step 3 (FIGS. 63A-63D)

Following the step 2, etch the resultant surface to expose the 1st metal layer 304 by IE etching with the (3) 2nd contact trench pattern shown in FIGS. 25 and 28. As a result, stripe-shaped contact trenches 309 are formed at the contact portions BLC1, BLC2 and WLC1-WLC4. Dotted lines in FIGS. 63A-63D designate the mask-set position.

Step 4 (FIGS. 64A-64D)

Deposit 2nd metal layer 310 on the cell array surface and the trench surface with a uniform thickness, and then deposit CVD silicon nitride film 311 on the trench surface with a uniform thickness. Following it, SOG film 312 is deposited on the resultant surface to be buried in trenches, and it is planarized by a CMP process to expose the metal layer 310.

As a result, silicon nitride film 311 is remained as concave silicon nitride pieces, which serve as insulating and supporting pieces for supporting the vertical wiring portions to be hollowed finally at the respective contact portions BLC1, BLC2, WLC1-WLC4 and SC.

Step 5 (FIGS. 65A-65D)

Deposit memory cell layer 313 on the surface of the 2nd metal layer 310, and etch the memory cell layer 313 and the 2nd metal layer 310 by IE etching to expose the 1st metal layer 304. As a result, metal lines (word lines) and other contact patterns are obtained. That is, word lines are patterned in such a state that memory cell layers 313 are stacked thereon, and the first memory cell layers 305 are simultaneously patterned to be remained as cross-point cells only at the cross-points between the first bit lines and the word lines.

Step 6 (FIGS. 66A-66D)

Deposit silicon nitride film 314 uniformly on the concave surface, following it deposit SOG film 315. SOG film 315 is planarized and buried between metal lines with the memory cell layers 313 stacked and exposed. Silicon nitride film 341 will be remained as supporting pieces for supporting the hollowed structure when SOG film 315 is finally removed.

Large holes located on the periphery of the cell array area will be embedded sufficiently with SOG film 315. By contrast, it is allowed that small trenches between cells in the cell array area are not sufficiently embedded to the bottom. That is, when exposing the memory cell layers, if a planed surface is obtained as sufficiently serving as a basic surface, on which the following memory cell layer is to be deposited, the others are not required. Therefore, there are generated new voids 308 between cells. These voids 308 serve for reducing the thermal and electric influences between cells.

At this stage after finishing the step 6, metal layer 310 stacked on the first metal layer is divided into multiple concave metal pieces 310a, which are dispersedly arranged in the elongated direction in the respective trenches formed at the contact portions BLC1, BLC2, WLC1-WLC4 and the like. Further, additional metal pieces are sequentially stacked on these metal pieces in the successive cell array steps, so that vertical wirings will be constituted.

Further, at this stage, silicon nitride films 306, 311 and 314 are remained on the internal and external walls of the concave metal pieces 310a. These nitride films will be remained as insulating and supporting pieces for supporting the metal pieces 310a after SOG films 307 and 312 are removed finally. The peripheral metal lines, which are disposed for coupling the bit lines, word lines to the vertical wirings, are also supported with the concave silicon nitride film 306 in the hollowed state.

Step 7 (FIGS. 67A-67D)

Following the step 6, etch the resultant surface to expose the 2nd metal layer 310 by IE etching with the (3) 2nd contact trench pattern shown in FIGS. 25 and 28, thereby forming stripe-shaped contact trenches 316 at the contact portions BLC1, BLC2, WLC1-WLC4 and contact holes 316 at contact portion SC.

Step 8 (FIGS. 68A-68D)

Deposit 3rd metal layer 317 on the cell array surface and the trench surface with a uniform thickness, and then deposit CVD silicon nitride film 318 on the trench surface with a uniform thickness. Following it, SOG film 319 is deposited on the resultant surface to be buried in trenches, and it is planarized by a CMP process to expose the metal layer 317.

Step 9 (FIGS. 69A-69D)

Deposit memory cell layer 320 on the surface of the 3rd metal layer 317, and etch the memory cell layer 320 and the 3rd metal layer 317 by IE etching to expose the 2nd metal layer 310 with the (5) 3rd metal line pattern shown in FIGS. 26 and 29. As a result, metal lines (bit lines) and other contact patterns are obtained. At this stage, two concave metal pieces 310a and 317a are stacked at the vertical wiring portions.

Step 10 (FIGS. 70A-70D)

Deposit silicon nitride film 321 uniformly on the concave surface, following it deposit SOG film 322. SOG film 322 is planarized and buried between metal lines with the memory cell layers 320 stacked and exposed. In the SOG film deposit step, new voids 308 are generated between cells (refer to C-C' sectional view shown in FIG. 70C).

Step 11 (FIGS. 71A-71D)

Following the step 10, etch the resultant surface to expose the 3rd metal layer 317 by IE etching with the (3) 2nd contact trench pattern shown in FIGS. 25 and 28, thereby forming stripe-shaped trenches 323 at the contact portions BLC1, BLC2, WLC1-WLC4 and SC.

Step 12 (FIGS. 72A-72D)

Deposit 4th metal layer 324 on the cell array surface and the trench surface with a uniform thickness, and then deposit CVD silicon nitride film 325 on the trench surface with a uniform thickness. Following it, SOG film 326 is deposited on the resultant surface to be buried in trenches, and it is planarized by a CMP process to expose the metal layer 324.

Step 13 (FIGS. 73A-73D)

Deposit memory cell layer 327 on the surface of the 4th metal layer 324, and etch the memory cell layer 327 and the 4th metal layer 324 by IE etching to expose the 3rd metal layer 317 with the (6) 4th metal line pattern shown in FIGS. 26 and 29. As a result, metal lines (word lines) and other contact patterns are obtained. At this stage, the 3rd concave metal pieces 324a are stacked at the vertical wiring portions.

Step 14 (FIGS. 74A-74D)

Figure 75A:
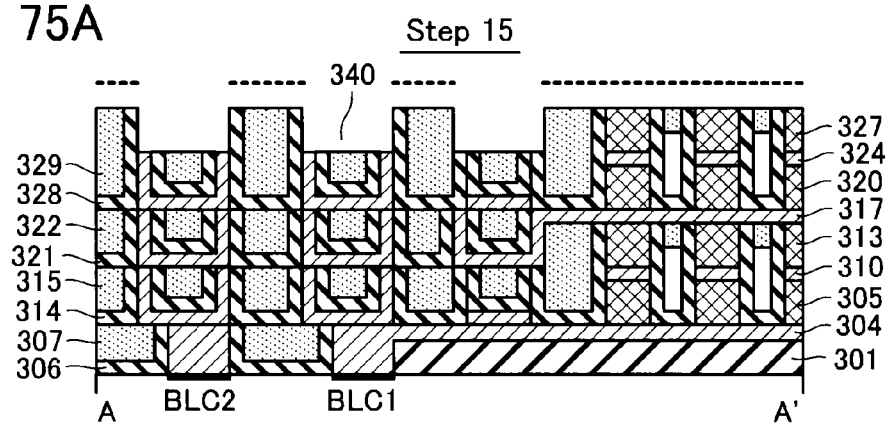
FIGS. 75A to 75D show A-A', B-B', C-C' and D-D' sectional views at step 15 in the embodiment.
Figure 75B:
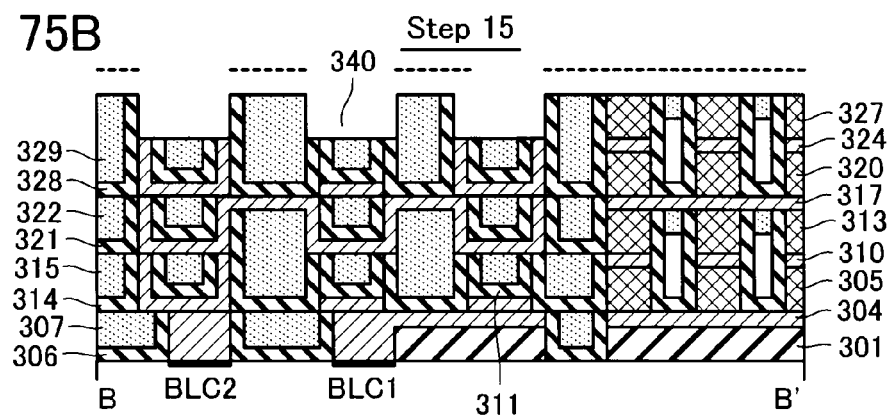
Figure 75C:
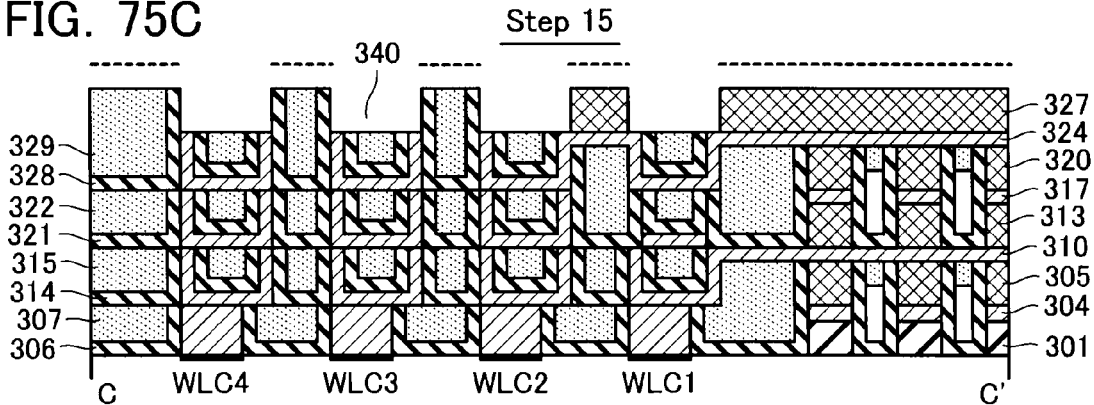
Figure 75D:
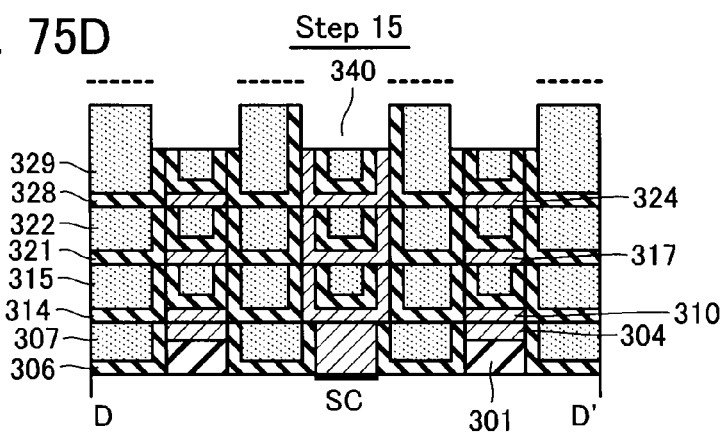
Figure 76C:
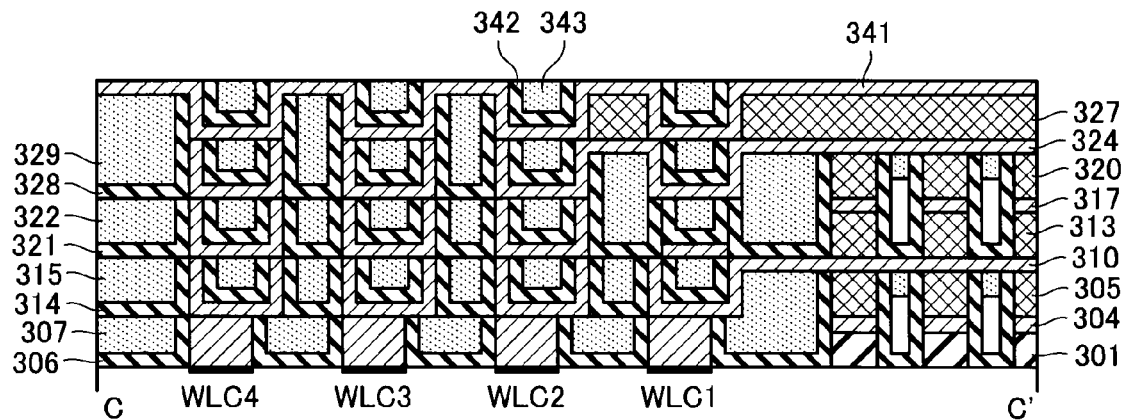
Figure 76D:
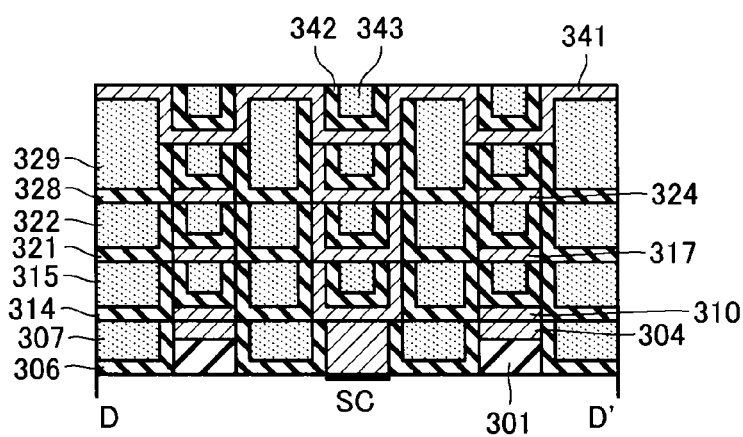
Figure 77A:
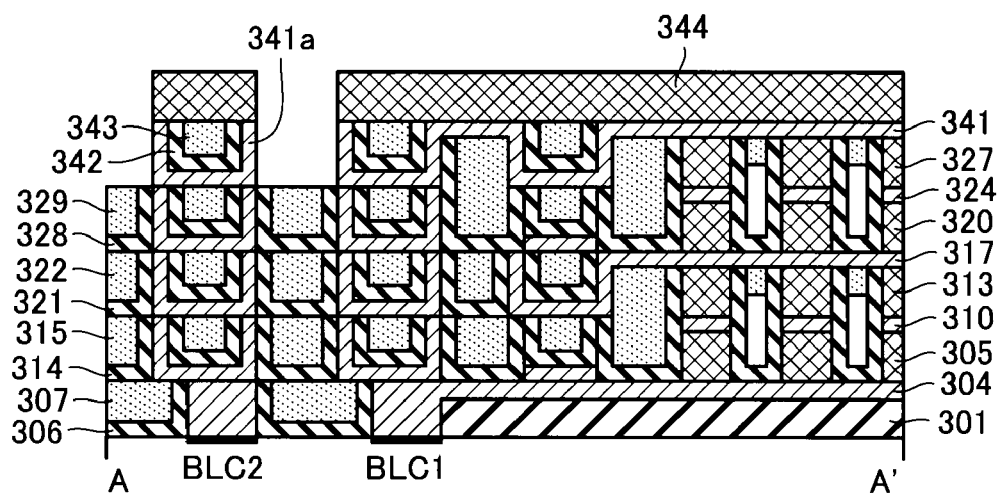
FIGS. 77A to 77D show A-A', B-B', C-C' and D-D' sectional views at step 17 in the embodiment.
Figure 77B:
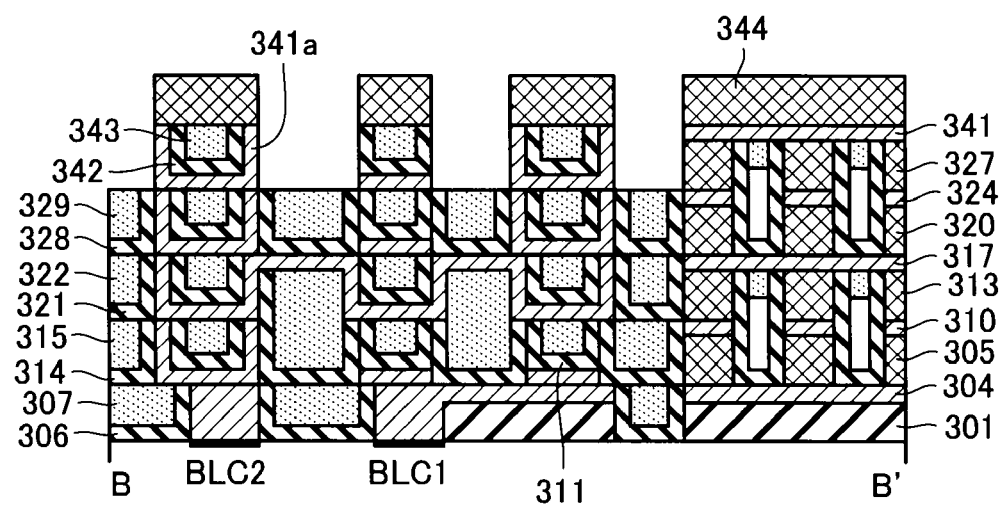
Figure 77C:
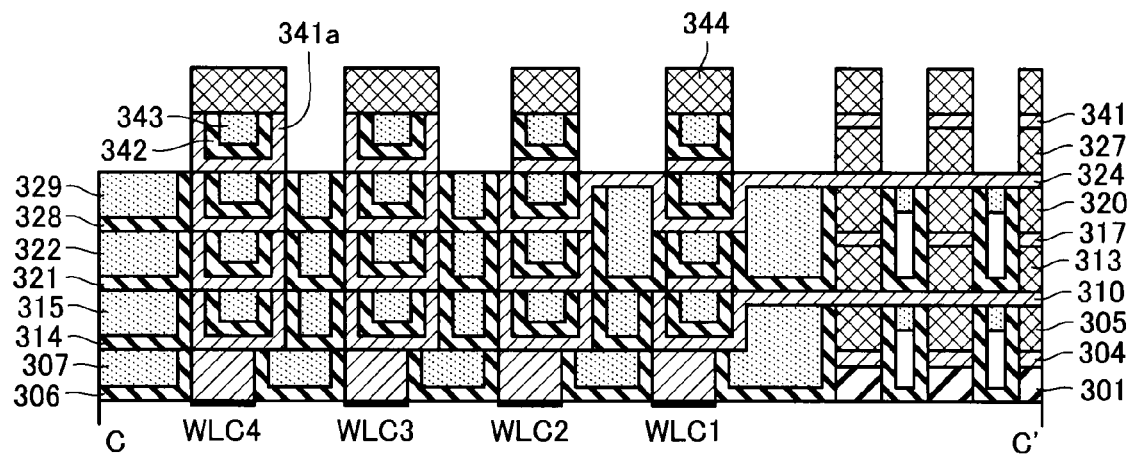
Figure 77D:
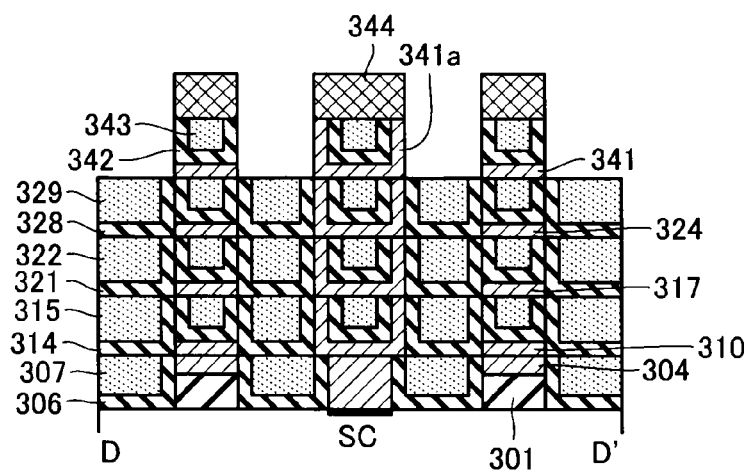
Figure 78A:
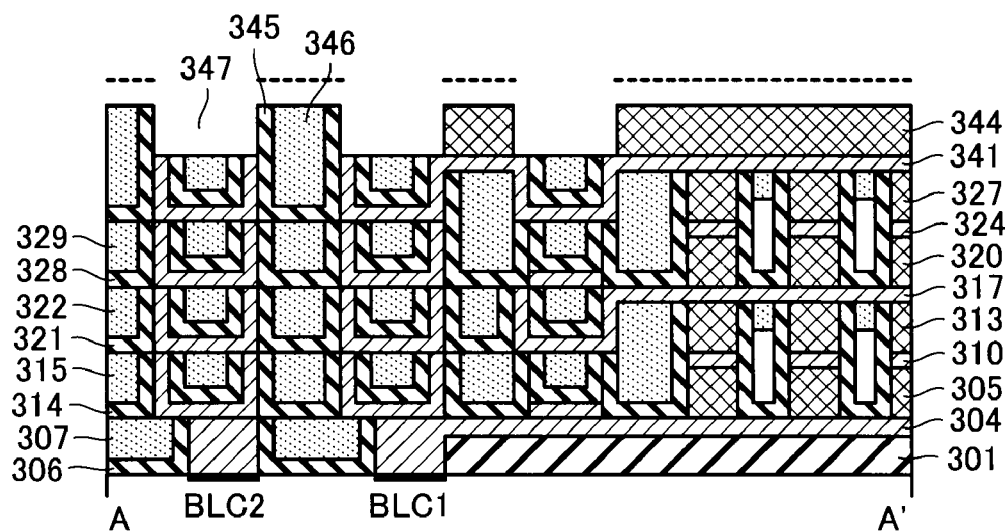
FIGS. 78A to 78D show A-A', B-B', C-C' and D-D' sectional views at step 18 in the embodiment.
Figure 78B:
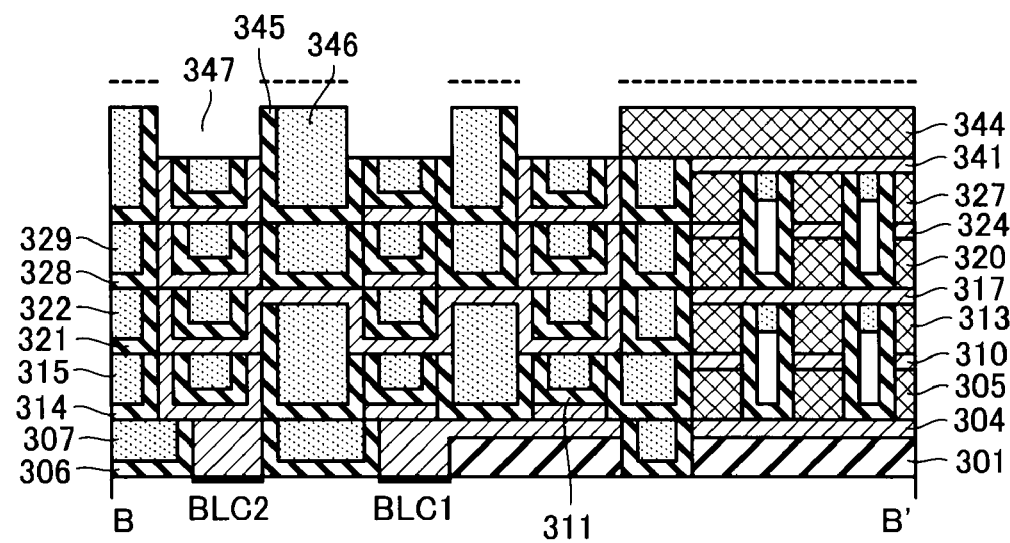
Figure 78C:
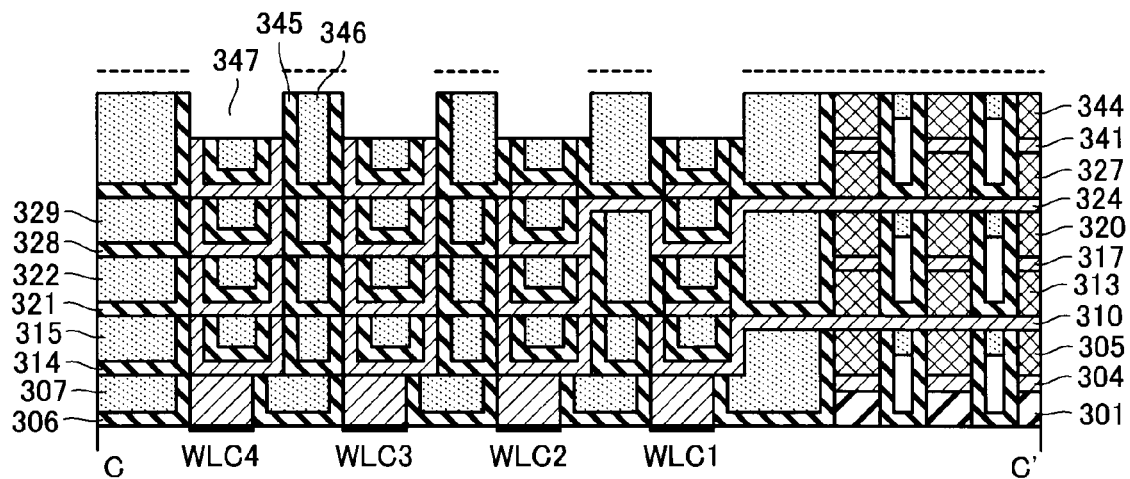
Figure 78D:
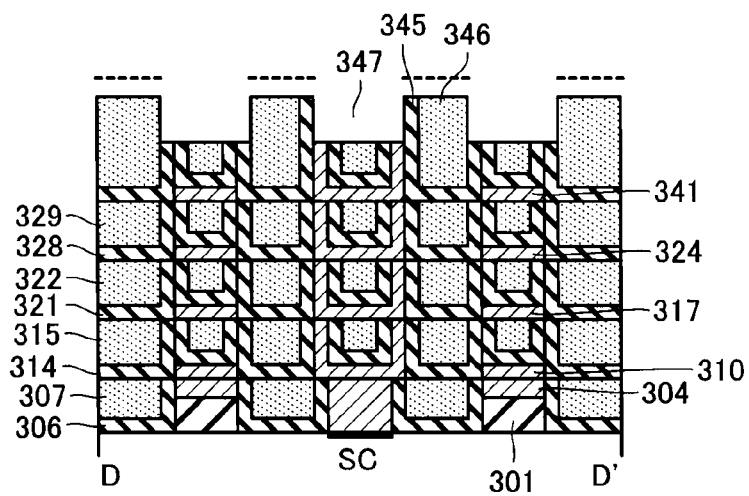
Figure 79A:
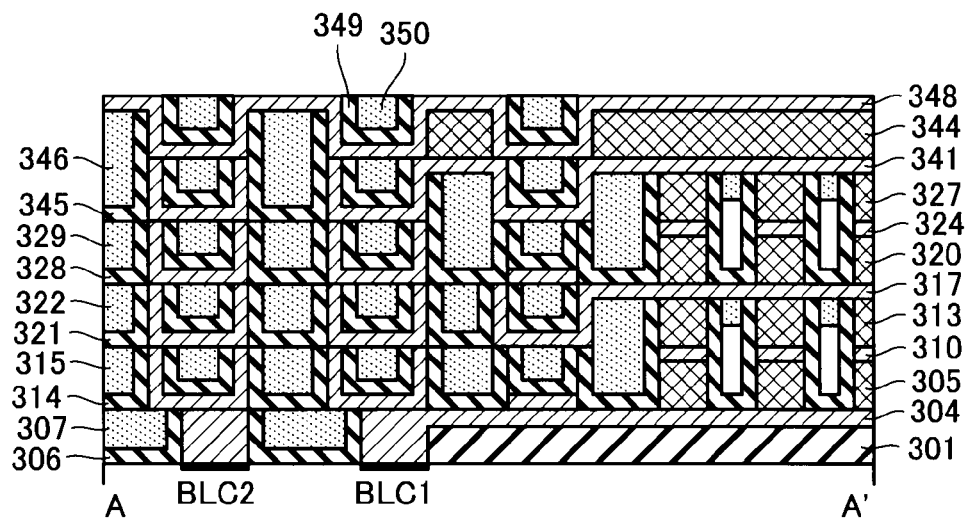
FIGS. 79A to 79D show A-A', B-B', C-C' and D-D' sectional views at step 19 in the embodiment.
Figure 79B:
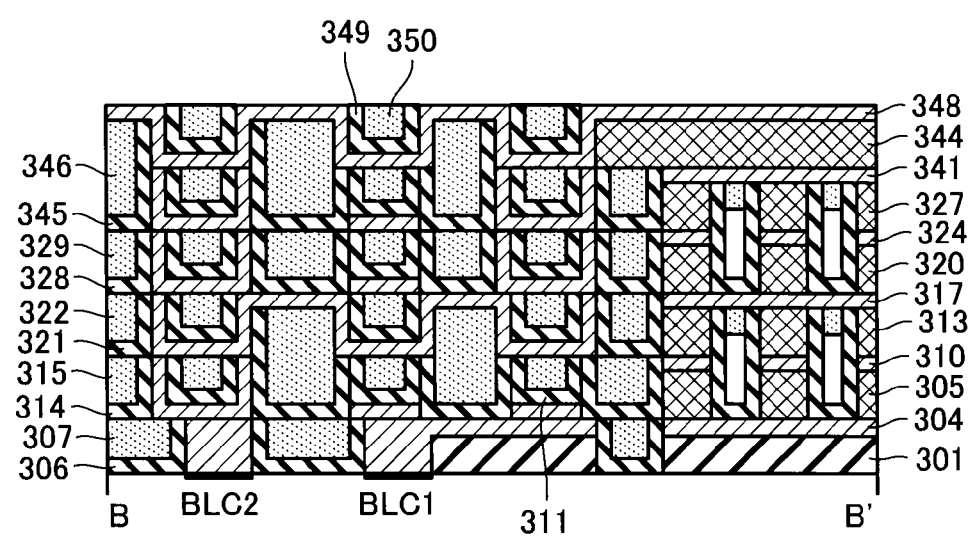
Figure 79C:
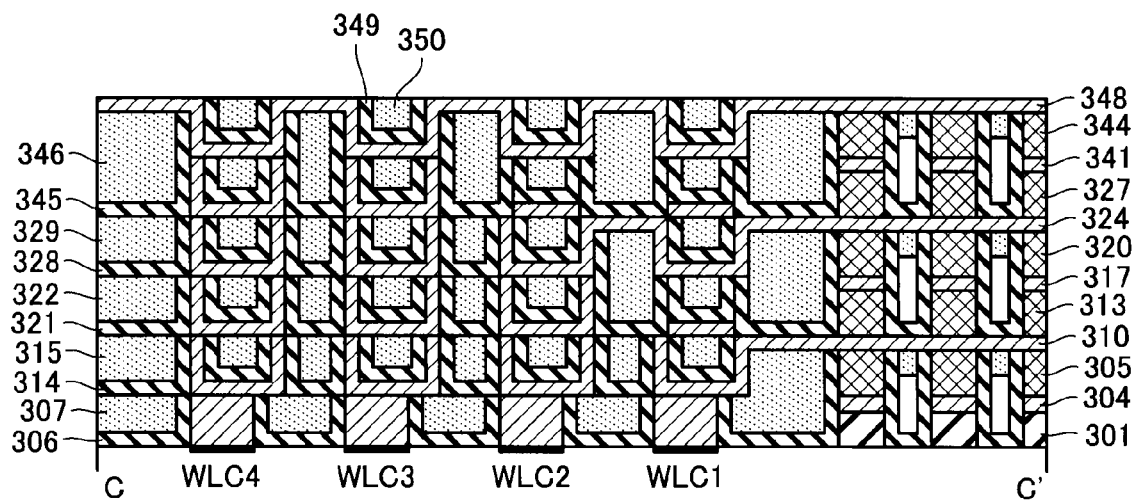
Figure 79D:
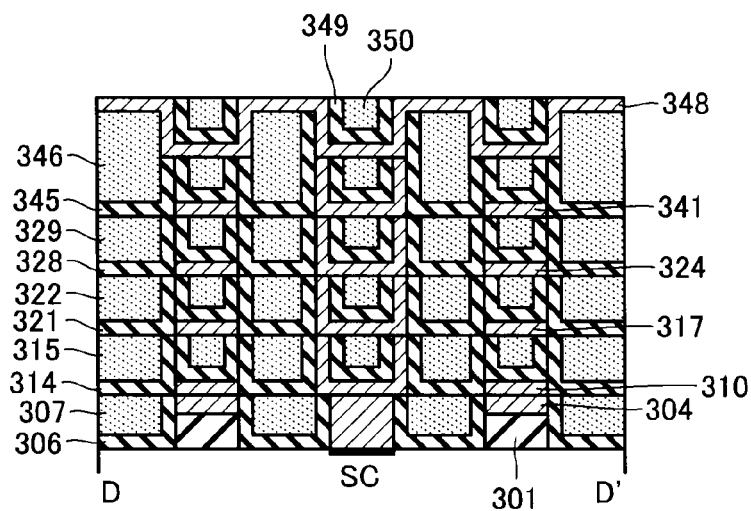
Figure 80A:
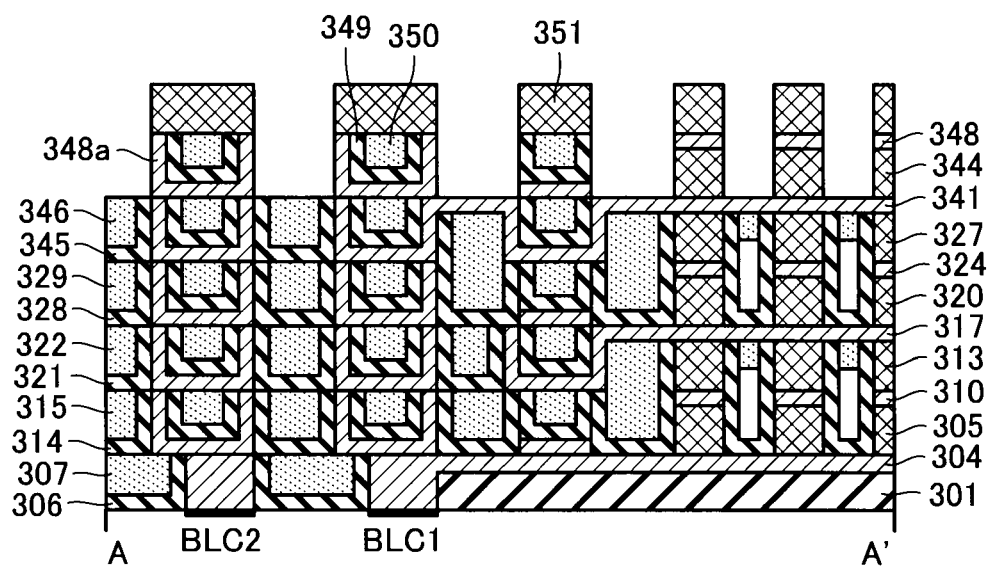
FIGS. 80A to 80D show A-A', B-B', C-C' and D-D' sectional views at step 20 in the embodiment.
Figure 80B:
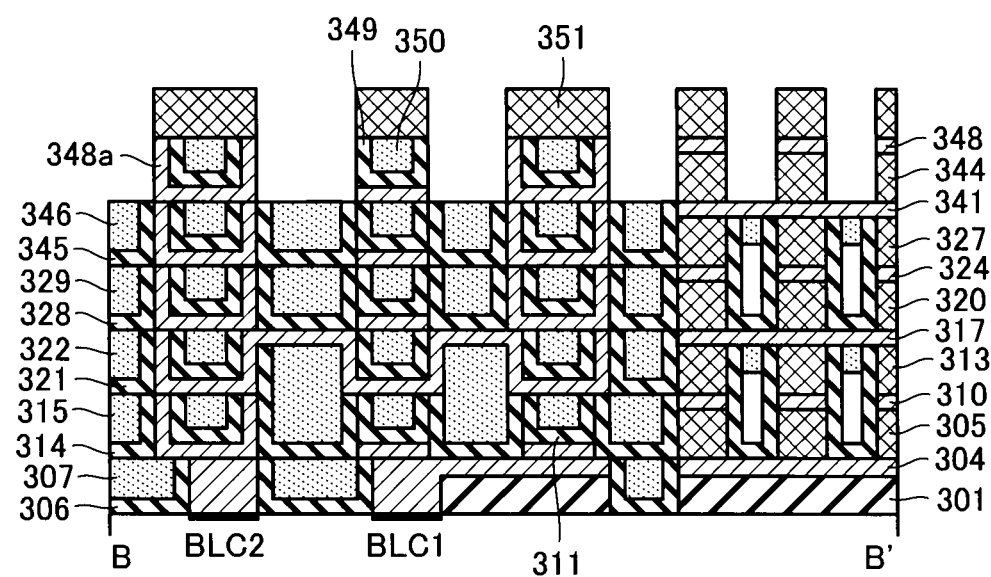
Figure 80C:
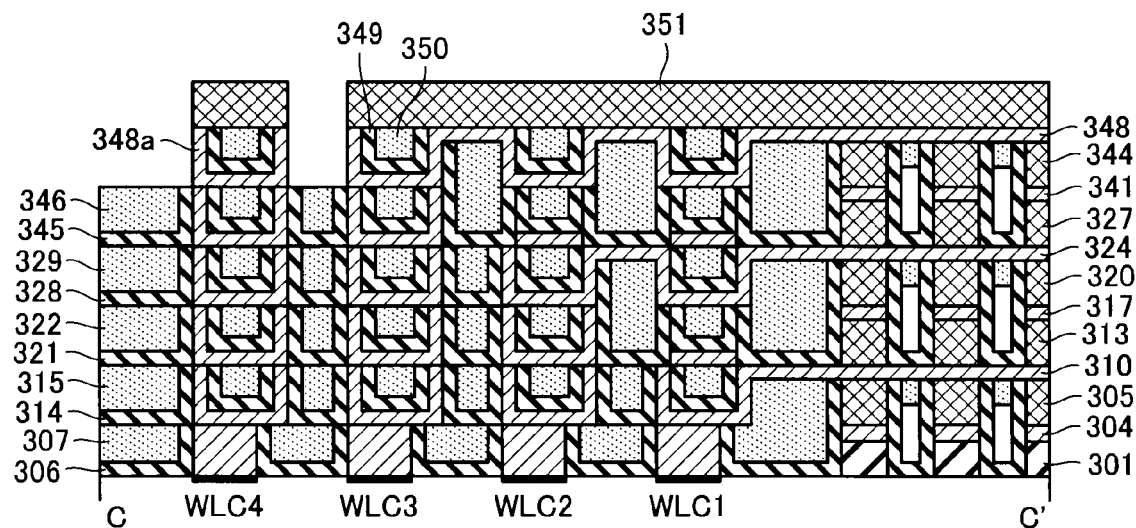
Figure 80D:
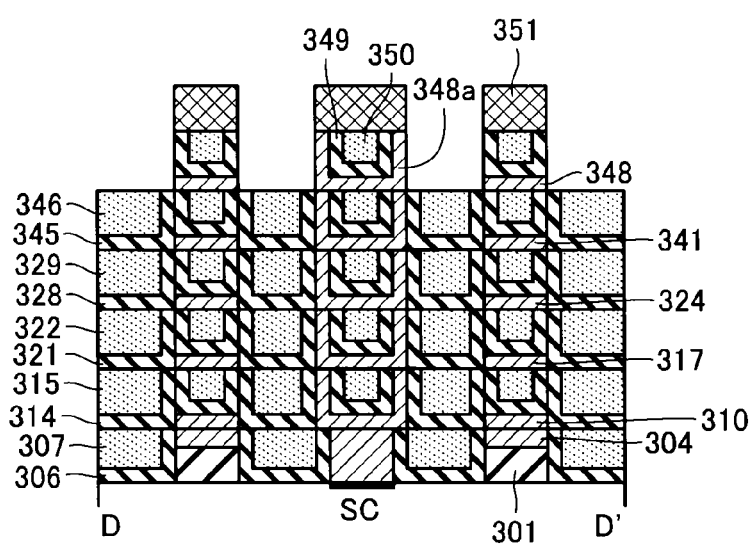
Figure 81A:
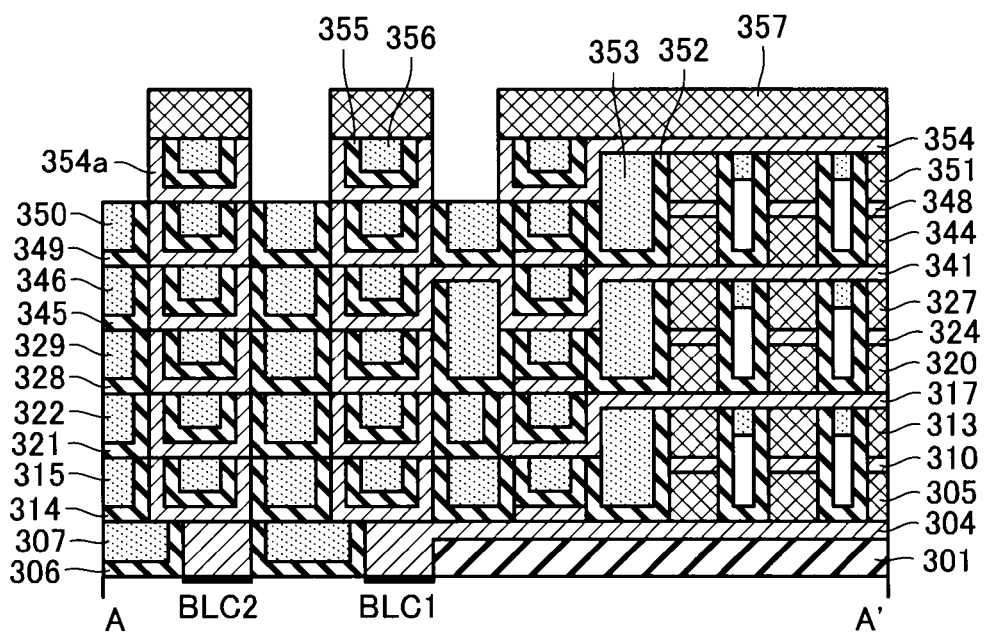
FIGS. 81A to 81D show A-A', B-B', C-C' and D-D' sectional views at step 21 in the embodiment.
Figure 81B:
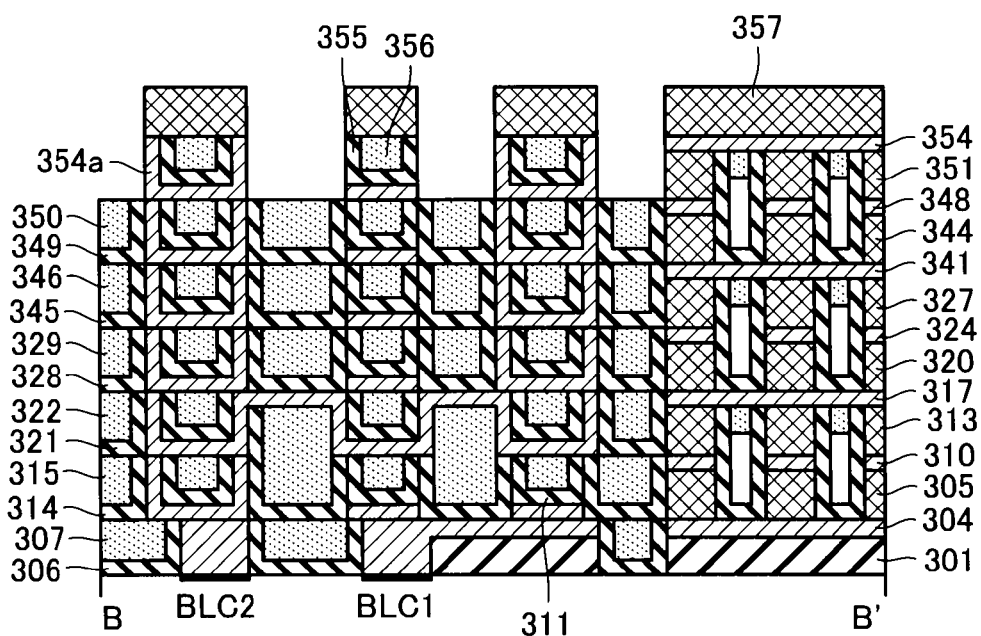
Figure 81C:
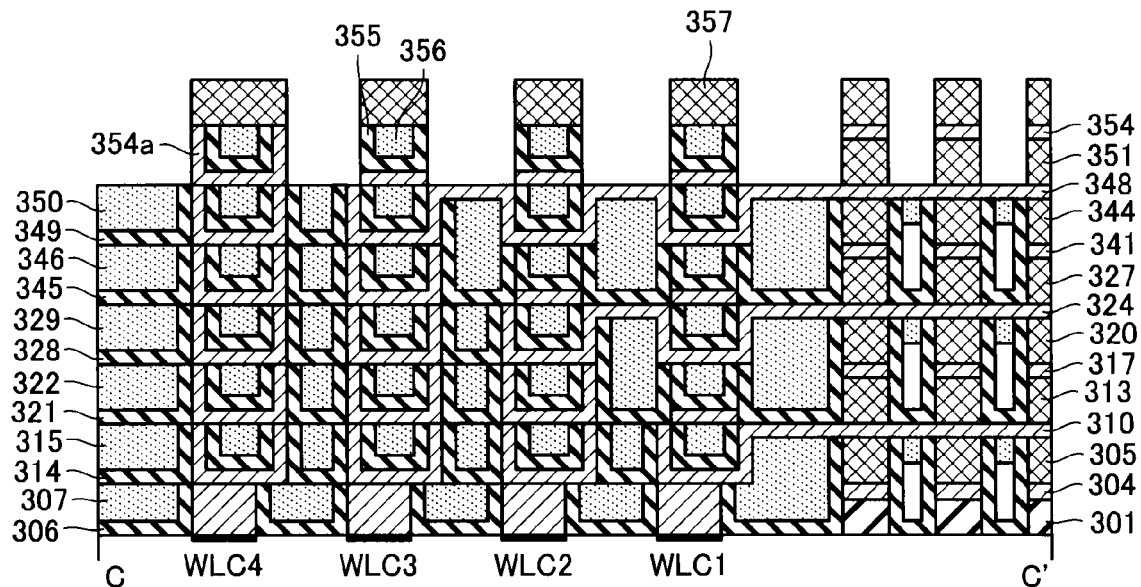
Figure 81D:
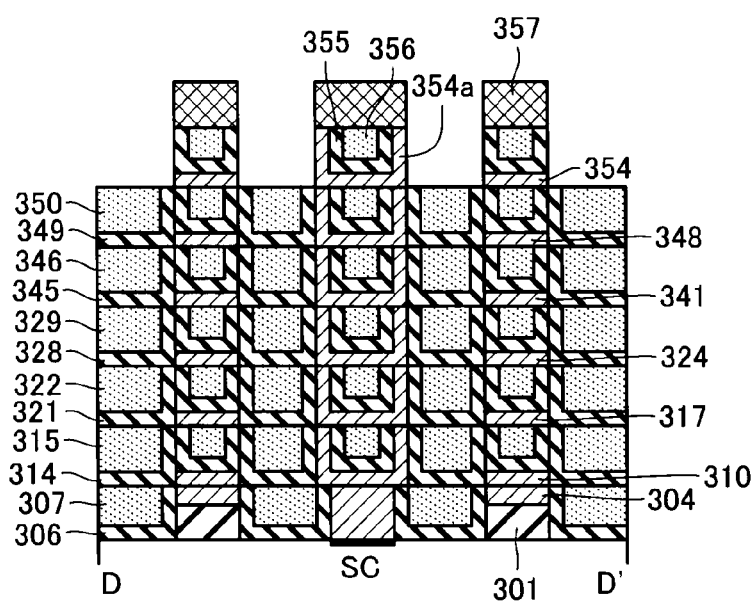

Deposit silicon nitride film 328 uniformly on the concave surface, following it deposit SOG film 329. SOG film 329 is planarized and buried between metal lines with the memory cell layers 327 stacked and exposed. In the SOG film deposit step, new voids 308 are generated between cells (refer to A-A' sectional view shown in FIG. 74A and B-B' sectional view shown in FIG. 75B).

Step 15 (FIGS. 75A-75D)

Following the step 14, etch the resultant surface to expose the 4th metal layer 324 by IE etching with the (3) 2nd contact trench pattern shown in FIGS. 25 and 28, thereby forming stripe-shaped trenches 340 at the contact portions BLC1, BLC2, WLC1-WLC4 and SC.

Step 16 (FIGS. 76A-76D)

Deposit 5th metal layer 341 on the cell array surface and the trench surface with a uniform thickness, and then deposit CVD silicon nitride film 342 on the trench surface with a uniform thickness. Following it, SOG film 343 is deposited on the resultant surface to be buried in trenches, and it is planarized by a CMP process to expose the metal layer 341.

Step 17 (FIGS. 77A-77D)

Deposit memory cell layer 344 on the surface of the 5th metal layer 341, and etch the memory cell layer 344 and the 5th metal layer 341 by IE etching to expose the 4th metal layer with the (7) 5th metal line pattern shown in FIGS. 26 and 29. As a result, metal lines (third bit lines) and other contact patterns are obtained. At this stage, the 4th concave metal pieces 341a are stacked at the vertical wiring portions.

Step 18 (FIGS. 78A-78D)

Following the step 17, deposit silicon nitride film 345 uniformly on the concave surface, and then deposit SOG film 346. SOG film 346 is planarized and buried between metal lines with the memory cell layers 344 stacked and exposed. Further, etch the resultant surface with the 2nd contact trench pattern to form trenches 347 so as to expose the 5th metal layer 341.

Step 19 (FIGS. 79A-79D)

Deposit 6th metal layer 348 on the cell array surface and the trench surface with a uniform thickness, and then deposit CVD silicon nitride film 349 on the trench surface with a uniform thickness. Following it, SOG film 350 is deposited on the resultant surface to be buried in trenches, and it is planarized by a CMP process to expose the metal layer 348.

Step 20 (FIGS. 80A-80D)

Deposit memory cell layer 351 on the surface of the 6th metal layer 348, and etch the memory cell layer 351 and the 6th metal layer 348 by IE etching to expose the 5th metal layer with the (8) 6th metal line pattern shown in FIGS. 26 and 29. As a result, metal lines (third word lines) and other contact patterns are obtained. At this stage, the 5th concave metal pieces 348a are stacked at the vertical wiring portions.

Step 21 (FIGS. 81A-81D)

Following the step 20, sequential processes are performed as follows: depositing silicon nitride film 352; coating and planarizing SOG film 353; depositing 7th metal layer 354; depositing silicon nitride film 355; and coating and planarizing SOG film 356. Thereafter, deposit memory cell layer 357 on the resultant surface, on which the 7th metal layer 354 is exposed, and etch the memory cell layer 357 and 7th metal layer 354 by IE etching with the (9) 7th metal line patter shown in FIGS. 27 and 30 to expose the 6th metal layer. As a result, 4th bit lines and other contact patterns are formed. 6th concave metal pieces 354a are stacked at the vertical wiring portions.

Figure 82A:
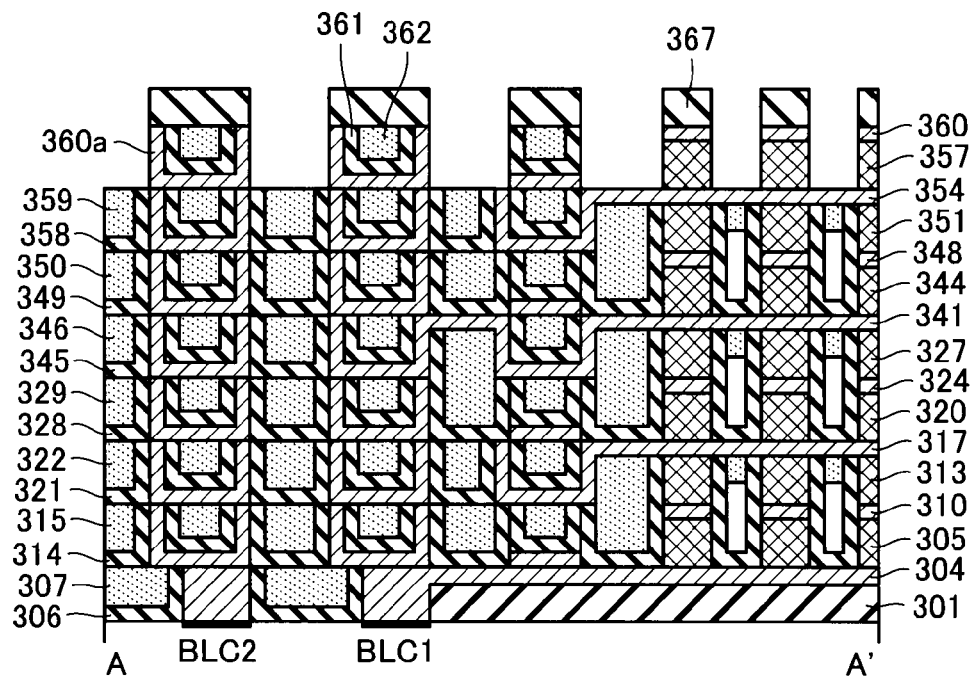
FIGS. 82A to 82D show A-A', B-B', C-C' and D-D' sectional views at step 22 in the embodiment.
Figure 82B:
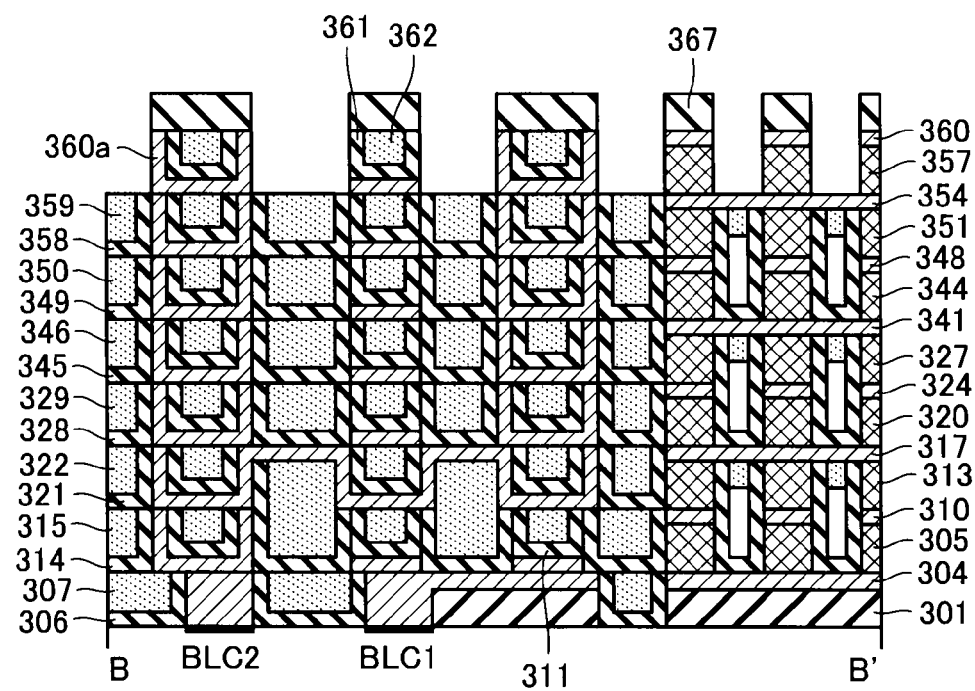
Figure 82C:
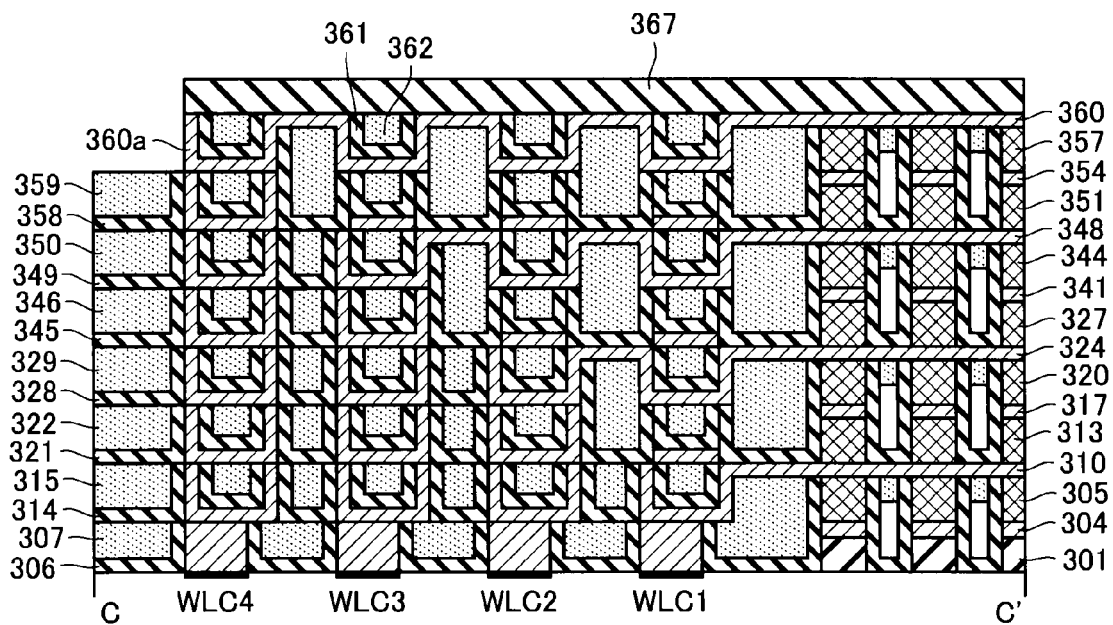
Figure 82D:
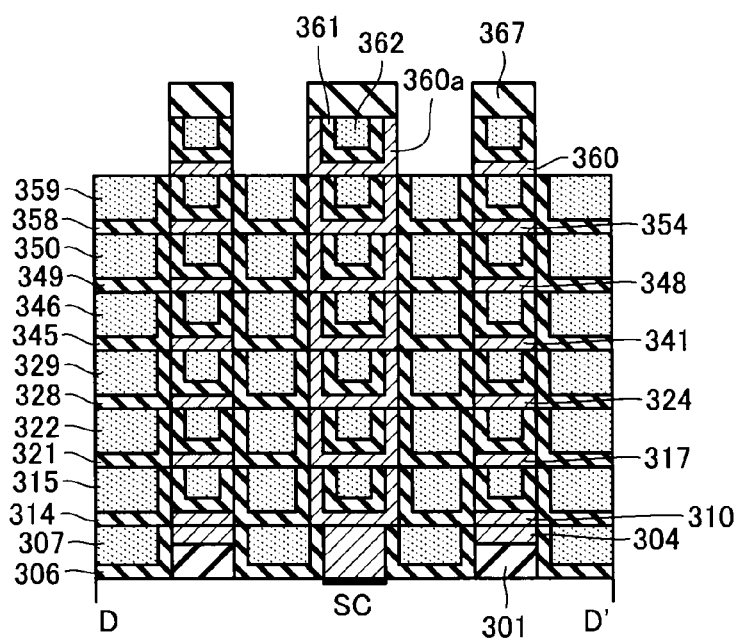
Figure 83A:
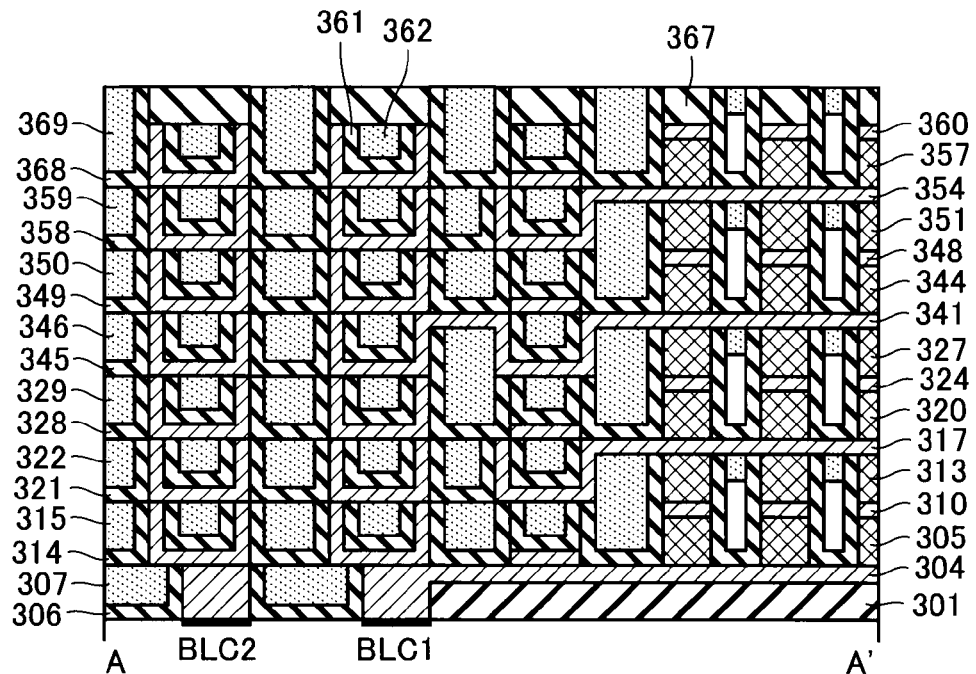
FIGS. 83A to 83D show A-A', B-B', C-C' and D-D' sectional views at step 23 in the embodiment.
Figure 83B:
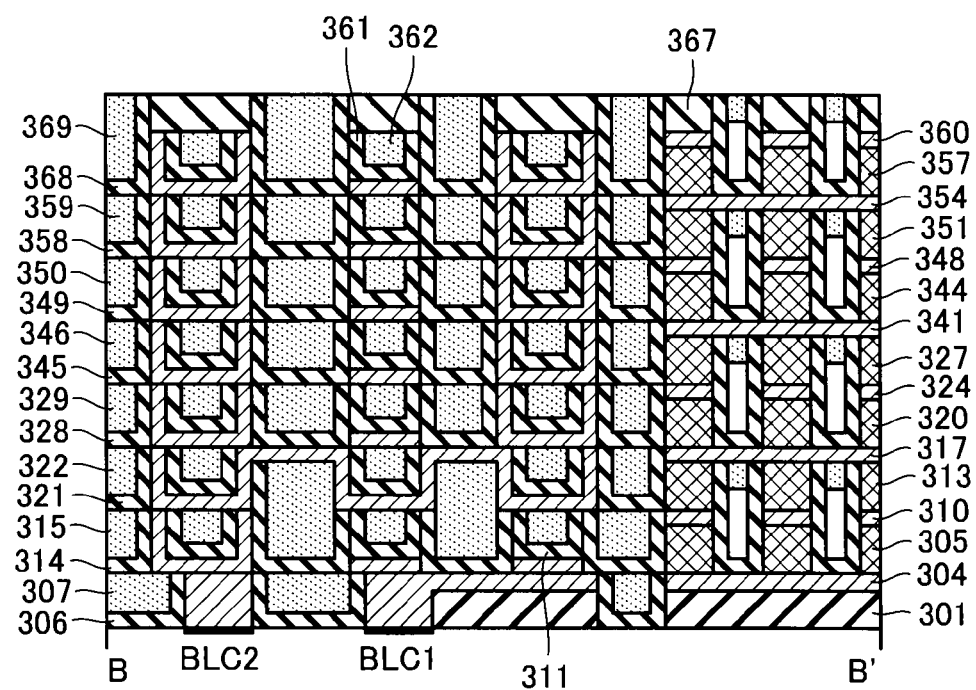
Figure 83C:
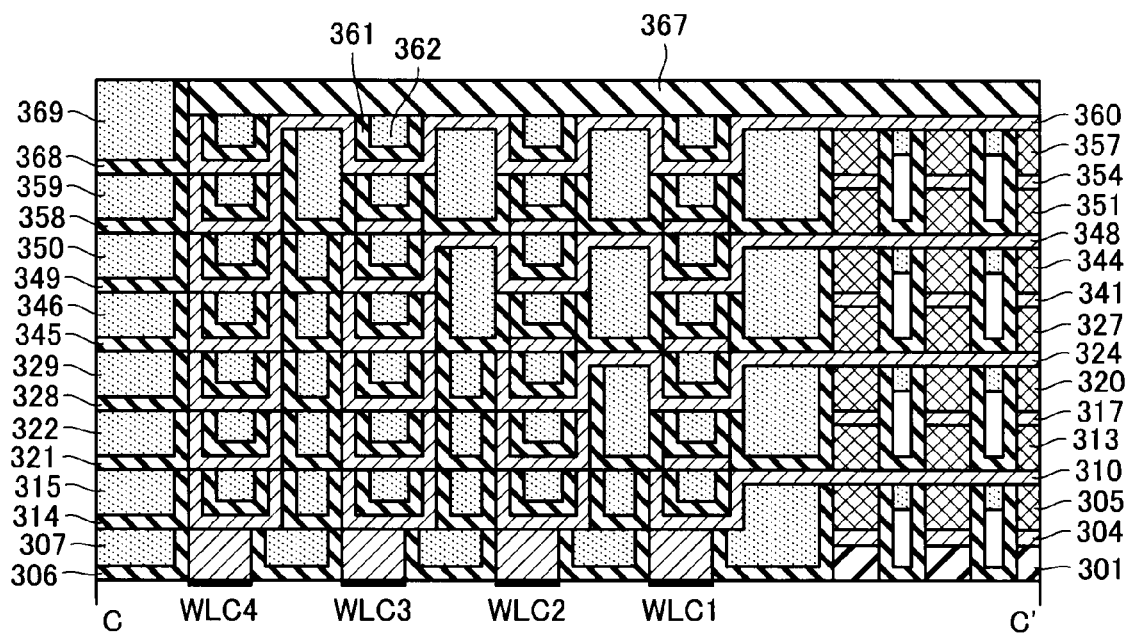
Figure 83D:
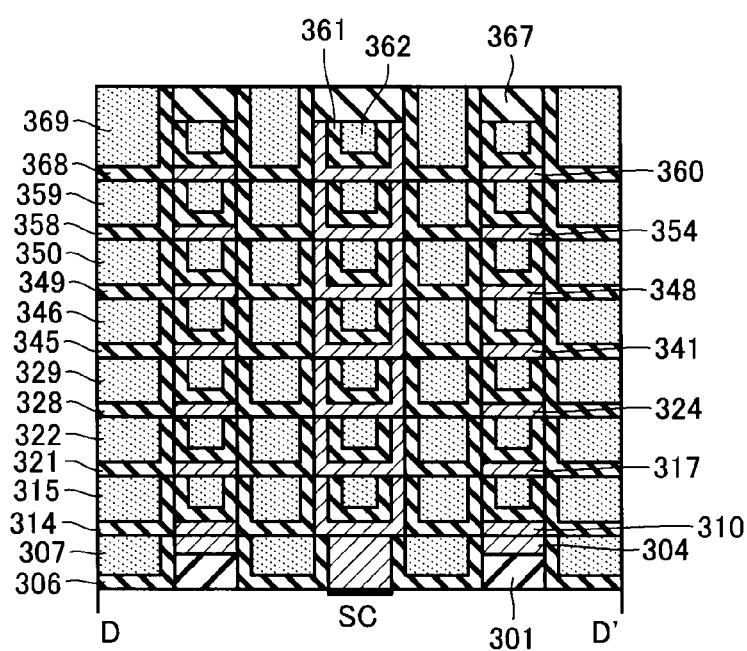

Step 22 (FIGS. 82A-82)

Following the step 21, sequential processes are performed as follows: depositing silicon nitride film 358; coating and planarizing SOG film 359; depositing 8th metal layer 360; depositing silicon nitride film 361; and coating and planarizing SOG film 362. Thereafter, deposit silicon nitride film 367 as a passivation film on the 8th metal layer, and etch the nitride film 367, metal layer 360 and memory cell layer 357 by IE etching with (10) 8th metal line pattern shown in FIGS. 27 and 30. As a result, 4th word lines and other contact patterns are formed. 7th concave metal pieces 360a are stacked at the vertical wiring portions.

Step 23 (FIGS. 83A-83D)

Deposit silicon nitride film 368 uniformly on the resultant surface, and deposit and planarize SOG film 369. As a result, it will be obtained a surface to be deposited with the uppermost metal layer.

Step 24 (FIGS. 84A to 84D)

Figure 84A:
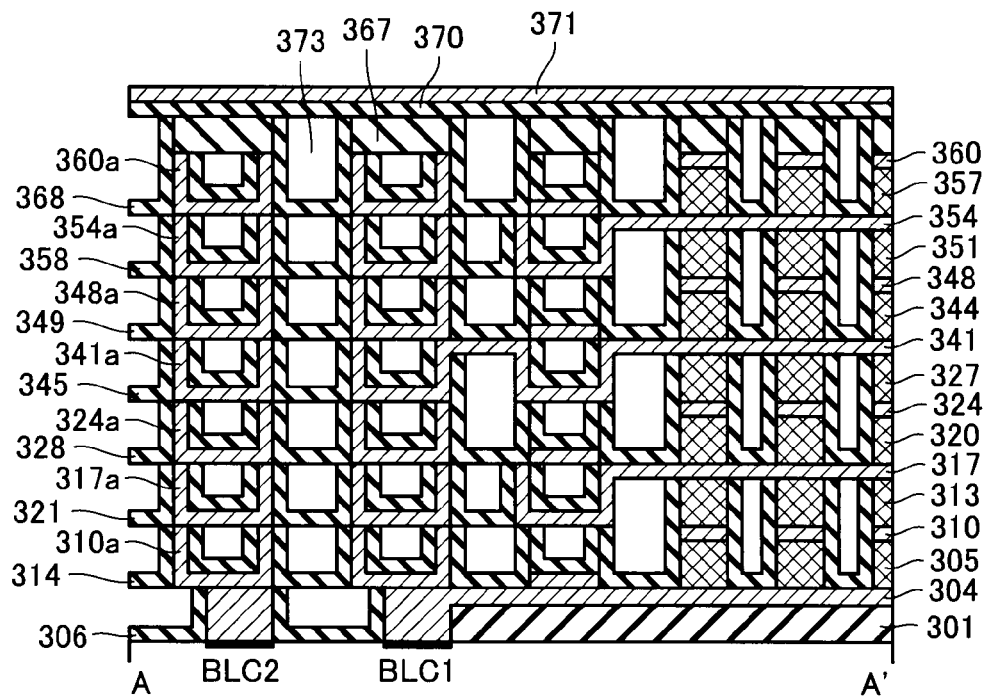
FIGS. 84A to 84D show A-A', B-B', C-C' and D-D' sectional views at step 24 in the embodiment.
Figure 84B:
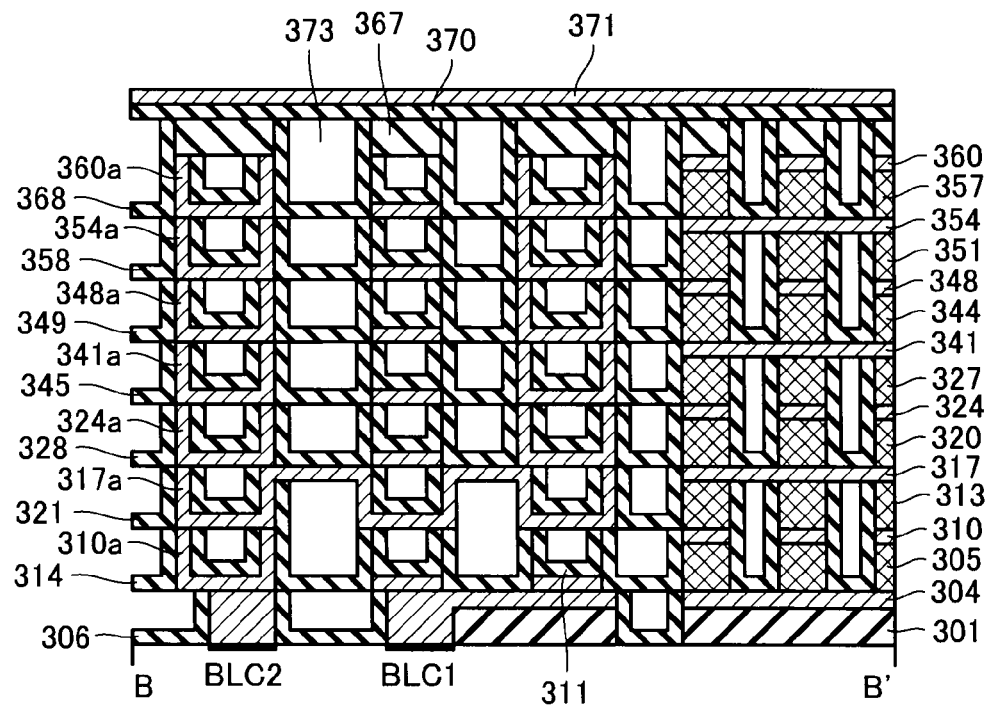
Figure 84C:
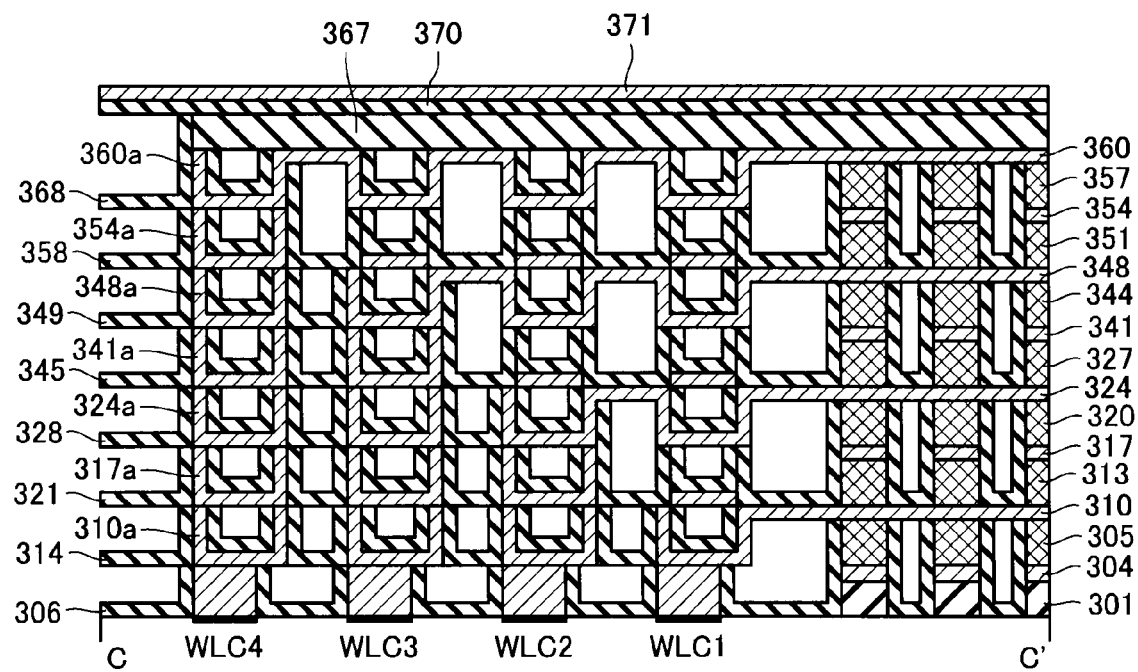
Figure 84D:
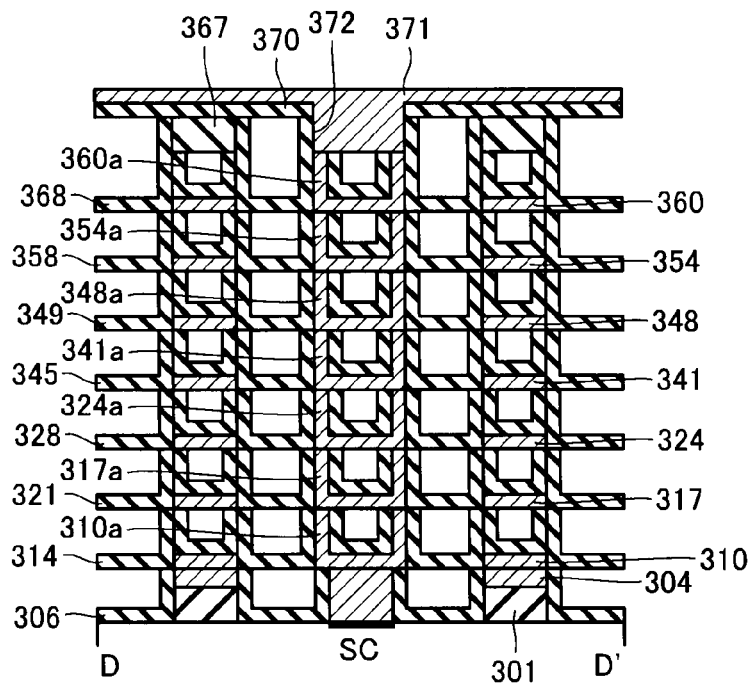

Silicon nitride film 370 is deposited as the uppermost insulating film, and contact hole 372 are formed for coupling the uppermost metal line to the Si substrate as shown in D-D' sectional view shown in FIG. 84D. Thereafter, metal layer 371 is deposited and patterned to metal lines.

Then, remove SOG films by a CDE process well-known as an isotropic etching method, thereby hollowing the cell array. As shown in FIGS. 84A to 84D, all SOG films are removed, and such a hollowed structure is obtained that vertical wirings are supported with silicon nitride supporting pieces.

Explaining in detail, each the vertical wiring is formed of multiple concave metal pieces stacked, and silicon nitride films deposited on the inner walls and outer walls of the metal pieces serve as supporting pieces for supporting the metal pieces after removing the SOG films. Further, peripheral metal lines disposed for coupling the bit lines, word lines to the vertical wirings, are also supported with the concave silicon nitride film in the partially hollowed state. It should be noted that it is not necessary to remove the SOG films perfectly, i.e., it is not necessary to hollow the cell array perfectly.

This invention is not limited to the above-described embodiment. For example, while it has been explained a ReRAM with a 3D-cell array, it should be appreciated that the present invention is adapted to other kinds of memory devices. Further, assuming that the memory cell is referred to as a functional device in general, the present invention may be adapted to such an integrated circuit device that functional devices are arranged three-dimensionally. Further, it will be understood by those skilled in the art that various changes in form and detail may be made without departing from the spirit, scope, and teaching of the invention.

What is claimed is:

1. A semiconductor integrated circuit device comprising:
a semiconductor substrate on which a circuit is formed;
a plurality of cell arrays stacked on the semiconductor substrate in such a manner that first metal lines and second metal lines crossing each other are repeatedly stacked with memory cells disposed at the respective cross-points of the first and second metal lines;
interlayer insulating films buried between the first and second metal lines and between memory cells arranged laterally; and
vertical wirings so disposed outside of the cell arrays as to couple the first and second metal lines of the cell arrays to the circuit, the vertical wirings being formed of multi-layered metal pieces buried in the interlayer insulating films, wherein
the multi-layered metal pieces are patterned from the same metal layers as the first and second metal lines, each layer of the multi-layered metal pieces has multiple metal pieces disposed at multiple contact portions in a stripe-shaped contact trench formed to be extended over the multiple contact portions on the interlayer insulating film, and the multiple metal pieces are formed by dividing a metal layer formed along a bottom and side walls of the stripe-shaped contact trench in a longitudinal direction.

2. The semiconductor integrated circuit device according to claim 1, wherein
the multiple metal pieces are hollowed.

3. The semiconductor integrated circuit device according to claim 2, wherein
the multi-layered metal pieces of the vertical wirings are supported with insulating and supporting pieces deposited on the side wall of the metal pieces.

4. The semiconductor integrated circuit device according to claim 1, wherein
peripheral line portions extended from the first and second metal lines in the cell arrays to the vertical wirings are supported in the hollowed state with concave insulating and supporting pieces.

5. The semiconductor integrated circuit device according to claim 1, wherein
the multi-layered metal pieces of the vertical wirings are formed of concave metal pieces, which are deposited as followed the bottom and side walls of the contact trench and patterned.

6. The semiconductor integrated circuit device according to claim 5, wherein
the concave metal pieces are supported in such a state that inner and outer portions thereof are hollowed and insulating and supporting pieces are deposited on the inner and outer surfaces of the concave metal pieces.

7. The semiconductor integrated circuit device according to claim 1, wherein
in the cell arrays, the first and second metal lines and the memory cells are arranged laterally with voids sandwiched therebetween.

8. The semiconductor integrated circuit device according to claim 1, wherein
the memory cell has a stacked structure of a variable resistance element layer and a diode layer.

* * * * *